(12) United States Patent
Kono et al.

(10) Patent No.: US 7,433,230 B2
(45) Date of Patent: Oct. 7, 2008

(54) NONVOLATILE SEMICONDUCTOR MEMORY DEVICE HAVING ASSIST GATE

(75) Inventors: Takashi Kono, Tokyo (JP); Yuichi Kunori, Tokyo (JP); Hironori Iga, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 137 days.

(21) Appl. No.: 11/411,938

(22) Filed: Apr. 27, 2006

(65) Prior Publication Data
US 2006/0280022 A1 Dec. 14, 2006

(30) Foreign Application Priority Data
Apr. 28, 2005 (JP) ............................. 2005-130939

(51) Int. Cl.
*G11C 11/34* (2006.01)
*G11C 5/06* (2006.01)
*G11C 7/00* (2006.01)
*G11C 8/99* (2006.01)

(52) U.S. Cl. .......................... 365/185.11; 365/185.17; 365/185.25; 365/63; 365/203; 365/230.03

(58) Field of Classification Search .................. 365/63, 365/203, 230.03, 185.11, 185.17, 185.25
See application file for complete search history.

(56) References Cited

U.S. PATENT DOCUMENTS

| 5,274,597 | A | * | 12/1993 | Ohbayashi et al. | ...... 365/230.03 |
|---|---|---|---|---|---|
| 5,748,545 | A | * | 5/1998 | Lee et al. | ...................... 365/203 |
| 5,831,924 | A | * | 11/1998 | Nitta et al. | ............. 365/230.03 |
| 5,917,745 | A | * | 6/1999 | Fujii | ............................ 365/63 |
| 5,973,983 | A | * | 10/1999 | Hidaka | ................... 365/230.03 |
| 5,991,223 | A | * | 11/1999 | Kozaru et al. | .......... 365/230.03 |
| 6,002,633 | A | * | 12/1999 | Oppold et al. | ......... 365/230.03 |
| 6,088,286 | A | * | 7/2000 | Yamauchi et al. | ....... 365/230.06 |
| 6,147,925 | A | * | 11/2000 | Tomishima et al. | .... 365/230.03 |
| 6,157,584 | A | * | 12/2000 | Holst | .................... 365/230.03 |
| 6,157,588 | A | * | 12/2000 | Matsumoto et al. | ........... 365/63 |
| 6,304,509 | B1 | * | 10/2001 | Hirobe et al. | .......... 365/230.03 |
| 6,442,078 | B1 | * | 8/2002 | Arimoto | ...................... 365/63 |
| 6,496,430 | B2 | * | 12/2002 | Aikawa et al. | ......... 365/230.03 |
| 6,512,719 | B2 | * | 1/2003 | Fujisawa et al. | ............ 365/233 |
| 6,542,428 | B2 | * | 4/2003 | Hidaka | .................. 365/230.03 |
| 6,545,931 | B2 | * | 4/2003 | Hidaka | .................. 365/230.03 |
| 6,545,934 | B2 | * | 4/2003 | Yamashita et al. | ..... 365/230.03 |
| 6,643,182 | B2 | * | 11/2003 | Yanagisawa et al. | ... 365/185.17 |

(Continued)

OTHER PUBLICATIONS

Kurata, H, et al.: "Self-Boosted Charge Injection for 90-nm-Node 4-Gb Multilevel AG-AND Flash Memories Programmable at 16 MB/s," 2004 Symposium on VLSI Circuits, Digest of Technical Papers, pp. 72-73.

*Primary Examiner*—Trong Phan
(74) *Attorney, Agent, or Firm*—McDermott Will & Emery LLP

(57) ABSTRACT

In this AG-AND type flash memory, a layered bit line configuration where a memory array is divided into a plurality of sub blocks, new main bit lines are allocated so as to correspond to each sub block, and a main bit line is selectively connected to a global bit line in an upper layer via a switch is adopted, so that charge sharing write-in is carried out between two main bit lines. Accordingly, write-in of data into the flash memory can be carried out with low power consumption, and the threshold voltage can be controlled with precision.

18 Claims, 39 Drawing Sheets

U.S. PATENT DOCUMENTS

| | | | |
|---|---|---|---|
| 6,678,195 B2 * | 1/2004 | Hidaka | 365/230.03 |
| 6,781,879 B2 * | 8/2004 | Tanzawa et al. | 365/185.11 |
| 6,847,578 B2 * | 1/2005 | Ayukawa et al. | 365/230.03 |
| 6,891,755 B2 * | 5/2005 | Silvagni et al. | 365/185.11 |
| 7,239,571 B2 * | 7/2007 | Tanaka | 365/230.03 |
| 7,242,627 B2 * | 7/2007 | Mizuno et al. | 365/203 |

* cited by examiner

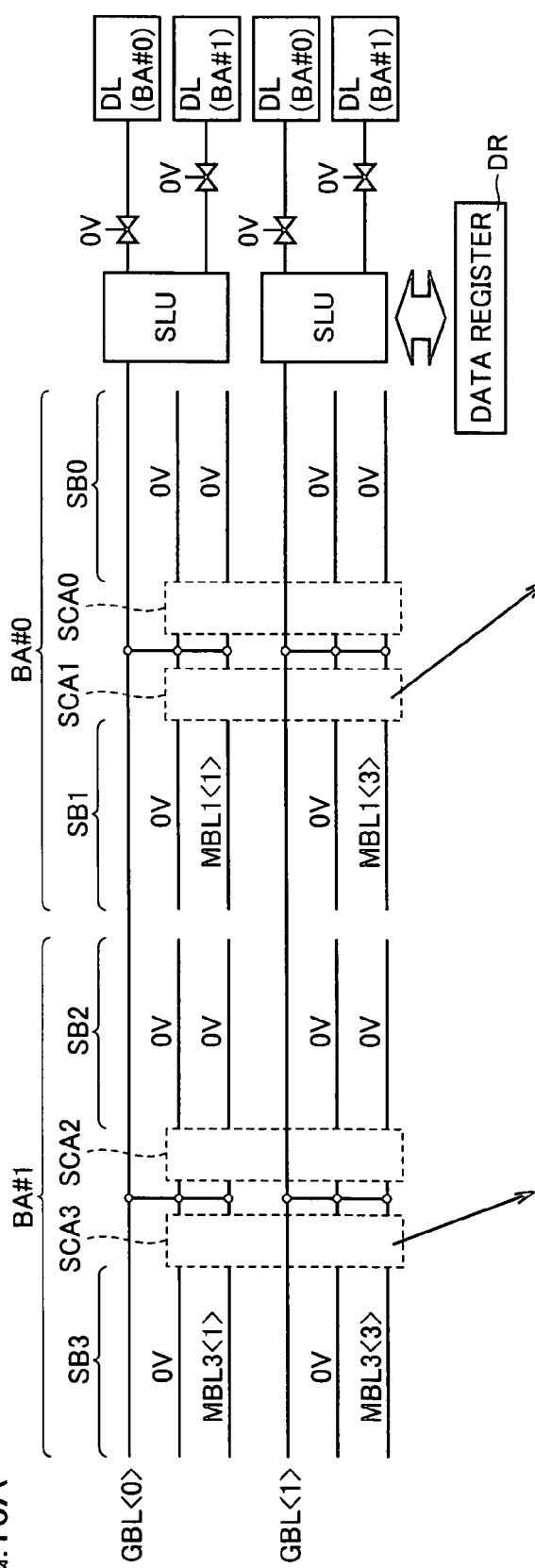
FIG.16A
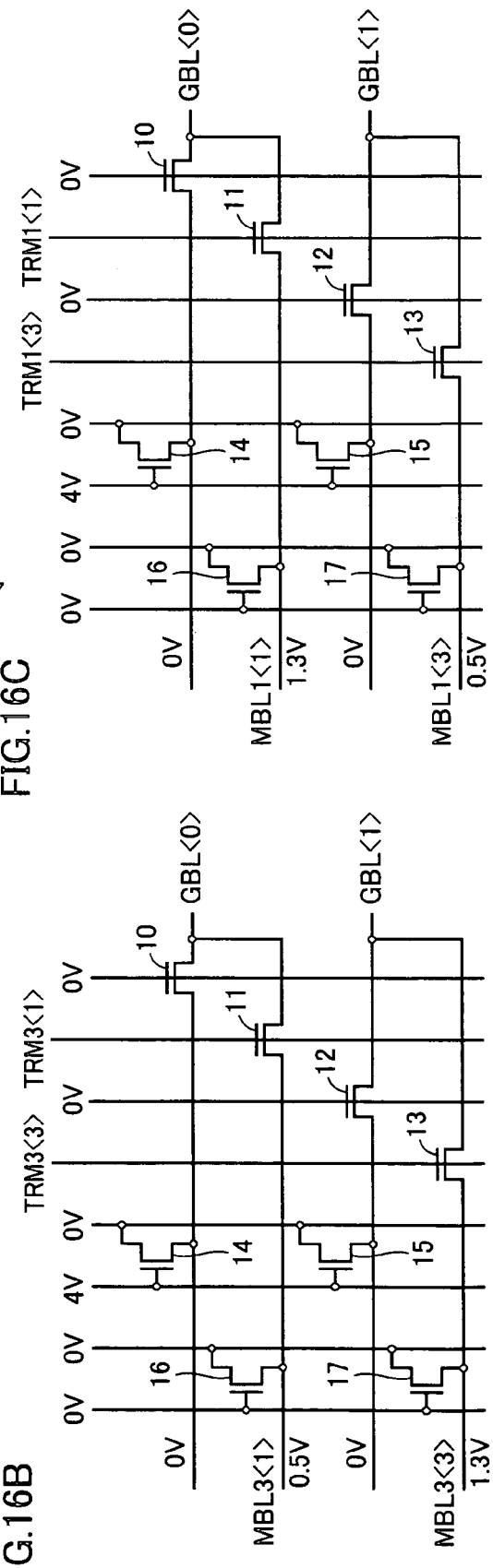
FIG.16C
FIG.16B

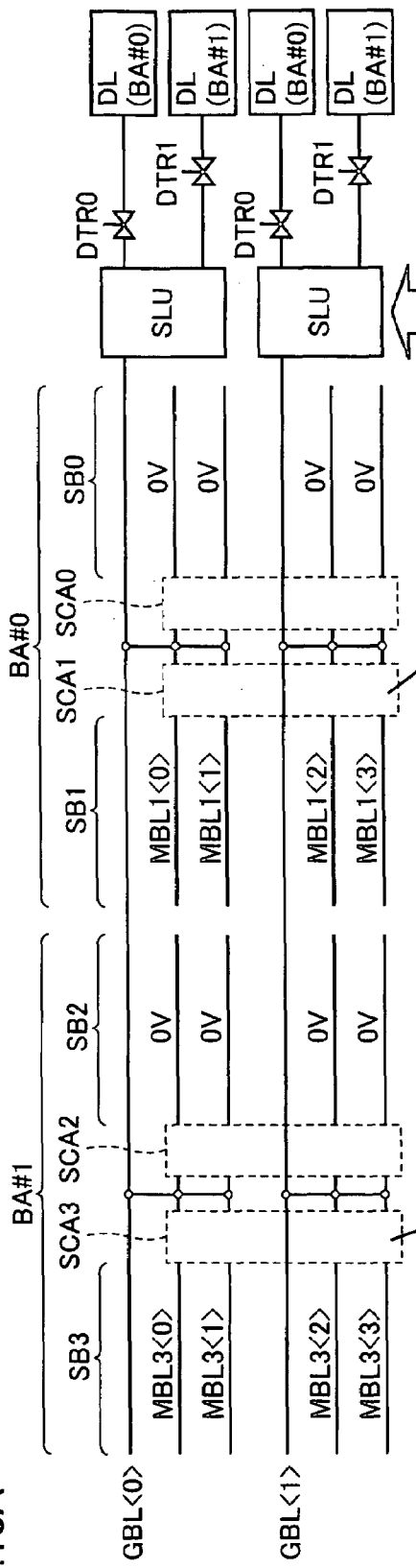
FIG.18A
FIG.18B
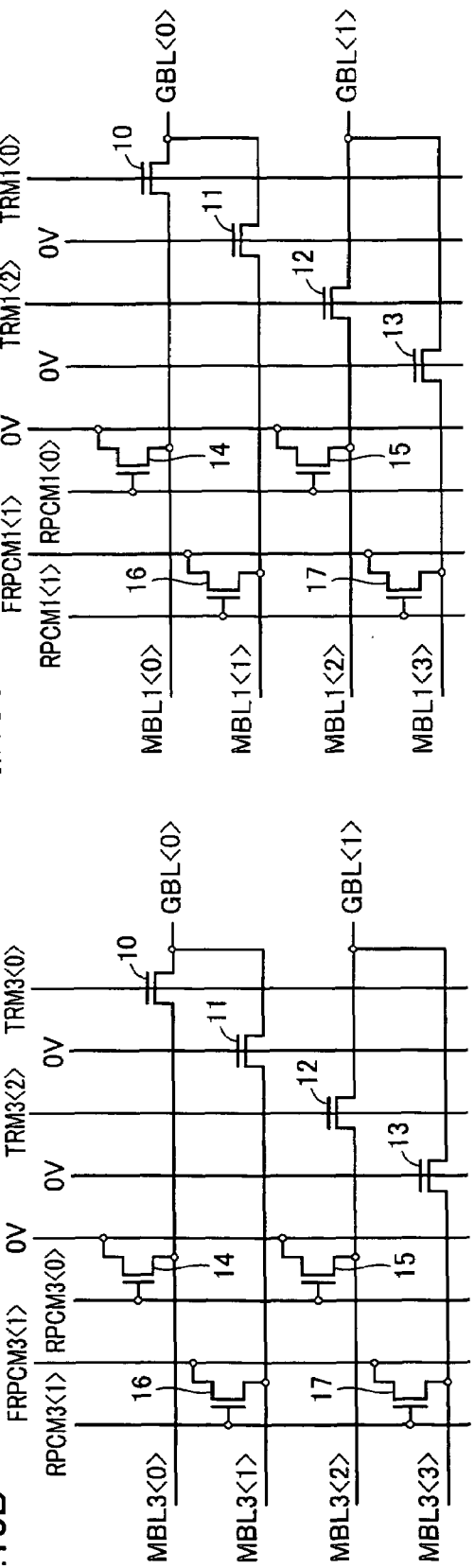
FIG.18C

FIG.31A
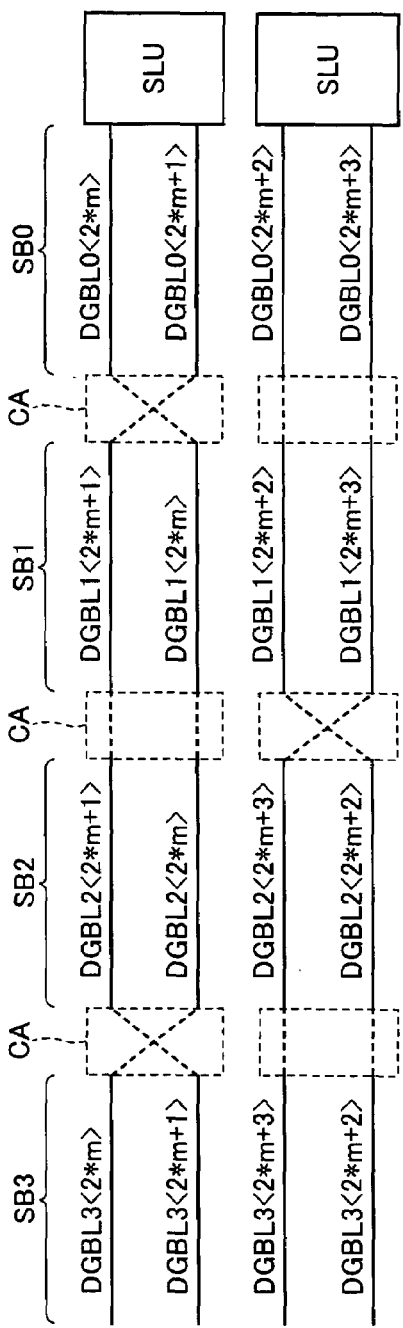
FIG.31B
FIG.31C
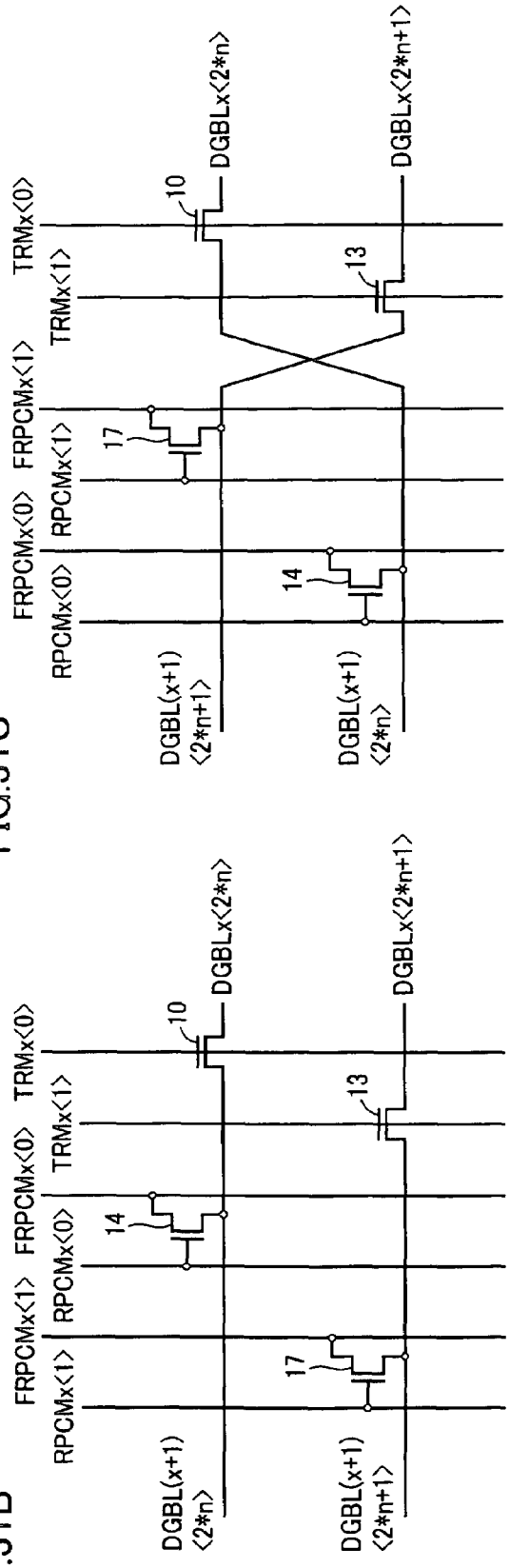

NONVOLATILE SEMICONDUCTOR MEMORY DEVICE HAVING ASSIST GATE

BACKGROUND OF THE INVENTION

1. Field of the Invention

This invention relates to a nonvolatile semiconductor memory device, and in particular, to an AG-AND type (assist gate-AND type) flash memory where floating gates and assist gates are alternately arranged.

2. Description of the Background Art

In recent years, demand in terms of specification on increased capacity in data storage flash memories, for example, increased capacity in memory cards together with the increase in the number of pixels of digital cameras has been very high. AG-AND type flash memories have been developed as one type of such data storage flash memories. In an AG-AND type flash memory, floating gates and assist gates are alternately arranged, and an intense inversion layer is formed as a lower layer by applying an electric field to an assist gate, so that this inversion layer is used as a bit line (see, for example, H. Kurata et al., 2004 Symposium on VLSI Circuits Digest of Technical Papers, pp. 72-73 (Non-Patent Document 1)).

FIG. 32 is a block diagram showing a major portion of one bank in such an AG-AND type flash memory. In FIG. 32, this bank is provided with a memory array MA, a sense latch SL and an X decoder XD. Memory array MA includes N strings ST0 to ST(N−1) (here, N is a natural number). Global bit lines GBL are arranged in such a manner as to cross N strings ST0 to ST(N−1). Global bit lines GBL are upper bit lines which are shared by all strings ST0 to ST(N−1), and have a function of connecting sense latch SL and memory cell transistors.

Sense latch SL controls whether or not write-in is carried out in a memory cell transistor by conveying necessary information along global bit line GBL in response to an external address signal and write-in data, and at the same time, senses data that has been read out along global bit line GBL from a memory cell transistor which corresponds to the external address signal so as to transfer the data to an external I/O. X decoder XD selects a word line WL in response to an address signal that is supplied from the outside.

As shown in FIG. 33, each string ST includes a plurality of word lines WL (256 in the figure), and a plurality of memory cell transistors MC and a plurality of assist gate transistors AGT which are provided so as to correspond to each word line WL. Each memory cell transistor MC has a control gate and a floating gate, and stores information based on a level change of its threshold voltage. The control gate of each memory cell transistor MC is connected to a corresponding word line WL. A plurality of assist gate transistors AGT (256 in this case) which are arranged in a line in the direction crossing word lines WL have a channel length equal to the width of one string in the direction crossing word lines WL, in such a manner that assist gates AG, which are the gates thereof, also have a length corresponding to one string. In each row, those plurality of memory cell transistors MC are grouped into groups of four, and, those plurality of assist gate transistors AGT are also grouped into groups of four so as to correspond to this, as are assist gates AG. That is to say, each memory cell transistor group includes four memory cell transistors MC0 to MC3, each assist gate transistor group includes four assist gate transistors AGT0 to AGT3, and each assist gate group includes four assist gates AG0 to AG3.

Two global bit lines GBL are provided so as to correspond to each group made of four assist gates AG. In FIG. 33, four global bit lines GBL<2*m> (EVEN NUMBER), GBL<2*m+1> (ODD NUMBER), GBL<2*m+2> (EVEN NUMBER), and GBL<2*m+3> (ODD NUMBER) corresponding to two groups are shown. The lower layer of an assist gate AG0 is connected to a global bit line GBL<2*m> (here, m is an integer of no smaller than 0) via an N channel MOS transistor Q0. The lower layer of an assist gate AG2 is connected to a global bit line GBL<2*m+1> via an N channel MOS transistor Q2. The gates of N channel MOS transistors Q0 and Q2 both receive a signal STS.

The lower layer of an assist gate AG1 is connected to a common drain line CD via an N channel MOS transistor Q1. The lower layer of an assist gate AG3 is connected to common drain line CD via an N channel MOS transistor Q3. The gates of N channel MOS transistors Q1 and Q3 both receive a signal STD. When a predetermined voltage is applied to an assist gate AG, an intense inversion layer is formed beneath this assist gate AG so as to become an inversion layer bit line BL.

Next, the read-out operation of this AG-AND type flash memory is described. FIG. 34 is a diagram showing the voltage of each signal at the time of the read-out operation, and FIG. 35 is a time chart showing the waveform of each signal during operation. Here, it is assumed that data that has been stored in a memory cell transistor MC2 in each memory cell transistor group corresponding to first word line WL0 is read out.

In order to read out the data of memory cell transistor MC2 to global bit line GBL, predetermined voltages (both are 3.5 V in FIGS. 34 and 35) are supplied to assist gates AG1 and AG2, so that inversion layer bit lines BL are formed beneath assist gates AG1 and AG2. As a result of this, inversion layer bit line BL beneath assist gate AG2 corresponding to the drain of memory cell transistor MC2 is connected to global bit line GBL of an odd number via transistor Q2 which receives signal STS. Meanwhile, inversion layer bit line BL beneath assist gate AG1 is connected to common drain line CD via transistor Q1 which receives signal STD, so as to function as the source of memory cell transistor MC2.

In FIG. 35, global bit line GBL of an odd number has been charged to 1.2 V in advance, and is triggered by the end of the rise of signal STD from level "L" to level "H," so that the charge of global bit line GBL of an odd number is discharged to common drain line CD via memory cell transistor MC2 in the case where threshold voltage VTHC of memory cell transistor MC2 is lower than selection voltage VRW of word line WL0, and thus, the voltage of global bit line GBL of an odd number gradually lowers.

Conversely, in the case where threshold voltage VTHC of memory transistor MC2 is higher than selection voltage VRW of word line WL0, memory cell transistor MC2 is not turned on, and thus, the voltage of global bit line GBL of an odd number stays at 1.2 V. After an appropriate amount of time, for example, the time required for the voltage of global bit line GBL of an odd number to swing to 0.6 V when VRW>VTHC, has passed, a signal SENSE in FIG. 35 becomes of level "H," and data is finally latched to the sense amplifier within sense latch SL in accordance with the voltage of global bit line GBL of an odd number at this point in time.

Next, the write-in operation of this AG-AND type flash memory is described. In a multiple value memory cell transistor MC where data of two or more bits is made to correspond to one memory cell transistor MC, it is necessary to raise threshold voltage VTHC so that the memory cell transistor is changed to any of a plurality of write-in states from the erased state, which has the lowest threshold voltage VTHC. At this time, the amount of shift in threshold voltage VTHC, that is to say, the amount of charge to be injected into a floating gate FG, differs, depending on which write-in state is selected. Therefore, it becomes possible to use different write-in operations on the basis of the amount of shift in threshold voltage VTHC.

FIG. 36 is a diagram showing the relationship between the potential of each signal within object string ST at the time of write-in operation according to the conventional art, and FIG. 37 is a time chart showing the waveform of each signal during operation. Memory cell transistor MC2 in each memory cell transistor group is assumed to be the object of write-in. In addition, the "cell through write-in system" disclosed in the above described Non-Patent Document 1 is used.

In FIG. 36, inversion layer bit line BL beneath assist gate AG2 functions as the drain of memory cell transistor MC2, and inversion layer bit line BL beneath assist gate AG0 functions as the source of memory cell transistor MC2. 4.5 V is supplied to inversion layer bit line BL on the drain side from global bit line GBL of an odd number via transistor Q2, and 0 V or approximately 2 V is supplied to inversion layer bit line BL on the source side from global bit line GBL of an even number via transistor Q0. The voltage of inversion layer bit line BL on this source side reflects information on whether or not write-in is carried out on memory cell transistor MC2, and is based on the data that is stored in sense latch SL. Concretely, in the case where write-in is desired, inversion layer bit line BL on the source side is set to 0 V, and in the case where write-in is desired to be blocked, inversion layer bit line BL on the source side is set to approximately 2 V. Such a system, where it is determined on the basis of the voltage that is supplied to inversion layer bit line BL on the source side whether or not write-in is carried out on memory cell transistor MC, is hereinafter referred to as source selection write-in system.

With reference to FIG. 37, the voltage that is applied to assist gate AG1 triggers initiation of write-in into memory cell transistor MC2. At this time, the voltage that is applied to assist gate AG1 is as low as approximately 1 V, and the inversion layer that is formed beneath assist gate AG1 is in a state of weak inversion. In the case where inversion layer bit line BL on the source side is 0 V, a current flows from global bit line. GBL on the odd number side to global bit line GBL on the even number side through the portion beneath memory cell transistor MC1 and the electrical field becomes concentrated in the vicinity of the border between the channel beneath memory cell transistor MC2, which is the object of write-in, and the weak inversion layer beneath assist gate AG1, and electrons having a high level of energy (hot electrons) which have been accelerated by this electrical field occurs on the surface of the substrate. These hot electrons are drawn by the electrical field that has been created in the longitudinal direction by high voltage VWW that has been applied to word line WL, and reach the floating gate of memory cell transistor MC2 which is the object of write-in. This is referred to as source side hot electron injection (SSI). In the case where inversion layer bit line BL on the source side is at 2 V, voltage VAG1 which is supplied to assist gate AG1 is 1 V, and therefore, assist gate AG1 is cut off and no write-in current flows: through memory cell transistor MC2. Here, the arrow along the current path in FIG. 36 shows the direction in which electrons flow.

Furthermore, global bit lines GBL on both the odd number side and the even number side are converted to a floating state at the time of write-in, and thereby, the charge that has been stored in global bit line GBL on the drain side flows into global bit line GBL on the source side, so that the charge is redistributed between the two until assist gate AG1 is cut off (charge sharing system). As a result, controllability of write-in (uniformity in amount of shift in threshold voltage VTHC between memory cell transistors MC) is increased, by maintaining the charge that is consumed for one write-in at a constant level.

Next, another write-in operation of this AG-AND type flash memory is described. FIG. 38 is a diagram showing the relationship between the potential of each signal within object string ST at the time of another write-in operation according to the conventional art, and FIG. 39 is a time chart showing the waveform of each signal during operation. Memory cell transistor MC2 in each memory cell transistor group is assumed to be the object of write-in.

In FIG. 38, the relationship between inversion layer bit lines BL on the source side and on the drain side, and assist gates AG is the same as in FIG. 36, and the source selection write-in system is used in the same manner. Here, the voltage that is supplied to inversion layer bit line BL on the drain side is supplied in accordance with the below described "self-boosting" system of FIG. 38, which is different from FIG. 36. With reference to the waveform during operation of FIG. 39, in the case where the voltage of assist gate AG2 is raised from 0 V to 8 V after signal STS is lowered from level "H" to level "L," the voltage of inversion layer bit line BL beneath assist gate AG2 increases, due to capacitive coupling. The final voltage of inversion layer bit line BL beneath assist gate AG2 is determined by the ratio of the capacitance of the gate oxidation film beneath assist gate AG2 to the capacitance of the depletion layer in the intense inversion layer that is formed beneath assist gate AG2, and increases to, for example, 4.5 V.

When the voltage of assist gate AG1 is raised to 1 V, write-in is initiated. Signal STS stays at level "L," and therefore, inversion layer bit lines BL on the source side and on the drain side are in a floating state, and write-in is carried out in a charge sharing system where the charge that has been stored in the two is redistributed.

As described above, as the write-in system, the source selection system according to which whether or not write-in is carried out is determined on the basis of the voltage on the source selection, the charge sharing system where controllability is enhanced by redistributing constant charge that has been stored in the source/drain in a floating state, and the self-boosting system, where the drain voltage is locally generated by boosting assist gate AG, are used together. In particular, charge sharing system includes a charge sharing system between global bit lines GBL and a charge sharing system between inversion layer bit lines BL, making it possible to select either for use on the basis of the amount of shift in the desired VTHC.

The amount of shift in VTHC in the charge sharing system depends on the amount of charge that is stored in the parasitic capacitance between wires, and for the same drain voltage, a greater VTHC shift can be expected in the charge sharing system between global bit lines GBL of which the parasitic capacitance between wires is as great as 0.8 pF than in the charge sharing system between inversion layer bit lines BL of which the parasitic capacitance between wires is as small as 0.02 pF. Meanwhile, in the case where VTHC of the bit that protrudes due to the reduction in the width of the VTHC distribution is microscopically adjusted, the charge sharing system between inversion layer bit lines BL is appropriate. In addition, the time for setup before write-in is shorter in the charge sharing system between inversion layer bit lines BL according to which inversion bit lines BL having a lighter load are self-boosted. Using these characteristics, optimization of the time for write-in can be achieved, particularly in the case where write-in is carried out at levels of multiple values.

The write-in system shown in FIG. 38, where the self-boosting system and the charge sharing system between inversion layer bit lines BL are used together is excellent in terms of controllability for write-in and time for setup. There is a possibility, however, that a problem as hat described below may arise as the miniaturization of memory cell transistors MC progresses.

The gate width of assist gates AG is being scaled down together with the miniaturization of memory cell transistors MC. As a result, the ratio of fringe component (one type of linear component) which does not depend on the gate width of assist gate AG is increasing, from among the components of the capacitance of the depletion layer in the inversion layer that is formed beneath assist gate AG. Therefore, the surface component of the capacitance of the depletion layer and the gate capacitance both become smaller in proportion to the gate width of assist gate AG, while the entire capacitance of the depletion layer, including the fringe component, becomes smaller more gradually than the ratio of scaling down of the gate width. Accordingly, in order to secure the drain voltage after self-boosting at approximately the same level as in the conventional art, the voltage of assist gate AG needs to be increased, or the gate oxide film that forms assist gate AG needs to be reduced in thickness. Meanwhile, the drain voltage lowers after charge sharing (see FIG. 39), and in the case where a voltage higher than in the conventional art, or a gate oxide film which is thinner than that in the conventional art are used, as described above, the intensity of the electrical field that is applied to the assist gate oxide film after charge sharing becomes high, and thus, it is possible that a problem may arise with reliability.

In order to avoid such a problem, though it is possible to carry out write-in only in accordance with the charge sharing system between global bit lines GBL, as described above, the parasitic capacitance greatly differs between global bit lines GBL and inversion layer bit lines BL, which have 0.8 pF and 0.02 pF, respectively, and therefore, it seems to be difficult to create sufficiently small distribution in threshold voltage VTHC after write-in only in accordance with the charge sharing system between global bit lines GBL, because of the controllability of the amount of shift in VTHC. In addition, in accordance with the charge sharing system between global bit lines GBL, global bit lines GBL having a heavy load are charged and discharged for every write-in cycle, and therefore, the time for charging global bit lines GBL before write-in becomes long, making the time for write-in long, and there is a concern that power consumption may increase.

In addition, the time for write-in includes a verifying operation for determining excess and deficiency in the amount of shift in VTHC after write-in. This is a type of operation for reading out from memory cell transistor MC, and takes time in the case where large amplitude is induced in global bit lines GBL having a heavy load for read-out, as in the conventional art.

SUMMARY OF THE INVENTION

Therefore, a main object of this invention is to provide a nonvolatile semiconductor memory device having low power consumption and having reliability, controllability for write-in and speed for write-in which is superior to those in the charge sharing system between global bit lines GBL.

In addition, another object of this invention is to provide a nonvolatile semiconductor memory device having short read-out time.

A nonvolatile semiconductor memory device according to this invention is provided with a memory array portion, wherein the memory array portion is formed of a plurality of sub-blocks, and each sub block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line. The memory array portion further has a plurality of main bit lines which are provided for each sub-block, and a plurality of global bit lines which are provided so as to be shared by those plurality of sub-blocks. Each main bit line can be selectively connected to one local bit line within a corresponding sub-block. Each global bit line can be selectively connected to one main bit line from among corresponding number of main bit lines. Furthermore, a voltage controlling circuit for controlling the voltage of each main bit line independently of the voltage of the global bit line is provided.

Accordingly, in this nonvolatile semiconductor memory device, charge sharing write-in can be carried out between two main bit lines in each main bit line group, and increase in reliability, controllability for write-in and speed for write-in, as well as reduction in power consumption, can be achieved.

In addition, another nonvolatile semiconductor memory device according to this invention is provided with a memory array portion, wherein the memory array portion is formed of a plurality of sub-blocks, and each sub-block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line. The memory array portion further has a plurality of global bit lines which are provided so as to be shared by those plurality of sub-blocks. Each global bit line includes a plurality of divided global bit lines which respectively correspond to these plurality of sub-blocks. Each divided global bit line can be selectively connected to a divided global bit line which is adjacent in the direction in which it extends and can be selectively connected to one local bit line within a corresponding sub-block. Furthermore, a voltage controlling circuit for independently controlling the voltage of divided global bit line is provided.

Accordingly, in this nonvolatile semiconductor memory device, charge sharing write-in can be carried out between divided global bit lines, and increase in reliability, controllability for write-in and speed for write-in, as well as reduction in power consumption, can be achieved. In addition, the number of wire layers can be reduced, in comparison with the case where main bit lines are provided.

In addition, still another nonvolatile semiconductor memory device according to this invention is provided with a memory array portion, wherein the memory array portion is formed of a plurality of sub-blocks, and each sub-block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line. The memory array portion further has a plurality of main bit lines which are provided for each sub-block and a plurality of global bit lines which are provided so as to be shared in each sub-block. Each main bit line can be selectively connected to one local bit line within a corresponding sub-block. One of two adjacent global bit lines is selectively connected to one main bit line from among a plurality of corresponding main bit lines at the time of read-out. One of the two adjacent global bit lines is pre-charged to a first voltage, and the other global bit line is pre-charged to a second voltage that is different from the first voltage prior to the read-out of data from a memory cell. A read-out controlling circuit for reading out memory cell data by comparing the voltage of one of the two adjacent global bit lines to the second voltage of the other global bit line after a certain period of time has passed after the start of read-out from a memory cell, and after this voltage is changed in accordance with the memory cell data is further provided.

Accordingly, in this nonvolatile semiconductor memory device, the amplitude of the voltage of global bit lines can be reduced, and an increase in the speed for read-out can be achieved.

In addition, yet another nonvolatile semiconductor memory device according to this invention is provided with a memory array portion, wherein the memory array portion is formed of a plurality of sub-blocks, and each sub-block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line. The memory array portion further has a plurality of global bit lines which are provided so as to be shared in each sub-block. Each global bit line includes a plurality of divided global bit lines which correspond to those plurality of sub-blocks respectively. Each divided global bit line can be selectively connected to a divided global bit line which is adjacent in the direction in which it extends, and can be selectively connected to one local bit line within a corresponding sub-block. All of the connection means between the divided global bit lines are turned on, one of two adjacent global bit lines is connected to one local bit line within a selected sub-block, one of the two adjacent global bit lines is pre-charged to a first voltage prior to the read-out of data from a memory cell, and the other global bit line is pre-charged to a second voltage which is different from the first voltage at the time of read-out. A read-out controlling circuit for reading out memory cell data by comparing the voltage of one of the two adjacent global bit lines to the second voltage of the other global bit line after a certain period of time has passed after the start of read-out from a memory cell, and after this voltage is changed in accordance with the memory cell data is further provided.

Accordingly, in this nonvolatile semiconductor memory device, the amplitude of the voltage of global bit lines can be reduced, and an increase in the speed for read-out can be achieved.

In addition, still yet another nonvolatile semiconductor memory device according to this invention is provided with a memory array portion, wherein the memory array portion is formed of a plurality of strings, and each string is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line. The memory array portion further has a plurality of global bit lines. Each global bit line is shared by all of the strings and can be selectively connected to one local bit line within one string. One of the two adjacent global bit lines is pre-charged to a first voltage prior to the read-out of data from a memory cell and the other global bit line is pre-charged to a second voltage which is different from the first voltage at the time of read-out. A read-out controlling circuit for reading out memory cell data by comparing the voltage of one of the two adjacent global bit lines to the second voltage of the other global bit line after a certain period of time has passed after the start of read-out from a memory cell, and after this voltage is changed in accordance with the memory cell data is further provided.

Accordingly, in this nonvolatile semiconductor memory device, the amplitude of the voltage of global bit lines can be reduced, and an increase in the speed for read-out can be achieved.

Preferably, two adjacent global bit lines are twisted in a predetermined place, so that coupling noise from other global bit lines can be suppressed. As a result, increase in resistance to noise can be achieved.

As described above, according to this invention, a memory array is divided into a plurality of sub-blocks, and new bit lines which are prepared for each sub-block unit are used for supplying the drain voltage at the time of write-in, and thereby, reduction in the time for pre-charging before write-in, increase in controllability of the threshold by optimizing the charge which contributes to write-in, increase in the speed for write-in and reduction in the power consumption can be expected.

In addition, the speed of read-out operation from a memory cell transistor can be increased by making bit lines (the uppermost layer or the above described bit lines that are connected to each other) which are shared throughout the entirety of the memory array complementary with reduction in the amplitude in comparison with the conventional art, and twisting the bit lines, in order to increase resistance to noise.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 16A to 16C are circuit block diagrams showing the read-out operation of the AG-AND flash memory shown in FIGS. 14, 15A and 15B.

FIGS. 18A to 18C are circuit block diagrams showing the write-in operation of the AG-AND flash memory shown in FIGS. 14, 15A and 15B.

FIGS. 31A to 31C are block diagrams showing another modification of the fifth embodiment.

DESCRIPTION OF THE PREFERRED EMBODIMENTS

First Embodiment

Figure 1:
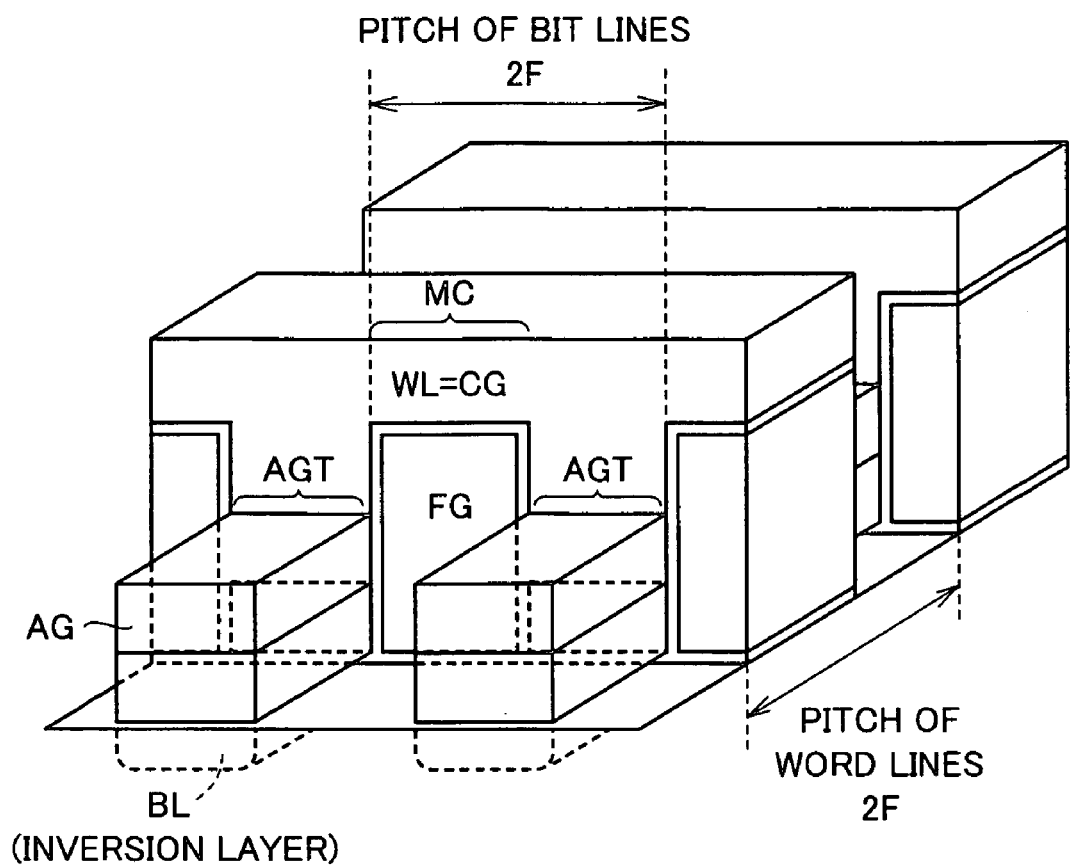
FIG. 1 is a diagram showing the configuration of a memory cell transistor and an assist gate of an AG-AND type flash memory according to a first embodiment of this invention.

FIG. 1 is a diagram showing a main portion of an AG-AND type flash memory according to a first embodiment of this invention. In FIG. 1, floating gates FG of memory cell transistors MC and assist gates AG of assist gate transistors AGT are alternately placed on the surface of a semiconductor substrate in the direction in which word lines WL extend in an AG-AND flash memory. Floating gates FG store a charge for determining threshold voltage VTHC of memory cell transistors MC. Word lines WL also function as control gates CG of memory cell transistors MC.

A group of assist gate transistors AGT which are placed in the direction crossing word lines WL functions both as bit lines BL and for element isolation. That is to say, when the voltage that is supplied to an assist gate AG has a sufficient value, an intense inversion layer is formed beneath assist gate AG, and this intense inversion layer connects the source or drain of memory cell transistor MC to global bit line GBL which is in the upper layer thereof as a bit line BL. Conversely, when 0 V or a negative voltage is supplied to an assist gate AG, the inversion layer beneath assist gate AG disappears, and the group of assist gate transistors AGT functions for element isolation in the direction in which word lines WL extend. In this manner, the groups of assist gate transistors AGT function both as bit lines BL and for element isolation, and thereby, the pitch between bit lines is scaled down to 2F (here, F is the minimum unit size within a memory cell transistor MC), and thus, provide an advantageous structure for increasing the integration of memory cell transistors MC. In addition, at the time of write-in, the portion beneath an assist gate AG on the source side is converted to a state of weak inversion, so that an intense electric field is generated in the border with the channel beneath memory cell transistor MC which is the object of write-in, and thereby, efficient injection of channel hot electrons can be carried out, contributing to increase in the speed for write-in.

Figure 2:
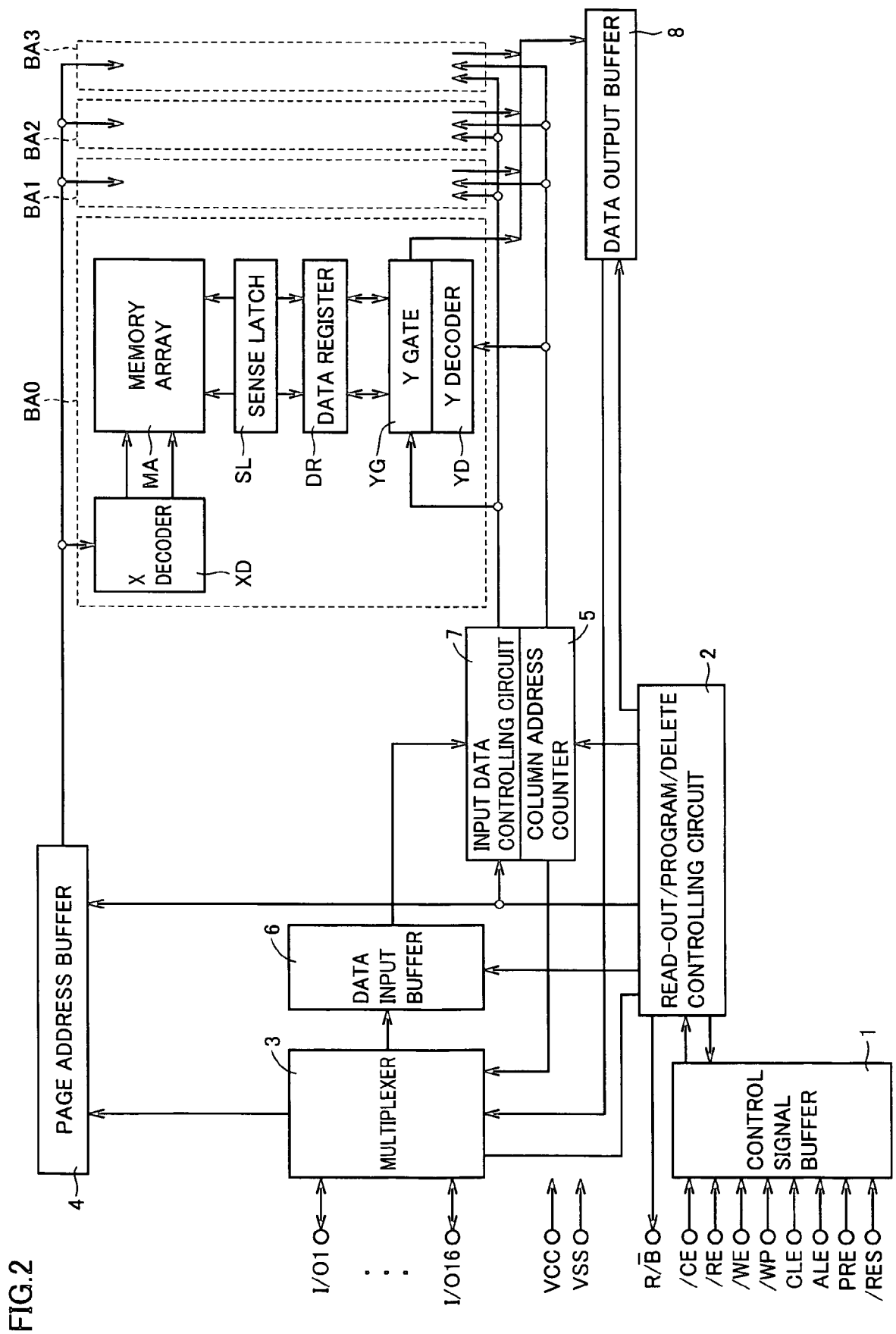
FIG. 2 is a block diagram showing the configuration of the entirety of the AG-AND flash memory using the memory transistor and assist gate shown in FIG. 1.

FIG. 2 is a block diagram showing the entire configuration of the AG-AND type flash memory. In FIG. 2, this AG-AND type flash memory is provided with a plurality of banks BA0 to BA3 (four in the figure), in order to increase the speed for write-n. Each of banks BA0 to BA3 includes a memory array MA for storing data, an X decoder XD for designating a row address in memory array MA in accordance with a row address signal, a Y decoder YD for designating a column address in memory array MA in accordance with a column address signal, a Y gate YG for sending and receiving data to and from memory array MA, a data register DR for temporarily holding data, and a sense latch SL for detecting, amplifying and holding data.

A read-out/program/delete controlling circuit 2 controls the entirety of the AG-AND type flash memory in accordance with control signals /CE, /RE, /WE, /WP, CLE, ALE, PRE, /RES . . . which are supplied via a control signal buffer 1. Also, read-out/program/delete controlling circuit 2 outputs a ready/busy signal R/B (in FIG. 2, represented by B with a bar thereon). A row address signal is supplied to X decoder XD in each of banks BA0 to BA3 via a multiplexer 3 and a page address buffer 4. A column address signal which is generated in a column address counter 5 is supplied to Y decoder YD in each of banks BA0 to BA3.

A write-in data signal is supplied to Y gate YG in each of banks BA0 to BA3 via data input/output terminals I/O1-I/O16, multiplexer 3, a data input buffer 6 and an input data controlling circuit 7, and furthermore, is written into the designated address in memory array MA via a data register DR and sense latch SL. A data signal which has been read out from the designated address in memory array MA is outputted to the outside via sense latch SL, data register DR, Y gate YG, data output buffer 8, multiplexer 3, and data input/output terminals I/O1-I/OI6. The flash memory is driven by power supply voltage VCC and grounding voltage VSS.

Figure 3:
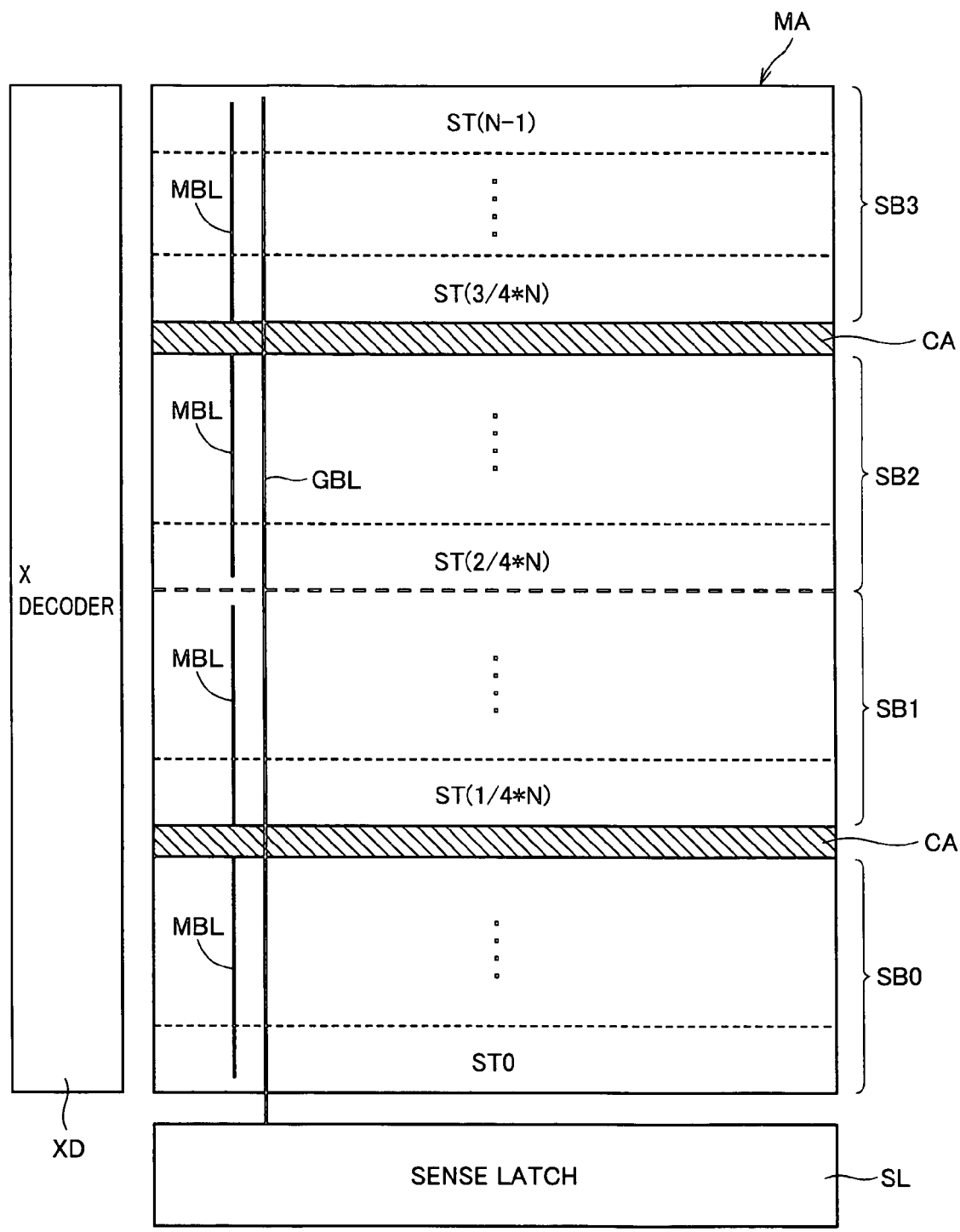
FIG. 3 is a block diagram showing a major portion of the banks shown in FIG. 2.
Figure 32:
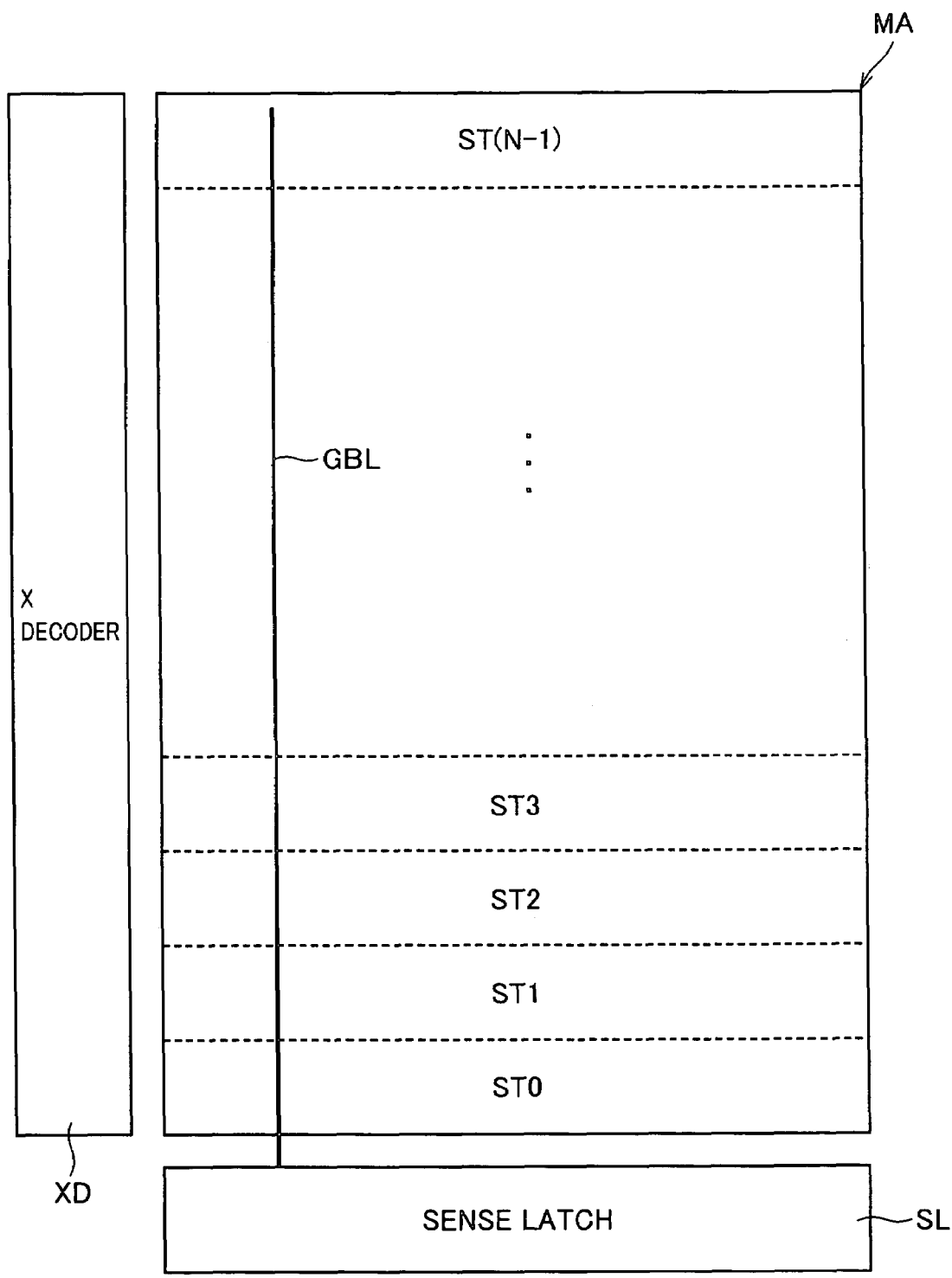
FIG. 32 is a block diagram showing a major portion of the banks of an AG-AND type flash memory according to the conventional art.

FIG. 3 is a block diagram showing the configuration of memory array MA, and is a diagram for comparison with FIG. 32. Memory array MA in FIG. 3 is different from memory array MA in FIG. 32 in that memory array MA is divided into a plurality of (four in FIG. 3) sub-blocks SB0 to SB3, and main bit lines MBL which are shared by a plurality of strings ST within sub-blocks SB are pro vided in addition to global bit lines GBL which are shared by all of strings ST0 to ST(N−1), and that GBL-MBL connection regions CA which function to selectively connect a global bit line GBL to a main bit line MBL are placed in each of the borders between sub-blocks SB0 and SB1, as well as between SB2 and SB3 in memory array MA in FIG. 3.

Figure 4:
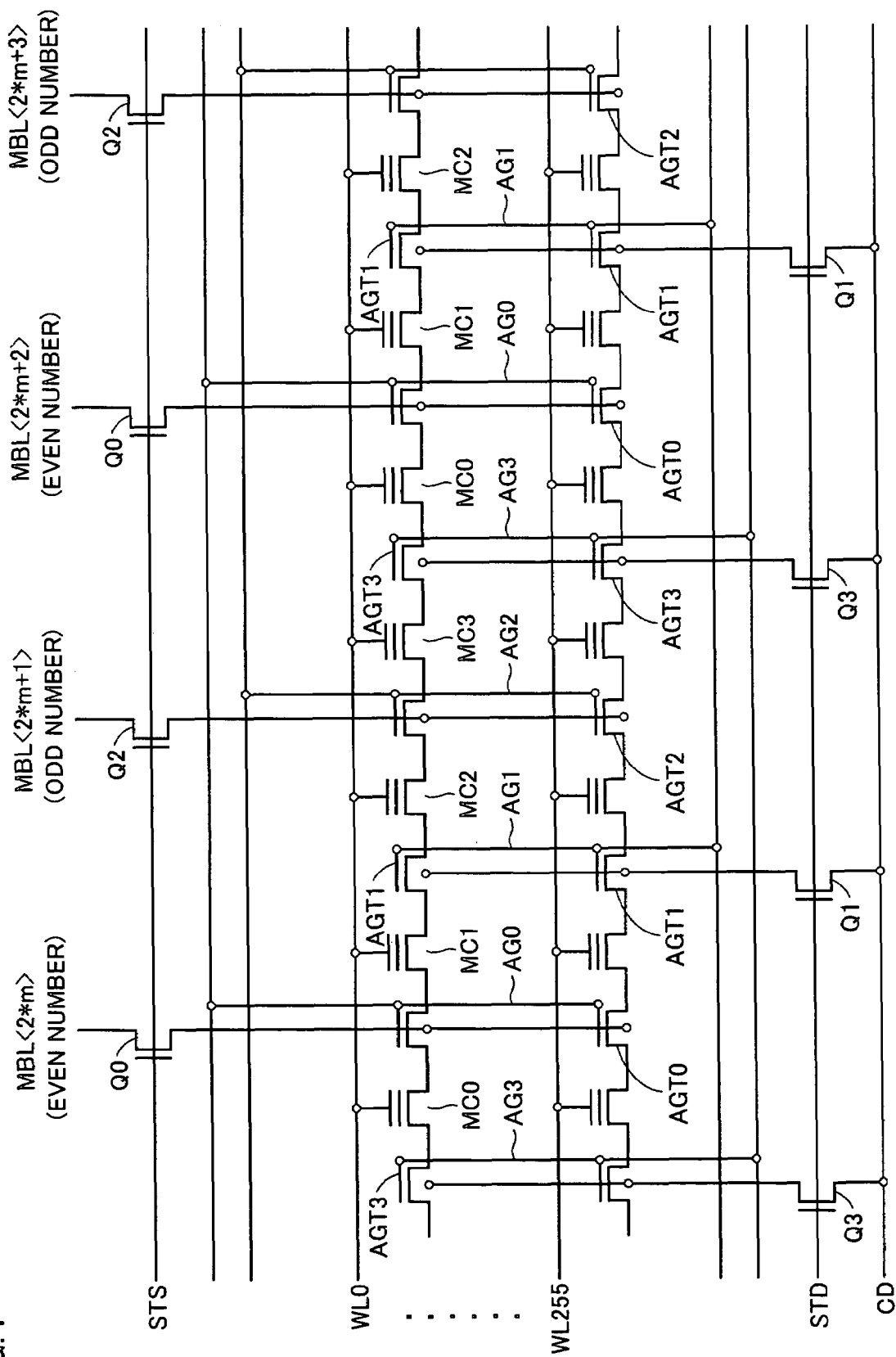
FIG. 4 is a circuit diagram showing the configuration of the strings shown in FIG. 3.
Figure 33:
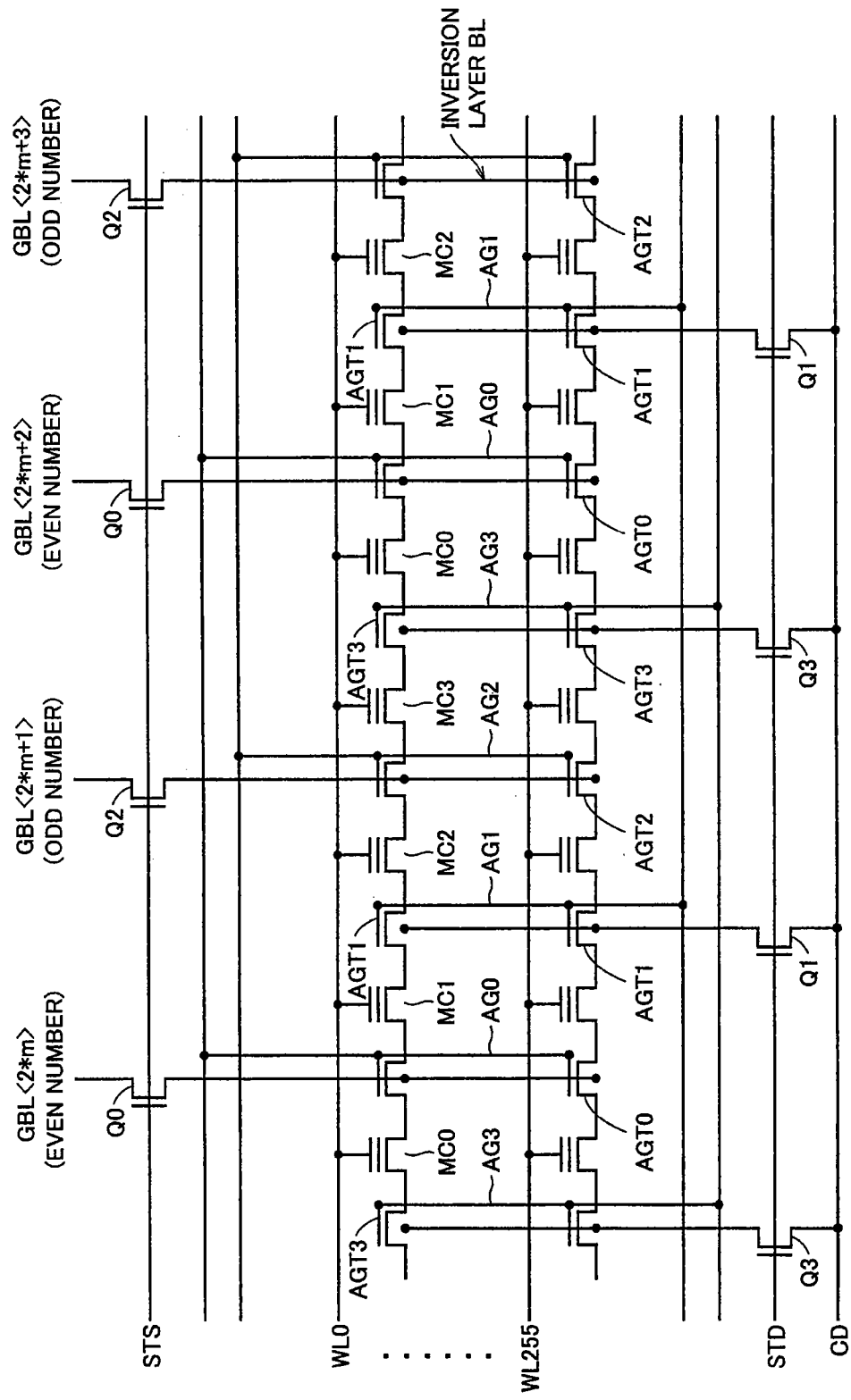
FIG. 33 is a circuit diagram showing the configuration of the strings shown in FIG. 32.
Figure 34:
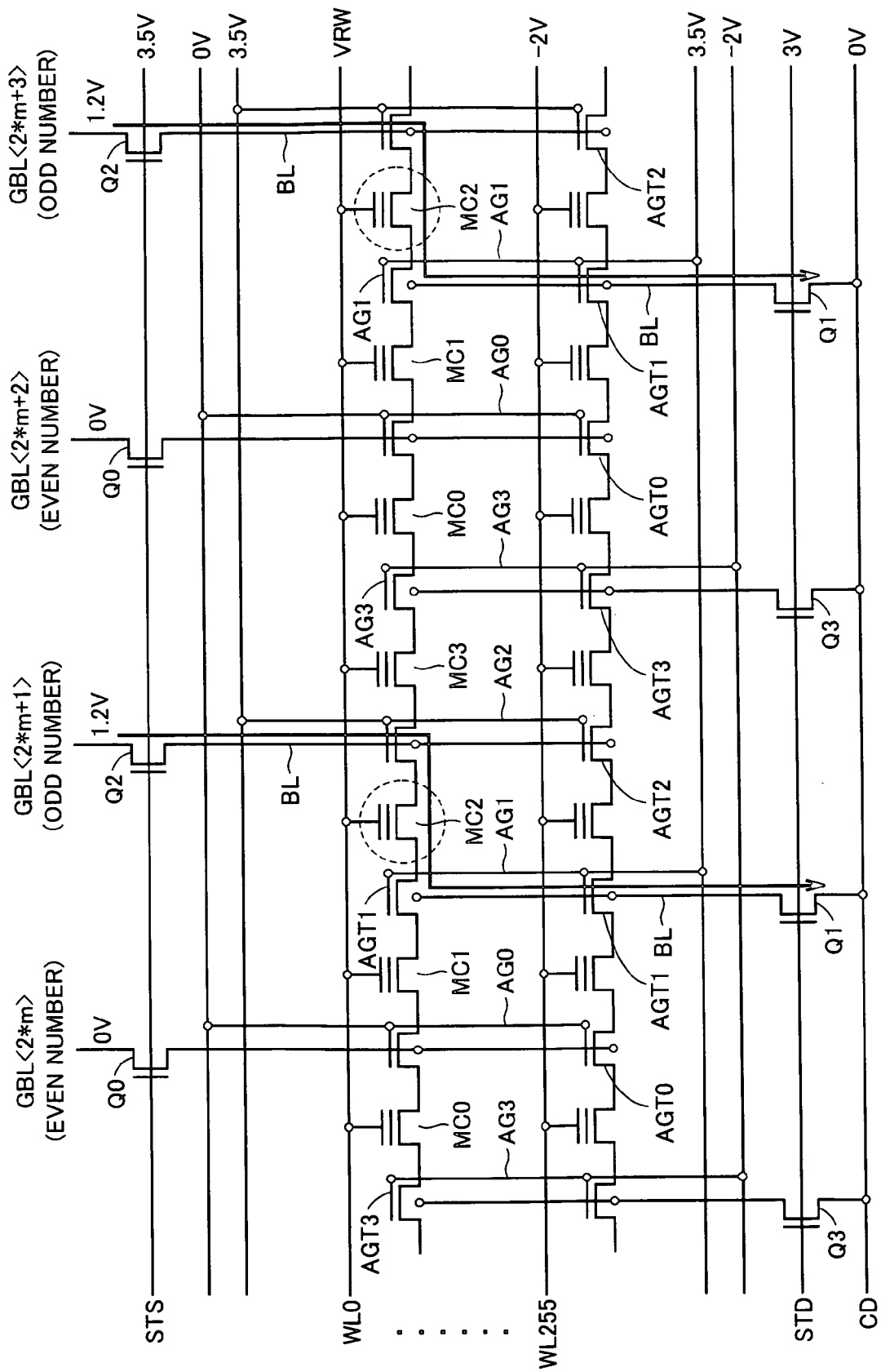
FIG. 34 is a circuit diagram showing a read-out operation of the AG-AND flash memory shown in FIGS. 32 and 33.
Figure 35:
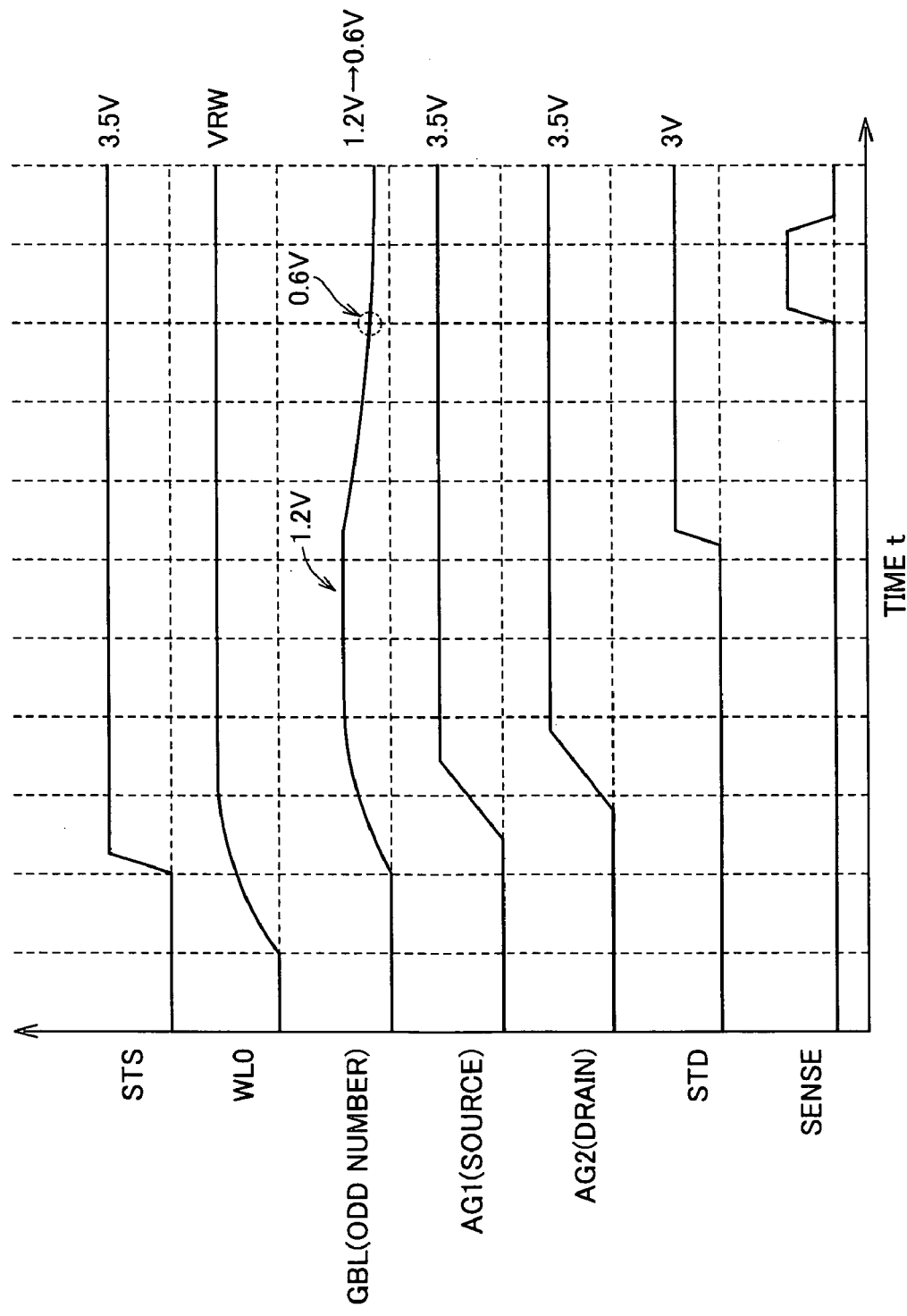
FIG. 35 is a time chart showing the read-out operation of the AG-AND flash memory shown in FIGS. 32 and 33.

FIG. 4 is a circuit diagram showing the configuration of strings ST shown in FIG. 3, and is a diagram for comparison with FIG. 33. String ST in FIG. 4 is different from string ST in FIG. 33 in that global bit lines GBL<2*m> (EVEN NUMBER), GBL<2*m+1> (ODD NUMBER), GBL<2*m+2> (EVEN NUMBER), GBL<2*m+3> (ODD NUMBER), are respectively replaced with main bit lines MBL<2*m> (EVEN NUMBER), MBL<2*m+1> (ODD NUMBER), MBL<2*m+2> (EVEN NUMBER), MBL<2*m+3> (ODD NUMBER), in string ST in FIG. 4. That is to say, string ST in FIG. 4 has a configuration where the number of layers of bit lines has been increased by one from the conventional art, and the number of global bit lines GBL in the uppermost layer is decreased by half of that in the conventional art. The increase by one in the number of layers is dealt with physically by adding one wire layer.

Figure 5A:
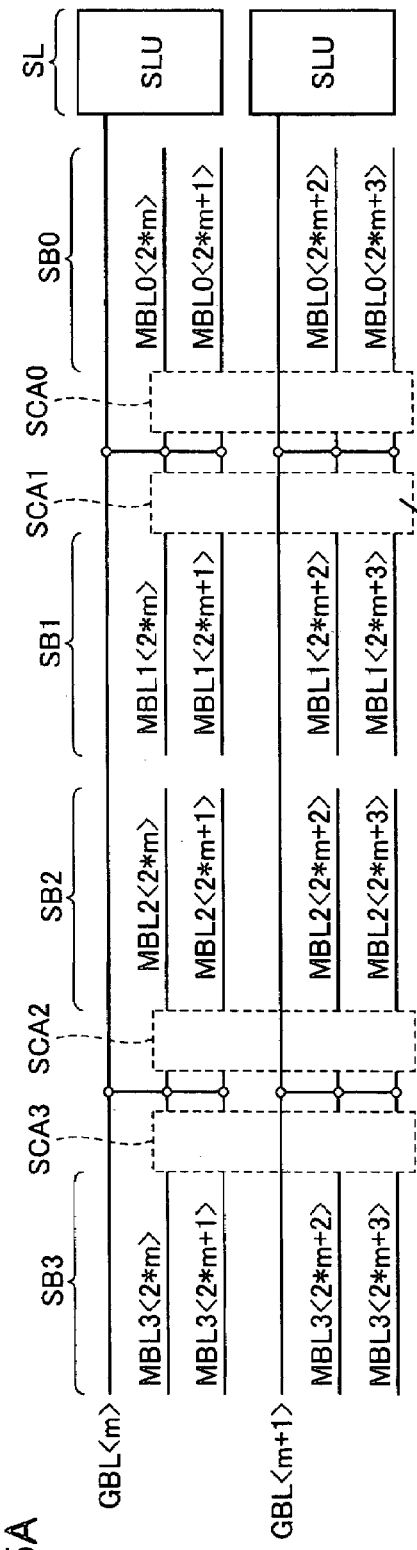
FIGS. 5A and 5B are circuit block diagrams showing the configuration of the GBL-MBL connection regions shown in FIG. 3.
Figure 5B:
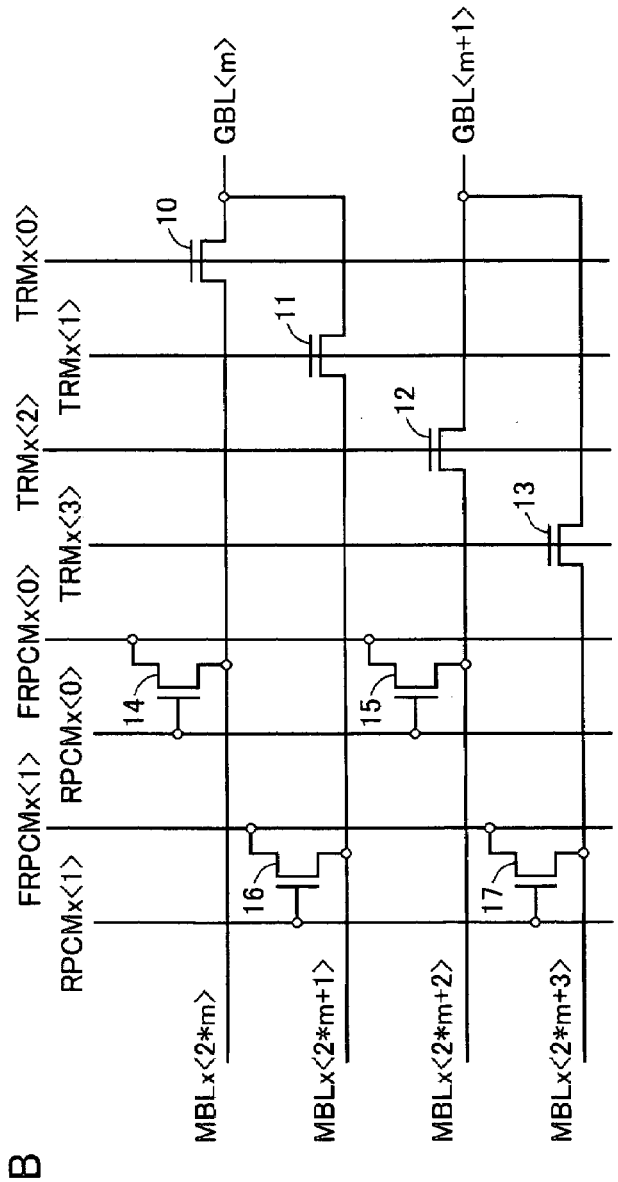

FIGS. 5A and 5B are circuit block diagrams showing the configuration of GBL-MBL connection regions CA shown in FIG. 3. In FIGS. 5A and 5B, GBL-MBL connection regions CA between sub-blocks SB0 and SB1 are divided into two sub-connection regions SCA0 and SCA1 which correspond to sub-blocks SB0 and SB1, respectively, and GBL-MBL connection regions CA between sub-blocks SB2 and SB3 are divided into two sub-connection regions SCA2 and SCA3 which correspond to sub-blocks SB2 and SB3, respectively.

Sub-connection regions SCA have two functions. A first function is, as the name suggests, to connect a global bit line GBL to either of two main bit lines MBL in a selective manner, and this is implemented by the N channel MOS transistor 10 to 13 of which the gate receives a signal TRMx<y> (here, x is the number of sub-blocks SB, and y is any integer from 0 to 3). That is to say, a transistor 10 is connected between a global bit line GBL<m> and a main bit line MBLx<2*m>, and the gate thereof receives a signal TRMx<0>. A transistor 11 is connected between global bit line GBL<m> and a main bit line MBLx<2*m+1>, and the gate thereof receives a signal TRMx<1>. When signal TRMx<0> or TRMx<1> is converted to level "H," transistor 10 or 11 is energized, so that global bit line GBL<m> is connected to main bit line MBLx<2*m> or MBLx<2*m+1>.

A transistor 12 is connected between a global bit line GBL<m+1> and a main bit line MBLx<2*m+2>, and the gate thereof receives a signal TRMx<2>. A transistor 13 is connected between global bit line GBL<m+1> and a main bit line MBLx<2*m+3>, and the gate thereof receives a signal TRMx<3>. When signal TRMx<2> or TRMx<3> is converted to level "H" transistor 12 or 13 is energized, so that global bit line GBL<m+1> is connected to main bit line MBLx<2*m+2> or MBLx<2*m+3>.

A second function of sub-connection regions SCA is a pre-charging function of supplying an appropriate voltage to main bit line MBL that has been separated by one of transistors 10 to 13, and this is implemented by one of N channel MOS transistors 14 to 17 of which the gate receives a signal RPCMx<z> and of which the source receives a signal FRPCMx<z> (here, z is 0 or 1).

That is to say, the gate of transistors 14 and 15 receives a signal RPCMx<0>, the source thereof receives a signal FRPCMx<0>, and the drains thereof are respectively connected to main bit lines MBLx<2*m> and MBLx<2*m+2>. The gate of transistors 16 and 17 receives a signal RPCMx<1>, the source thereof receives a signal FRPCMx<1>, and the drains thereof are respectively connected to main bit lines MBLx<2*m+1> and MBLx<2*m+3>. When signal RPCMx<0> or RPCMx<1> is converted to level "H," transistors 14 and 15 or 16 and 17 are energized, so that the voltage of signal FRPCMx<0> or FRPCMx<1> is supplied to main bit lines MBLx<2*m> and MBLx<2*m+2> or MBLx<2*m+1> and MBLx<2*m+3>.

Figure 6:
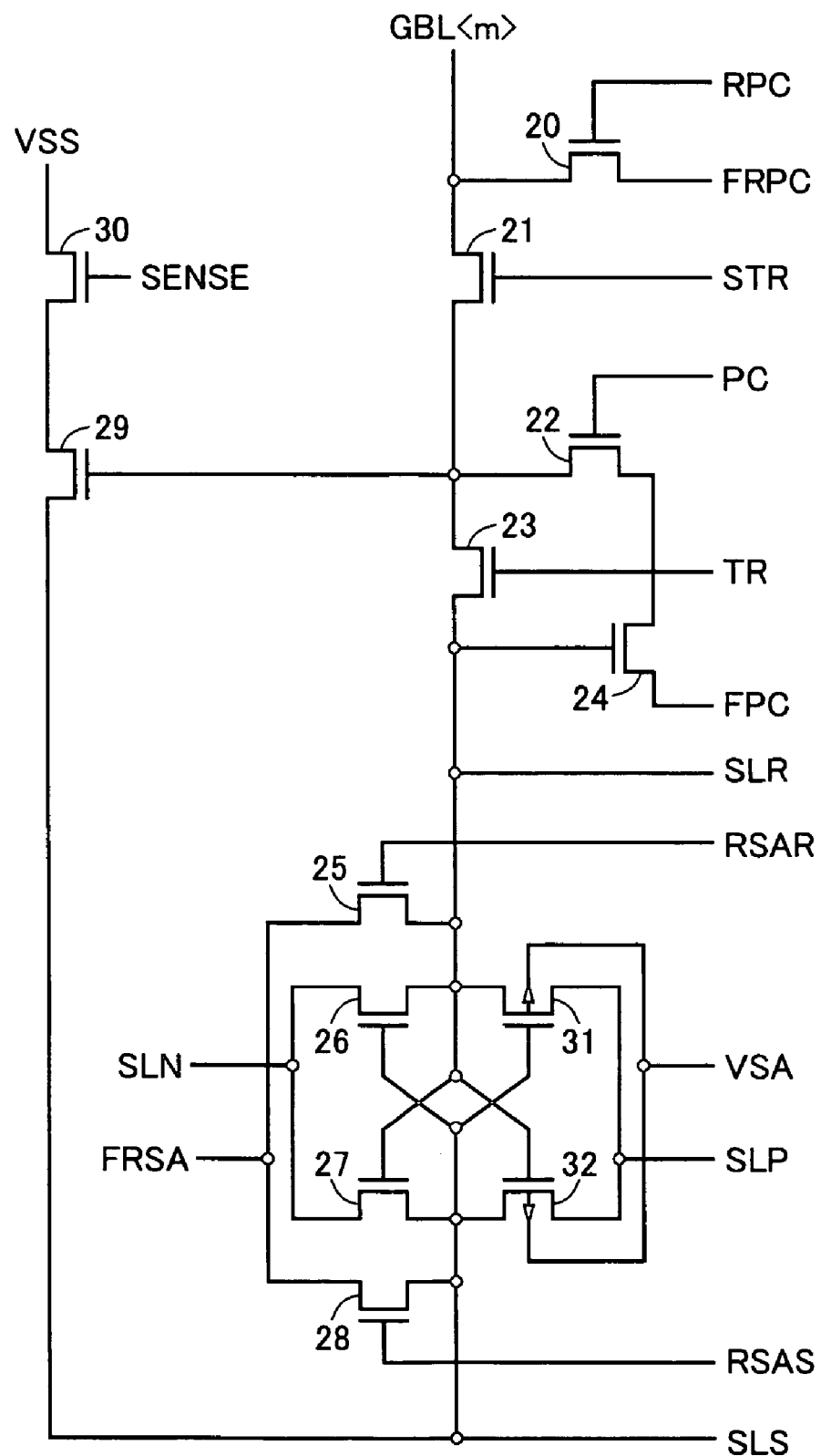
FIG. 6 is a circuit diagram showing the configuration of the sense latch unit circuits shown in FIGS. 5A and 5B.

Sense latch SL includes sense latch unit circuits SLU which are provided so as to correspond to respective global bit lines GBL. As shown in FIG. 6, sense latch unit circuits SLU include N channel MOS transistors 20 to 30 and P channel MOS transistors 31 and 32.

At the time of read-out operation, a signal STR is converted to level "H," and the voltage of corresponding global bit line GBL<m> is supplied to the gate of transistor 29. Here, when a signal SENSE is converted to level "H," grounding voltage VSS is supplied via transistor 30 to the source of transistor 29, and transistor 29 turns on or off in response to the voltage of global bit line GBL<m>, and the resulting signal is amplified by a cross-coupling type sense amplifier in the next stage, made of transistors 25 to 28, 31, and 32.

At the time of write-in operation, in the case where it is desired for write-in to be carried out in memory cell transistor MC, one input/output node SLS of a sense amplifier is converted to level "H," and the other output/input node SLR is converted to level "L," while in the case where it is not desired for write-in to be carried out in memory cell transistor MC, one input/output node SLS of the sense amplifier is converted to level "L," and the other input/output node SLR is converted to level "H," so that the voltage between input/output nodes SLS and SLR is latched to the sense amplifier. It is to be noted that signals RSAR, FRSA and RSAS are signals for setting initial values of input/output nodes SLR and SLS.

Here, write-in into a memory transistor MC is carried out by raising threshold voltage VTHC of memory cell transistor MC, that is to say, by converting memory cell transistor MC to a state where no current flows through memory cell transistor MC (global bit line GBL is not discharged) when read-out of the data in memory cell transistor MC is attempted by applying an appropriate voltage to corresponding word line WL after write-in.

When signals PC, FPC and STR are all converted to level "H" in a state where signal TR is at level "L," global bit lines GBL<M> may selectively pre-charged, depending on the state in which a voltage is held in the sense amplifier. Concretely, in the case where input/output node SLR is at level "H," global bit line GBL<m> is charged to a voltage (approximately 2V) which is lower than the voltage of signal PC by the threshold voltage of transistor 22, and in the case where input/output node SLR is at level "L," the initial state (=GND) is kept, where global bit line GBL<m> is reset. After that, signal TR becomes of level "H" (the same voltage as that of signal PC at level "H"), and the state of the global bit line is kept the same by the sense amplifier.

Figure 7:
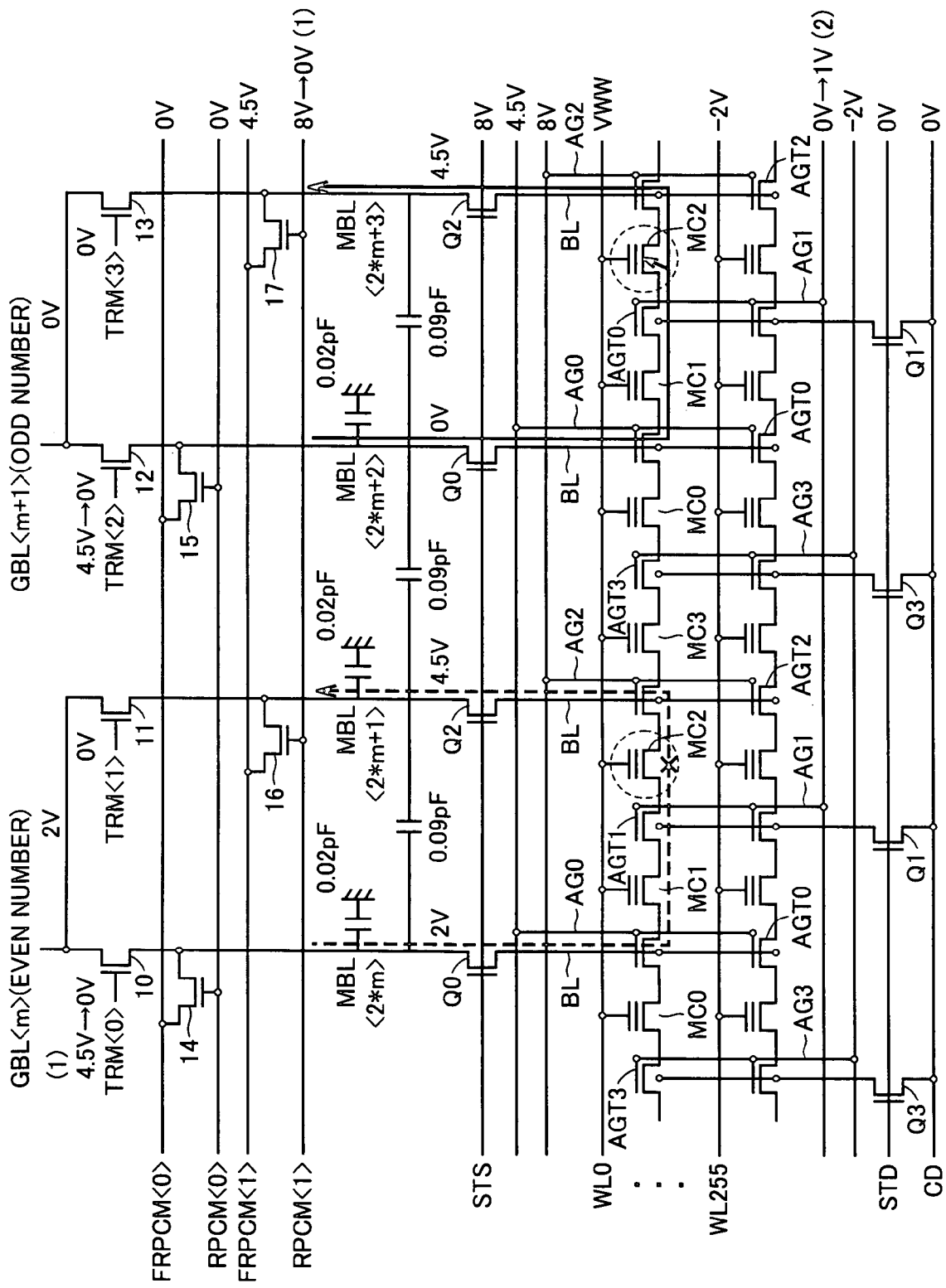
FIG. 7 is a is a circuit diagram showing a write-in operation of the AG-AND flash memory shown in FIGS. 1 to 6.
Figure 36:
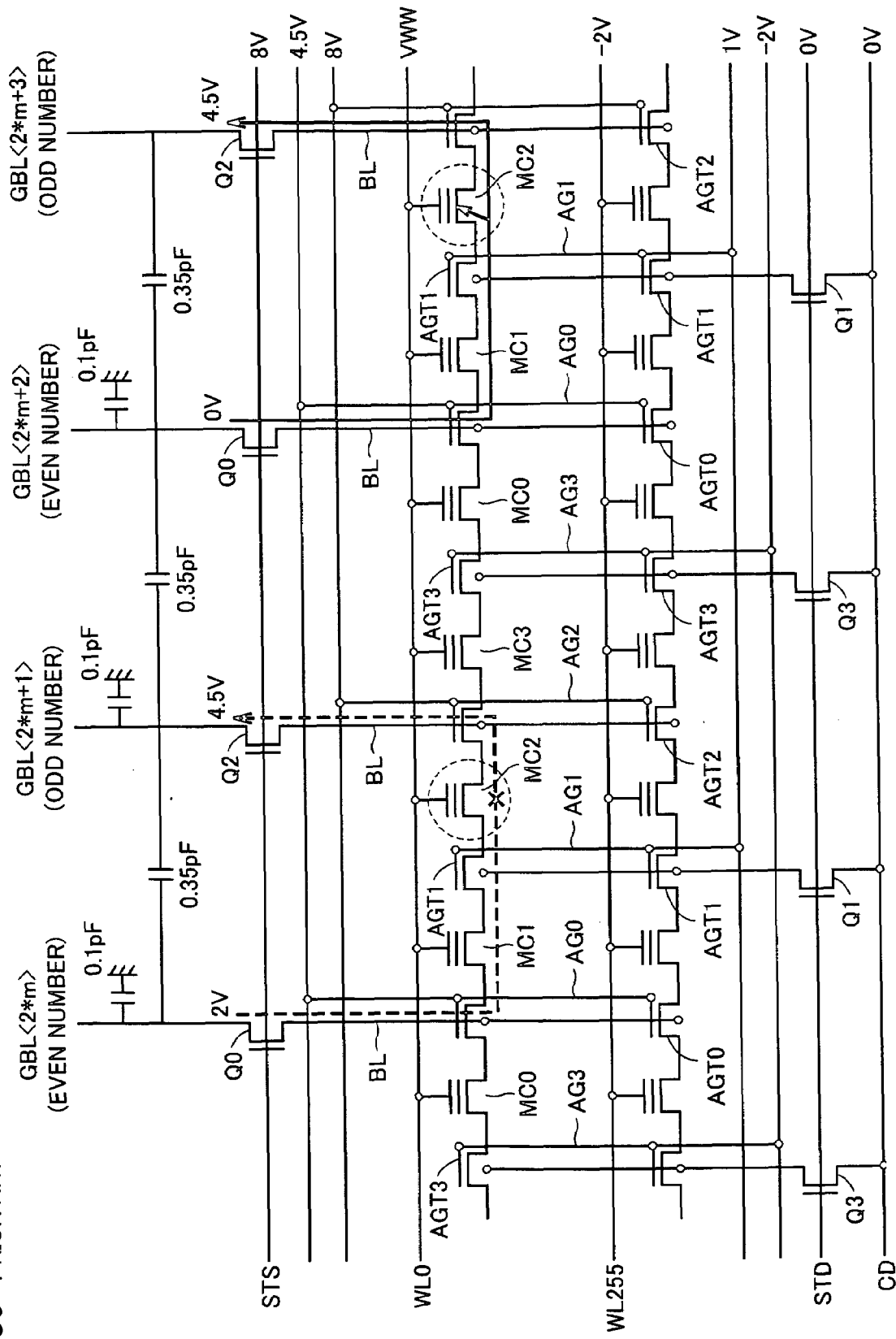
FIG. 36 is a circuit diagram showing a write-in operation of the AG-AND flash memory shown in FIGS. 32 and 33.

Next, write-in operation of this AG-AND type flash memory is described. FIG. 7 is a diagram showing the state of the respective signals at the point in time when write-in into a memory cell transistor MC2 is started. The state inside string ST is the same as that in FIG. 36. Selection of a bank BA, a sub-block SB, string ST, global bit line GBL, main bit line MBL, a memory cell MC and word line WL is conducted by X decoder XD of FIG. 2 on the basis of an address signal. The voltage of an inversion layer bit line BL on the source side is supplied from sense latch SL via global bit lines GBL<m> and GBL<m+1> in the same manner as in the conventional art. Signals TRM<0> and TRM<2> which correspond to memory cell transistor MC2 that is the object of write-in become of level "H," and either of two main bit lines MBL which correspond to global bit line GBL is selectively connected to global bit line GBL. FIG. 7 shows a state where global bit lines GBL<m> and GBL<m+1> are connected to main bit lines MBL<2*m> and MBL<2*m+2>, respectively, and main bit lines MBL<2*m> and MBL<2*m+2> are charged to 2 V and 0 V, respectively.

Meanwhile, the voltage of an inversion layer bit line BL on the drain side (4.5 V) is supplied from the node of signal FRPCM via the transistor of which the gate receives signal RPCM. In FIG. 7, the voltage of inversion layer bit line BL on the drain side is supplied from the node of signal FRPCM<1> via transistors 16 and 17, of which the gate receives signal RPCM<1>. At this time, only main bit line MBL (capacitance: 0.2 pF) having a length which is only ¼ of global bit line GBL (0.8 pF) is charged to 4.5 V, and therefore, the power consumption becomes low. In addition, assist gates AG0 and AG2 are set to 4.5 V and 8 V, respectively, so that inversion layer bit lines BL are formed in a lower layer of assist gates AG0 and AG2. In addition, word line WL0 is raised from -2 V to write-in voltage VWW.

As for the write-in system, a constant charge is kept between main bit lines MBL which becomes of a floating state after an appropriate voltage has been supplied, and in charge sharing write-in, signals TRM<0> and TRM<2> are converted from 4.5 V→0 V, and signal RPCM<1> is converted from 8 V→0 V, and thereby, main bit lines MBL<2*m> and MBL<2*m+2> on the source side, as well as main bit lines MBL<2*m+1> and MBL<2*m+3> on the drain side, are converted to a floating state (1), and subsequently, the voltage of assist gate AG1 is raised to 1 V so as to start write-in (2). The wire length of main bit lines MBL is ¼ of the wire length of global bit lines GBL, and therefore, write-in is carried out with a charge that is smaller than that in the charge sharing system between global bit lines GBL of FIG. 36, and thereby, controllability in the amount of shift in VTHC per write-in is improved.

Figure 8:
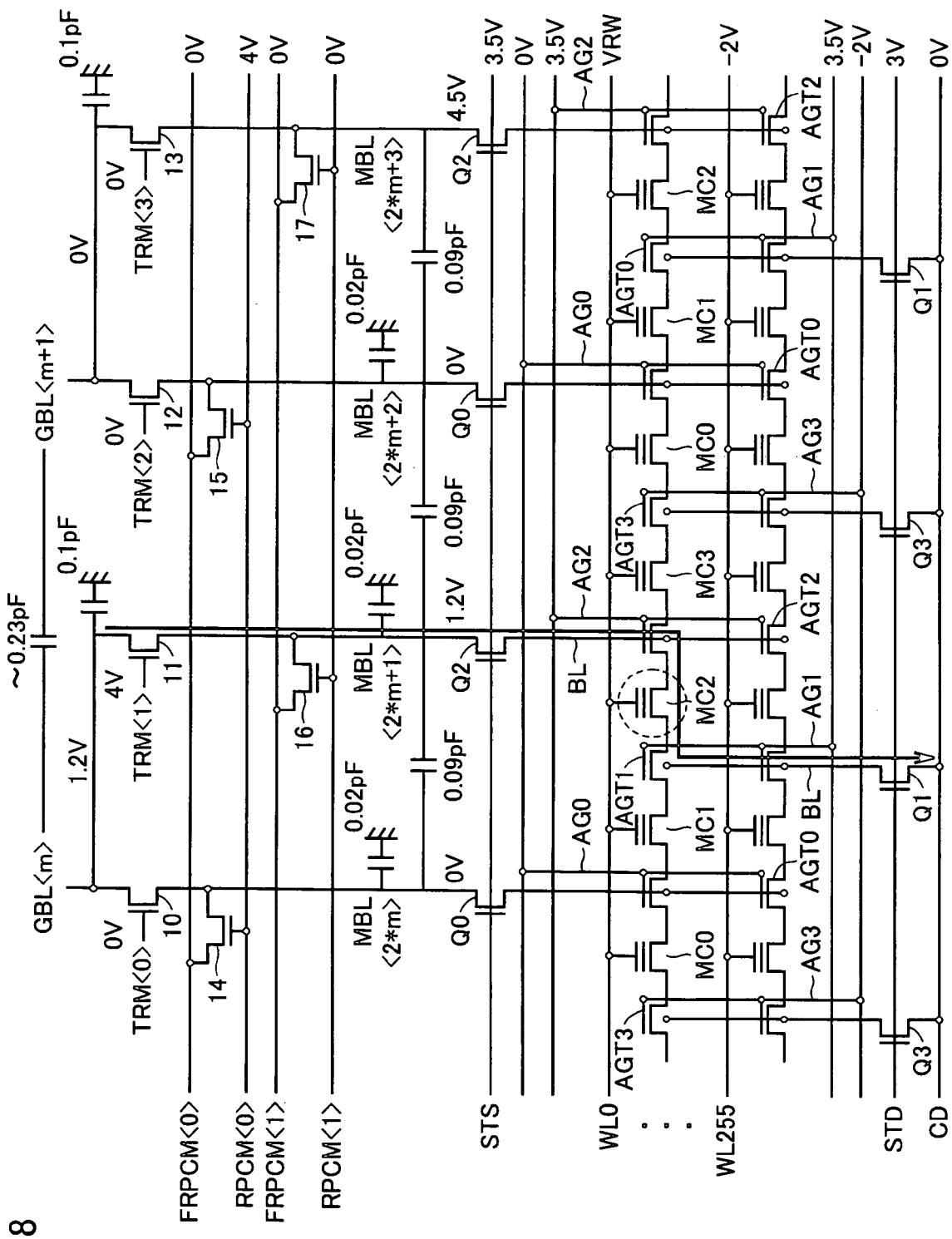
FIG. 8 is a circuit diagram showing a read-out operation of the AG-AND flash memory shown in FIGS. 1 to 6.

In addition, read-out operation is carried out in the following sequence. With reference to FIG. 8, a case where data in memory cell transistor MC2 is read out is cited. First, in order to read out data from half of memory cell transistors MC2 to global bit lines GBL<m> on the even number side, only signal TRM<1> is set to 4 V, so that transistor 11 is turned on, and global bit lines GBL<m> are connected to main bit lines MBL<2*m+1> and charged to 1.2 V. In addition, global bit lines GBL<m+1> are set to 0 V so as to be used as shield lines. In addition, assist gates AG1 and AG2 are both set to 3.5 V, so that inversion layer bit lines BL are formed in a lower layer of assist gates AG1 and AG2. In addition, word line WL0 is raised from -2 V to read-out voltage VRW. Here, pre-charging and fixing of potential of a global bit line GBL is carried out by transistor 20 in FIG. 6.

After that, signal STD is raised to 3 V, so that transistors Q1 and Q3 are turned on. As a result, the voltage of global bit line GBL<m> changes in accordance with the size relationship between read-out voltage VRW of word line WL0 and threshold voltage VTHC of memory cell transistor MC2, and this change in the voltage is sensed by sense latch SL. After that, the voltage of global bit line GBL<m>, as well as main bit lines MBL<2*m> and MBL<2*m+1>, are reset, the data of the other half of memory cell transistors MC2 is read out to global bit lines GBL<m+1> on the odd number side in the same manner. In this manner, one page is read out in two installments, and thereby, it becomes possible to use half of global bit lines GBL as a shield, and the noise margin of the read-out data is increased.

As described above, in this first embodiment, a layered bit line configuration where memory arrays MA are divided into a plurality of sub-blocks SB, new main bit lines MBL are allocated so as to newly correspond to respective sub-blocks SB, and main bit lines MBL are selectively connected to global bit lines GBL in an upper layer via switches is provided, and thereby, it becomes possible to carry out write-in of data into a flash memory with low power consumption, as well as to control threshold voltage VTHC with precision.

Second Embodiment

In the read-out operation of a first embodiment, data is divided into two parts which are read out from memory array MA, and thus, a serial operation is carried out. In this system, though the problem with coupling noise between global bit lines GBL can be avoided, a problem arises, such that read-out throughput becomes half.

Therefore, in the present second embodiment, a read-out method for making faster read-out possible is described. FIGS. 9 to 13 show a concrete sequence. Here, in FIGS. 9 to 13, it is assumed that a memory cell transistor MC2 in each memory cell transistor group is accessed.

Figure 9:
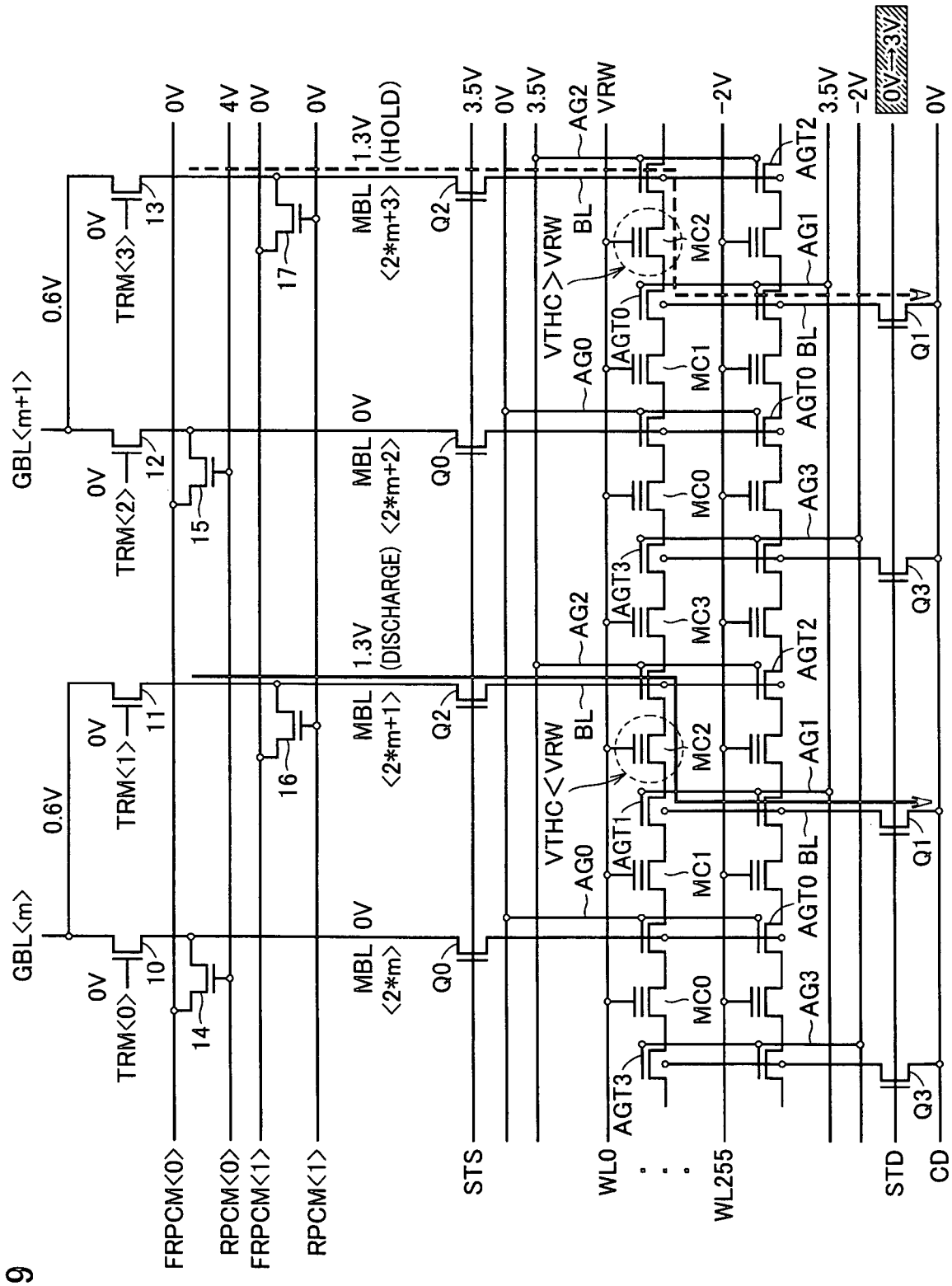
FIG. 9 is a circuit diagram showing a read-out operation of an AG-AND flash memory according to a second embodiment of this invention.

FIG. 9 shows the first stage in the method for read-out according to the present second embodiment. A global bit line GBL is pre-charged to 0.6 V, which is slightly lower than 0.65 V, which is the threshold voltage (that is to say, logical threshold voltage VTHL of sense latch SL) of transistor 29 in FIG. 6. Main bit lines MBL<2*m+1> and MBL<2*m+3> are pre-charged to 1.3 V in advance by setting signal RPCM<1> to 4 V and signal FRPCM<1> to 1.3 V. At this stage, all signals TRM are made to be of level "L," so that all main bit lines MBL are separated from corresponding global bit lines GBL. Assist gates AG1 and AG2 are set to 3.5 V, so that inversion layer bit lines BL are formed in a lower layer of assist gates AG1 and AG2. Thus, word line WL0 is raised from -2 V to selection voltage VRW, and at the same time, signal STD is raised to level "H," and thereby, main bit line MBL is discharged in accordance with threshold voltage VTHC of memory cell transistor MC2.

Here, it should be noted that unlike in the first embodiment, data is read-out at one time to main bit lines MBL from memory cell transistors MC2 (=One page) which are selected from the row address. The number of main bit lines MBL is two times greater than the number of pieces of read-out data, and every other main bit line carries data. That is to say, it is possible for the remaining main bit lines MBL to be fixed at an appropriate voltage, so that they have a shielding effect (in FIG. 9, signal RPCM<0> is set at level "H," and thus, main bit lines MBL<2*m> and MBL<2*m+2> are fixed at grounding voltage GND). Read-out is continued until the voltage of main bit line MBL that is connected to memory cell transistor MC2 having threshold voltage VTHC that is lower than voltage VRW of word line WL0 becomes 0.5 V.

Figure 10:
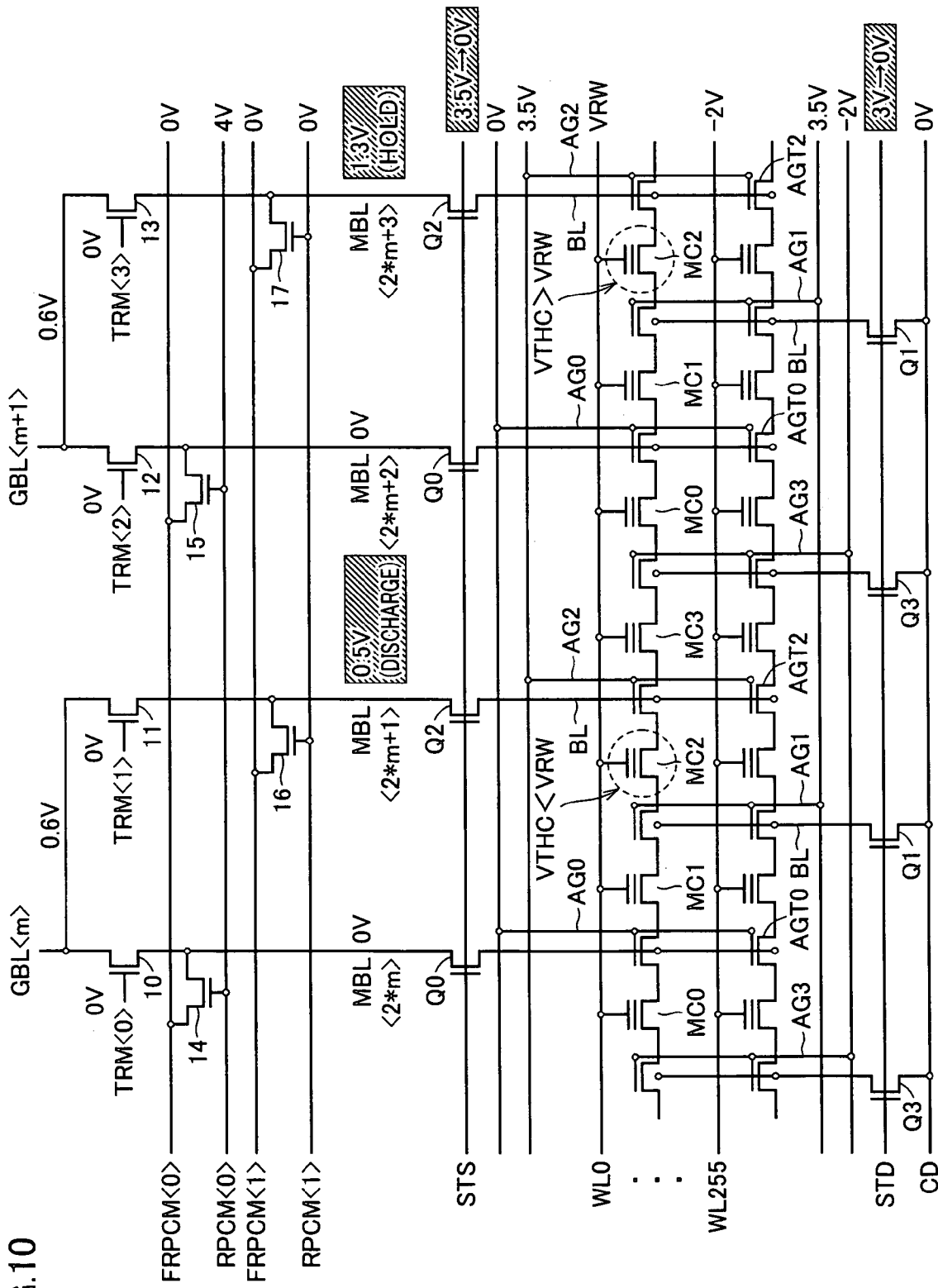
FIG. 10 is another circuit diagram showing the read-out operation of the AG-AND flash memory shown in FIG. 9.

FIG. 10 shows the second stage in the method for read-out according to this second embodiment. After the time for the voltage of main bit line MBL which is connected to memory cell transistor MC of VRW>VTHC to swing to 0.5 V has passed, signal STD becomes of level "'L," so that memory cell transistor is turned off. At the same time, signal STS is also at level "L," and main bit line MBL and memory cell MC are separated from each other. As a result of this, read-out data is held in main bit line MBL.

Figure 11:
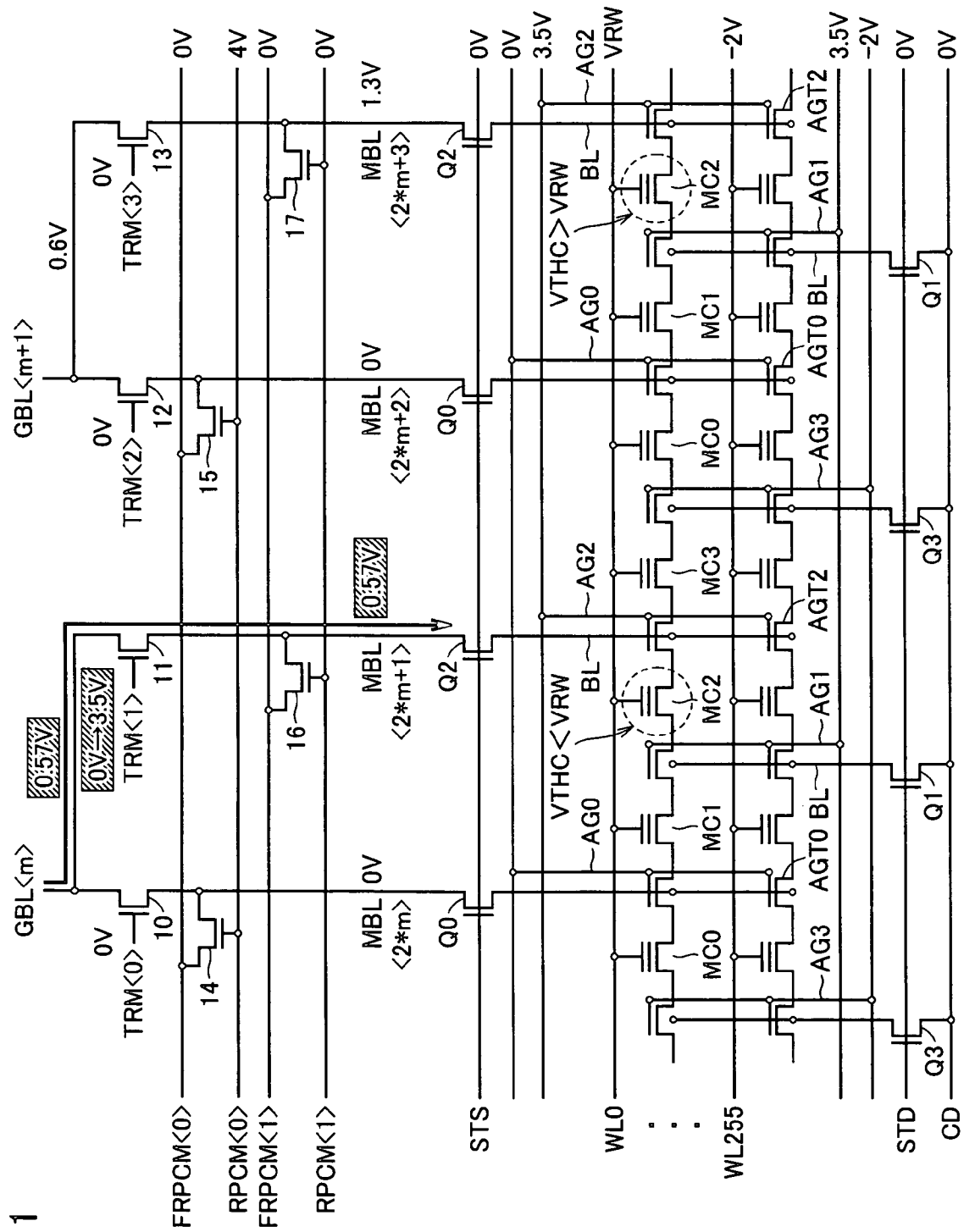
FIG. 11 is still another circuit diagram showing the read-out operation of the AG-AND flash memory shown in FIG. 9.

FIG. 11 shows the third stage in the method for read-out according to the present second embodiment. At this third stage, data for one page that has been read to main bit line MBL is transferred to global bit line GBL, and is sensed and latched by sense latch SL. First in order to read out data for half pages to global bit line GBL<m>, signal TRM<1> is converted to level "H," so that corresponding main bit line MBL<2*m+1> is connected to global bit line GBL<m>. At this time, the voltage that is read to global bit line GBL<m> is determined through redistribution of the charge that is stored in main bit line MBL<2*m+1> and global bit line GBL<M> immediately before signal TRM<1> becomes of level "H."

When the parasitic capacitance of main bit line MBL<2*m+1> and global bit line GBL<m> are Cmbl and Cgbl, respectively, the voltage of main bit line MBL<2*m+1> and global bit line GBL<m> immediately before signal TRM<1> becomes of level "H" is Vmbl and Vgbl, respectively, and the voltage of main bit line MBL<2*m+1> and global bit line GBL<m> after the charge has been redistributed between the two is Vread, the following equation (1) applies.

$$Cmbl*Vmbl+Cgbl*Vgbl=(Cgbl+Cgbl)*Vread \quad (1)$$

Equation (1) is changed, so that the following equation (2) results.

$$Vread=(Cmbl*Vmbl+Cgbl*Vgbl)/(Cgbl+Cgbl) \quad (2)$$

In the example of FIG. 11, Cmbl=0.2 pF, Cgbl=0.5 pF and Vgb1=0.6 V, and therefore, in the case of VRW>VTHC, Vmb1=0.5 V and Vread=(0.2 pF*0.5 V+0.5 pF*0.6 V)/(0.2 pF+0.5 pF)=0.57 V. In addition, in the case of VRW<VTHC, Vmbl=1.3 V and Vread=(0.2 pF*1.3 V+0.5 pF*0.6 V)/(0.2 pF+0.5 pF)=0.8 V. Here, logical threshold voltage VTHL of sense latch SL is 0.65 V, and therefore, in the case of VRW>VTHC, VTHL>Vread, and conversely, in the case of VRW<VTHC, VTHL<Vread. That is to say, the two can be identified in sense latch SL.

Figure 12:
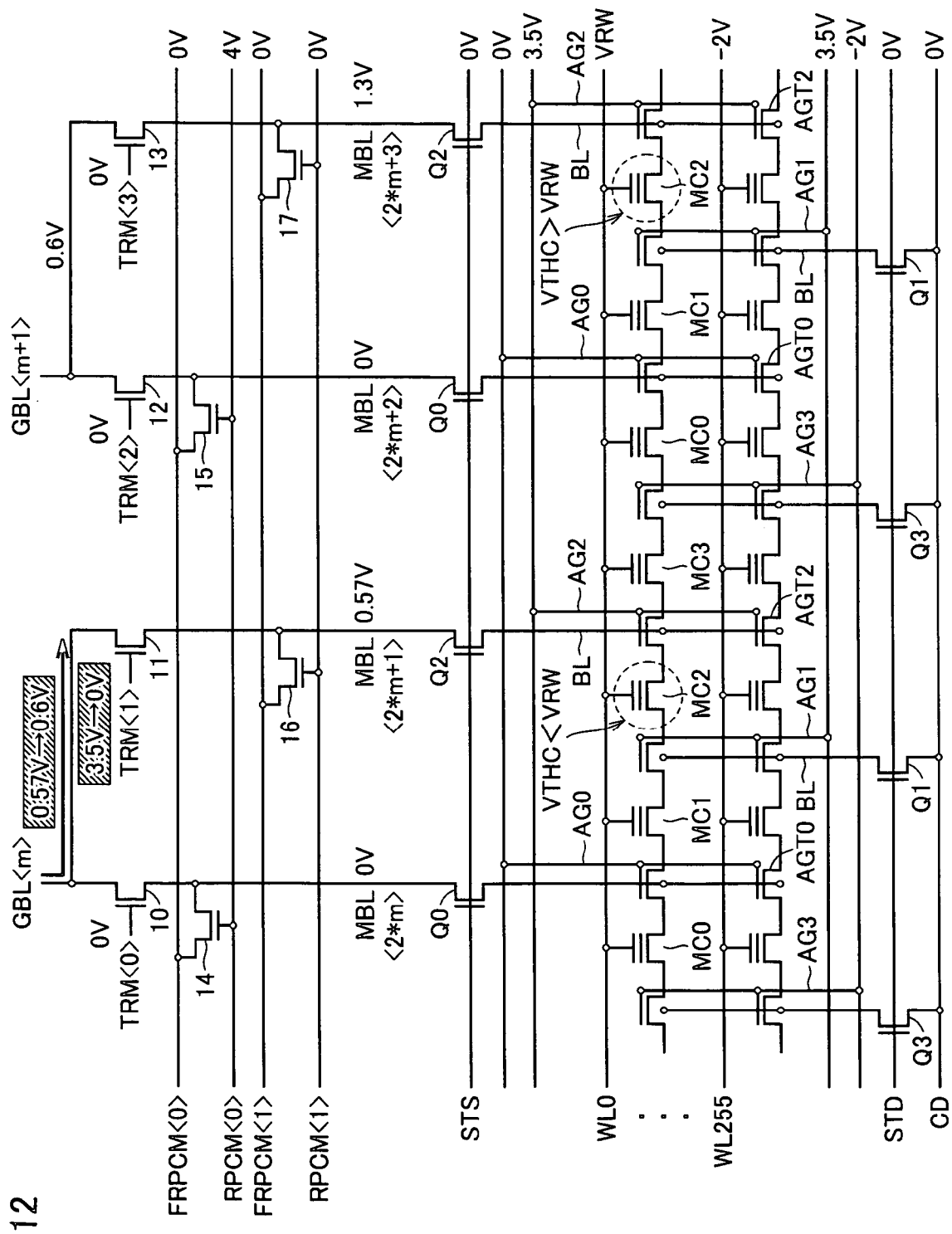
FIG. 12 is yet another circuit diagram showing the read-out operation of the AG-AND flash memory shown in FIG. 9.

FIG. 12 shows the fourth stage in the method for read-out according to the present second embodiment. In order to sequentially read the second half of one page after the first half has been read out, it is necessary to once reset the state of read-out of the first half. Therefore, signal TRM<1> is converted to level "L," so that corresponding main bit line MBL<2*m+1> is detached from global bit line GBL<m>, and at the same time, the remaining read-out data is cleared, and global bit lines GBL<m> that have been used for the read-out of the first half are fixed at 0.6 V, so that they function as a shield at the time of read-out of the second half.

Figure 13:
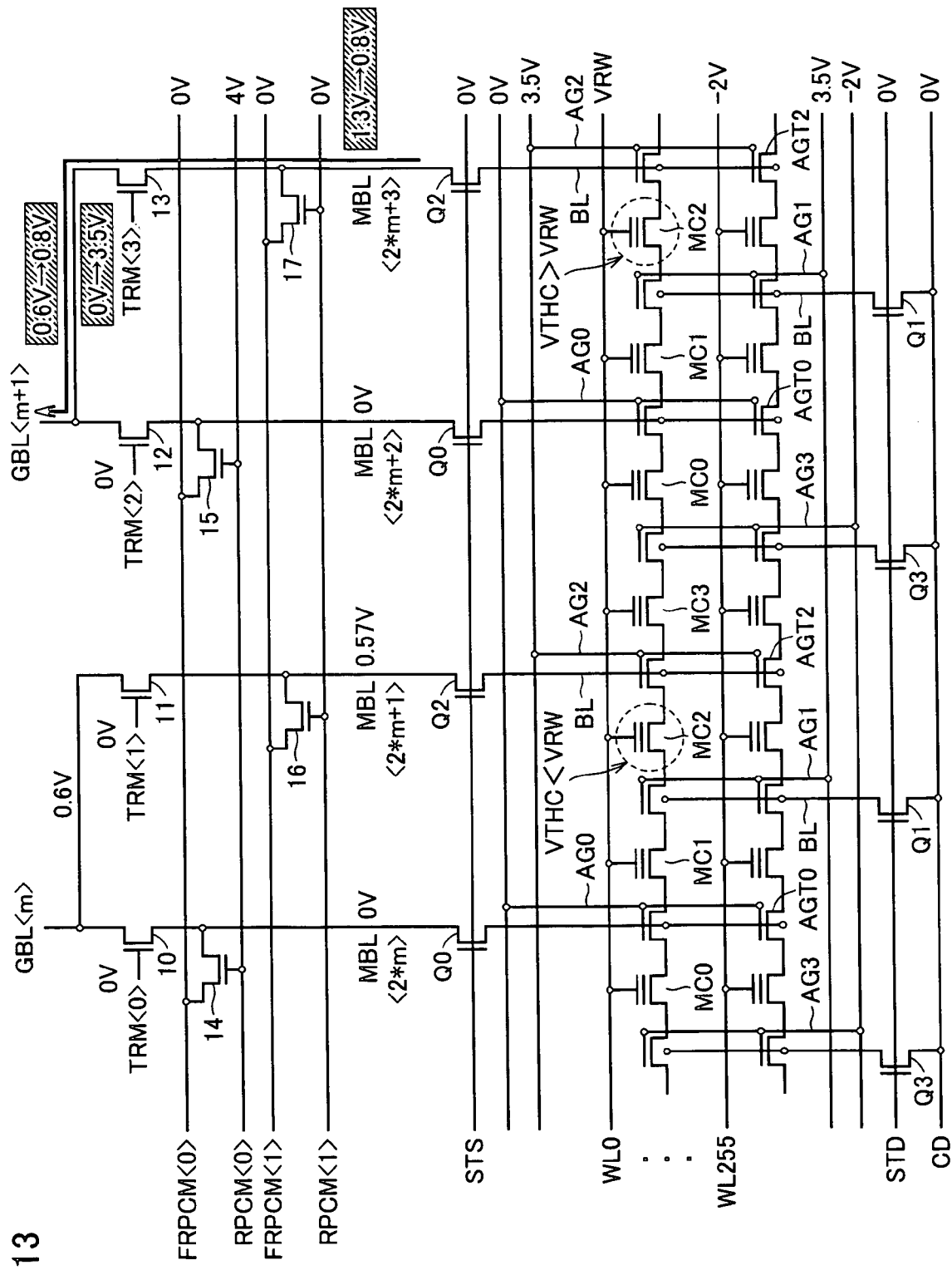
FIG. 13 is still yet another circuit diagram showing the read-out operation of the AG-AND flash memory shown in FIG. 9.

FIG. 13 shows the fifth stage in the method for read-out according to the present second embodiment. Here, in order to read out the second half of one page, signal TRM<3> is converted to level "H," so that corresponding main bit line MBL<2*m+3> is connected to global bit line GBL<m+1>. In the following, the concept of read-out is the same as in the description in reference to FIG. 12.

Next, it is verified how much faster the read-out system "collective read-out of one page to main bit lines MBL→redistribution and transfer of charge to global bit lines GBL of data of first half→resetting of global bit lines GBL→redistribution and transfer of charge to global bit lines GBL of data of second half" which has been described so far is than that of the first embodiment. When a cell current of a memory cell transistor MC that has become VRW>VTHC is Icell, and the time for resetting global bit lines GBL is ignored, time for read-out Tread1 in the system of the first embodiment can be represented by the following equation (3).

$$\begin{aligned}Tread1 &\approx 2*Cgbl*(Vgbl - VTHL)/Icell \quad (3)\\ &= 2*0.8 \text{ pF}*(1.2 \text{ } V - 0.65 \text{ } V)/Icell \\ &= 0.88 pC/Icell\end{aligned}$$

Meanwhile, time for read-out Tread2 of the present second embodiment can be represented by the following equation (4) when the time for transferring charge between main bit line MBL and global bit line GBL is Tchs.

$$\begin{aligned}Tread2 &\approx Cmbl*(Vmbl - Vread)/Icell + 2*Tchs \quad (4)\\ &= 0.2 \text{ pF}*(1.3 \text{ } V - 0.5 \text{ } V)/Icell + 2*Tchs \\ &= 0.16 pC/Icell + 2*Tchs\end{aligned}$$

Main bit lines MBL and global bit lines GBL are metal wires which do not have a very high resistance value, and charge transfer is completed in the order of 100 ns at the highest. When Icell is in the order of 0.1 µA, the second term is so small as to be negligible, in comparison with the first term in the final equation of Tread2. Accordingly, Tread2 can be represented by the following equation (5).

$$Tread2 \approx 0.16 \text{ pF}/Icell \quad (5)$$

When equations (3) and (5) are compared, it is obvious that the read-out system of the second embodiment is overwhelmingly faster (increase in speed of no less than 5 times). In addition, though power consumption is great when global bit lines GBL swing according to the conventional art when the power consumption at the time of read-out operation is taken into consideration, main bit lines MBL swing by approximately the same degree in the present second embodiment, and therefore, the power consumption can be reduced a great deal.

As described above, in this second embodiment, in a flash memory having a layered bit line configuration where memory arrays MA are divided into a plurality of sub-blocks SB, new main bit lines MBL are allocated so as to newly correspond to respective sub-blocks SB, and main bit lines MBL are selectively connected to global bit lines GBL in an upper layer via switches, information that has been read out to memory cell transistor MC at the time of read-out of data is once held by main bit line MB and transferred selectively to corresponding global bit line GBL through redistribution of charge, and thereby, read-out operation at high speed and with little power consumption becomes possible.

Third Embodiment

If the layered bit line configuration shown in the first and second embodiments is further developed, it is possible to use each memory array MA as a plurality of independent pseudo banks.

Figure 14:
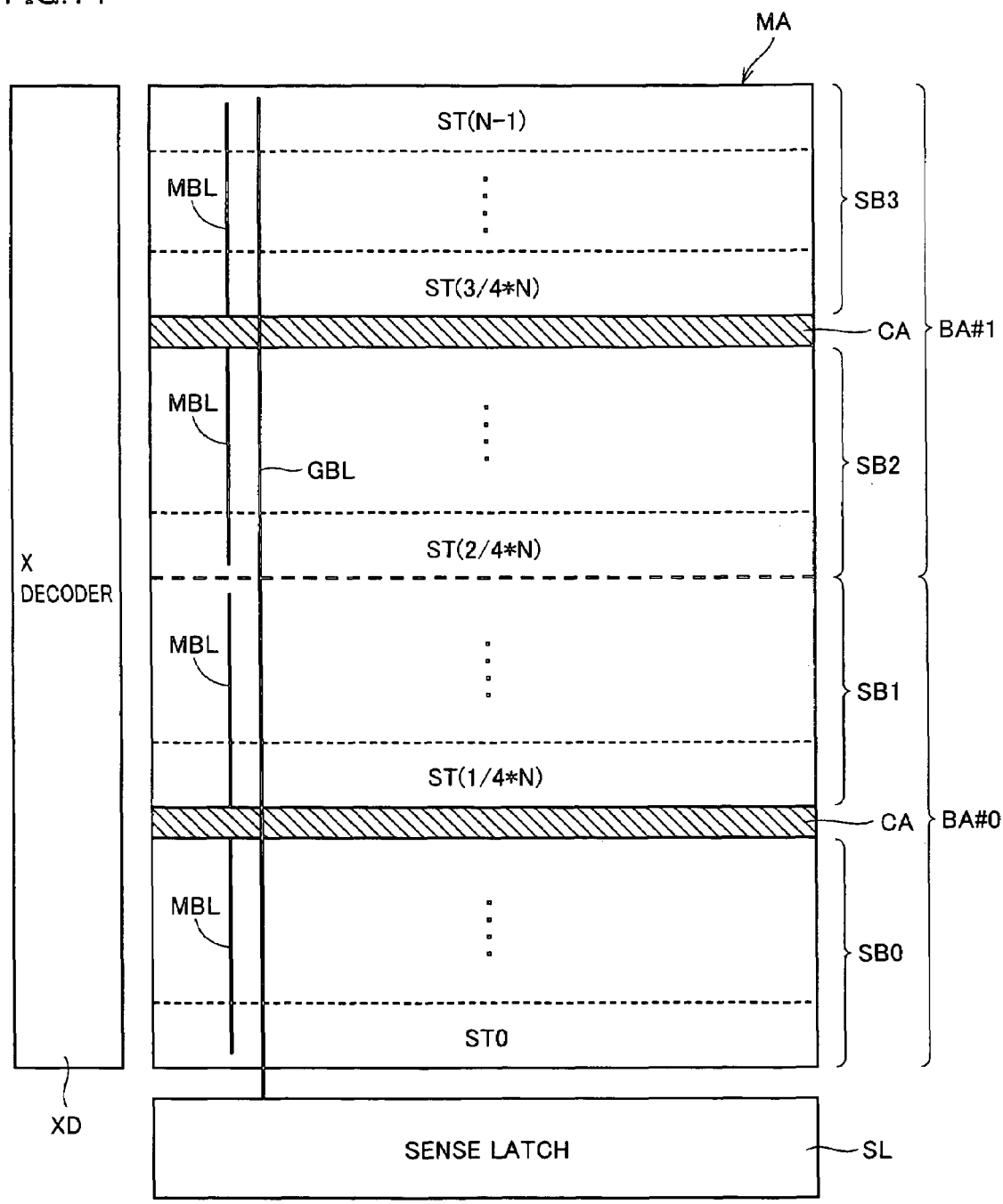
FIG. 14 is a block diagram showing a major portion of the banks of an AG-AND type flash memory according to a third embodiment of this invention.

FIG. 14 is a block diagram showing the configuration of a memory array MA of an AG-AND type flash memory according to a third embodiment. Though global bit lines GBL, main bit lines MBL and GBL-MBL connection regions CA are the same as those in FIG. 3 according to the first embodiment, sub-bocks SB0 and SB1 are allocated to bank BA#0, and sub-blocks SB2 and SB3 are allocated to bank BA#1, which is different from in the first embodiment.

Figure 15A:
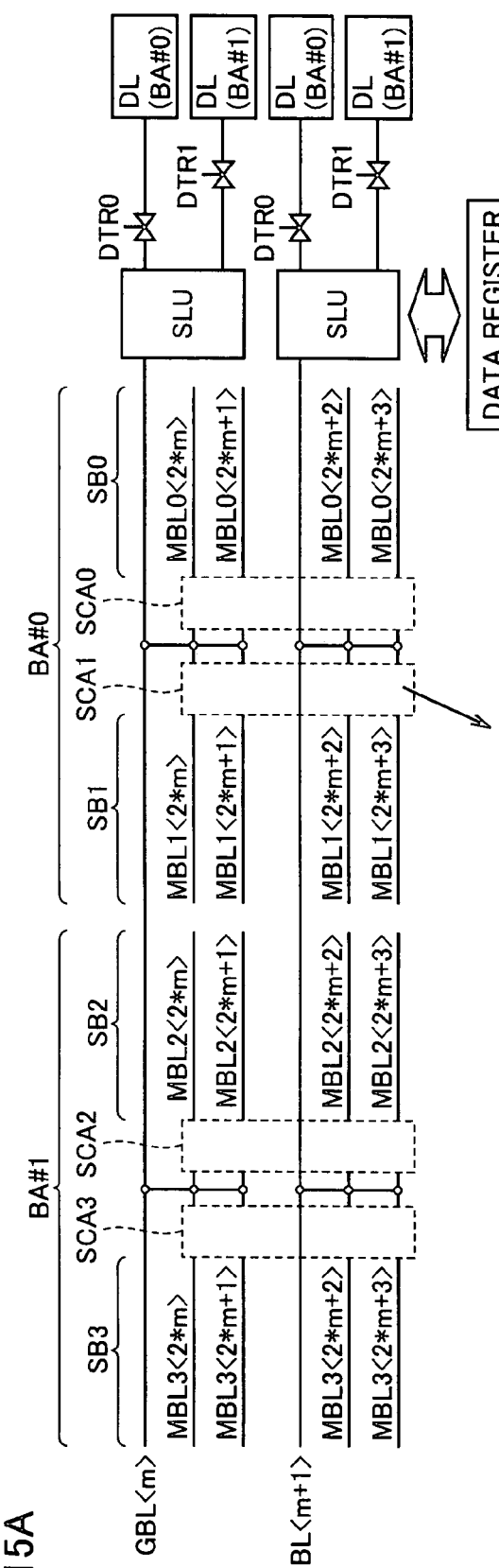
FIGS. 15A and 15B are circuit block diagrams showing the configuration of the GBL-MBL connection regions shown in FIG. 14.
Figure 15B:
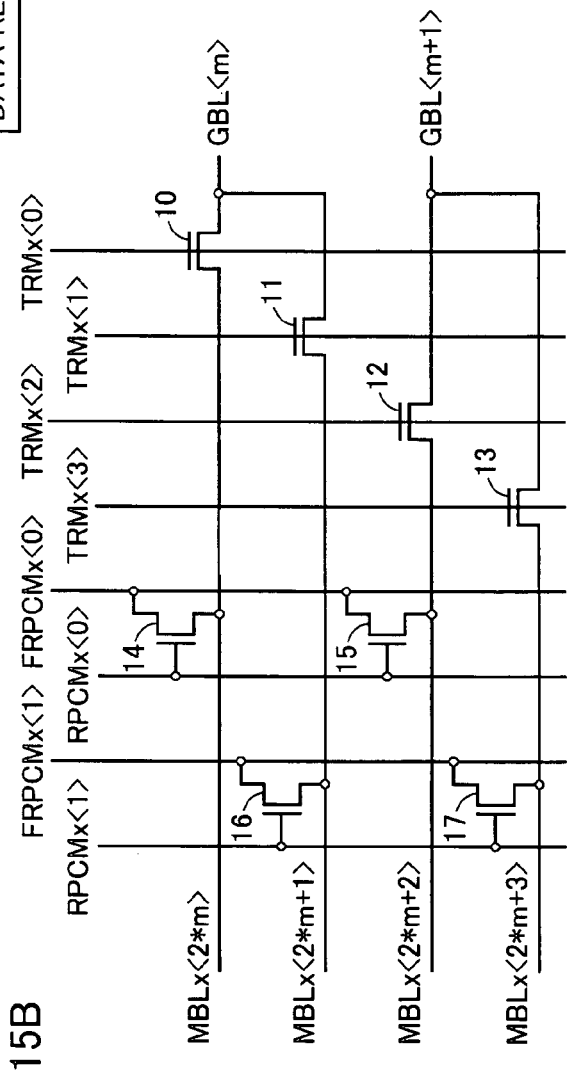

The connection relationship between global bit lines GBL and main bit lines MBL is shown in FIGS. 15A and 15B. Though this configuration is basically the same as that of FIGS. 5A and 5B according to the first embodiment, data latch DL is added to each sense latch unit circuit SLU in accordance with the below described multi-bank write-in. Here, the configuration of strings ST is the same as in FIG. 4.

Figure 17:
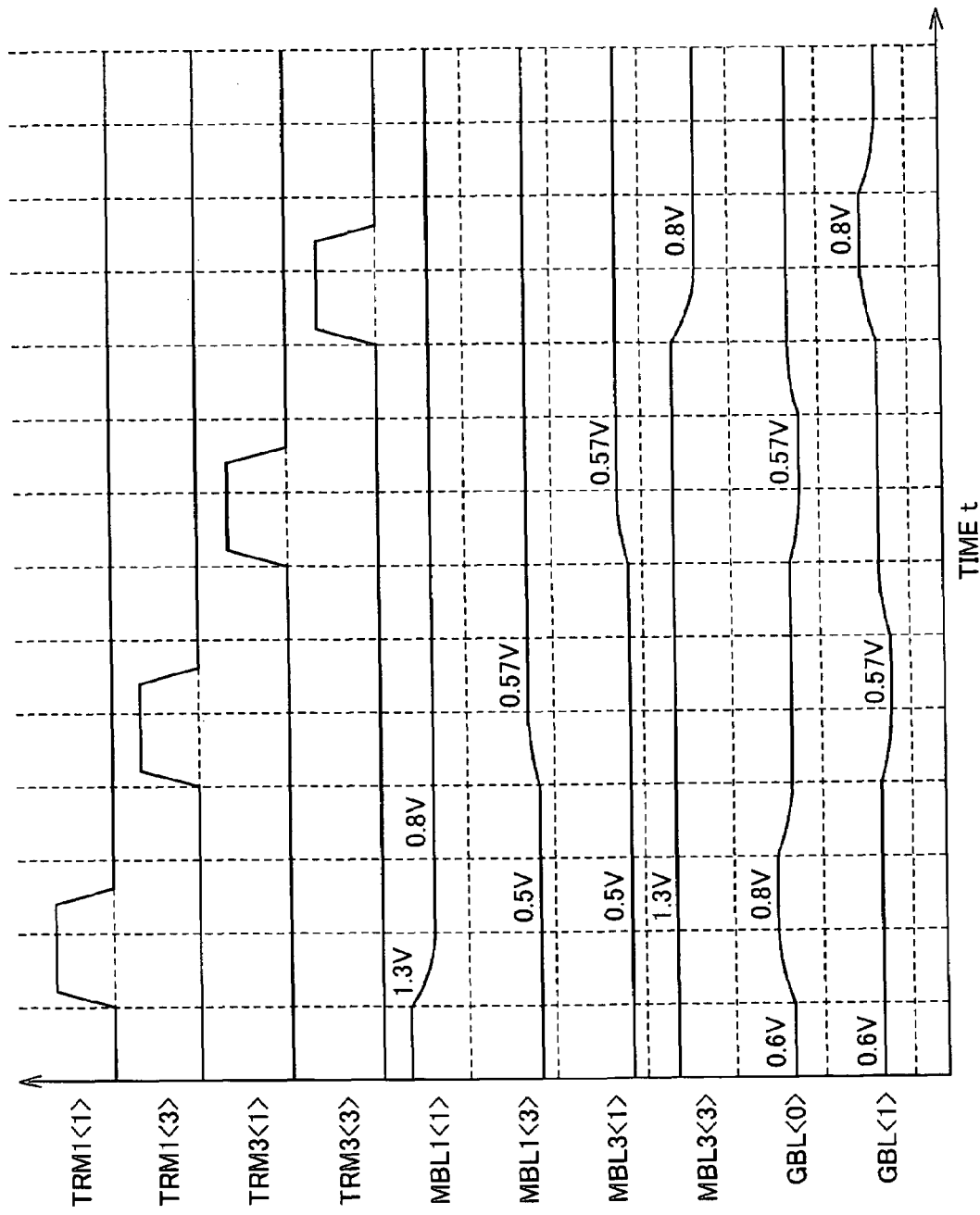
FIG. 17 is a time chart showing the read-out operation of the AG-AND flash memory shown in FIGS. 14, 15A and 15B.

Multi-bank operation in the configuration of FIGS. 14 and 15 is described in the following. First, multi-bank read-out operation is described. FIGS. 16A to 16C show a state of GBL-MBL connection regions CA at the time of multi-bank read-out operation, and FIG. 17 shows the waveform during operation. Here, sub-block SB1 within bank BA#0 and sub-block SB3 within bank BA#1 are accessed, and read-out of memory cell transistor MC2 in string ST that is indicated by an external address within each sub-block SB is assumed. In addition, the basic unit where m=0 is described, in order to simplify the symbols.

It is assumed that a data pattern as that show in FIGS. 16A to 16C is read out collectively to main bit lines MBL. Here, "collectively" means that read-out is carried out simultaneously in two banks BA#0 and BA#1 from memory cell transistors MC to main bit lines MBL, and means that the number of pieces of data (number of pages) to be read out in parallel increases by the number of banks, as compared to the first and second embodiments. This operation is possible for no other reason than that main bit lines MBL are placed independently for each sub-block SB.

Next, a sequence where data in main bit lines MBL that has been collectively read out is read out to global bit lines GBL and sense latch unit circuits SLU which are shared by banks BA#0 and BA#1 is described in reference FIG. 17. First, signal TRM1<1> is converted to level "H," and the data in the first half portion of a page in sub-block SB1 of bank BA#0 is read out to global bit line GBL<0>. In the method for read-out charge is redistributed between main bit line MBL and global bit line GBL in the same manner as in the second embodiment.

In response to the completion of the sensing operation in sense latch SL, signal TRM<1> becomes of level "L," and global bit line GBL<0> is once reset (this is implemented, though not shown, when signal RPC is converted to level "H" within sensor latch SL, and the node of signal FRPC becomes 0.6 V). Subsequently, signal TRM1<3> becomes of level "H," and the data in the second half of the page in sub-block SB1 of bank BA#0 is read out to global bit line GBL<1>. In the same manner, signal TRM3<1> becomes of level "H," and signal TRM3<3> becomes of level "H" sequentially, and the data in the first and second half of the page in sub-block SB3 of bank BA#1 is also read out.

Next, the effects of this multi-bank read-out are verified. In comparison with the case where data is read out from two sub-blocks SB in the second embodiment, though the time for redistribution and transfer of charge shown in FIG. 17 is the same for the two, data for two pages in total in two cell blocks SB, which is the object in the third embodiment, is simultaneously read out to main bit lines MBL in parallel, making read-out faster than in the second embodiment. That is to say, time is shortened by 0.16 pC/Icell, as can be seen from equation (4) of Tread2 of the second embodiment.

Figure 19:
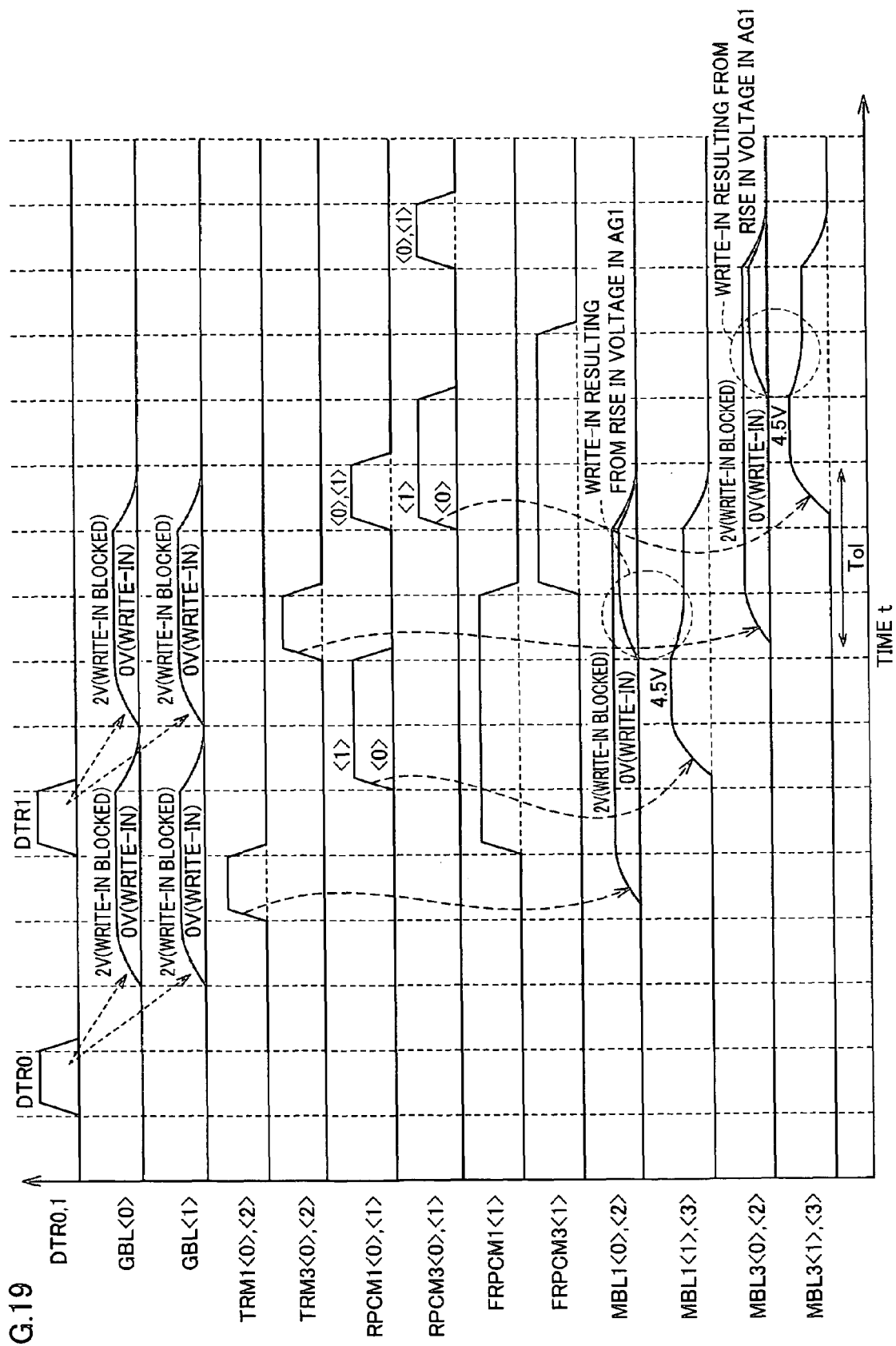
FIG. 19 is a time chart showing the write-in operation of the AG-AND flash memory shown in FIGS. 14, 15A and 15B.

Next, the multi-bank write-in operation is described. FIGS. 18A to 18C show a state of GBL-MBL connection regions CA at the time of the operation of multi-bank write-in, and FIG. 19 shows the waveform during operation. Here, sub-block SB1 within bank BA#0 and sub-block SB3 within bank BA#1 are accessed, and write-in into memory cell transistor MC2 in string ST that is designated by an external address within each sub-block SB is assumed. In addition, the basic unit where m=0 is described, in order to simplify the symbols.

First, write-in is started from sub-block SB1 of bank BA#0, and therefore, signal DTR0 is converted to level "H," and write-in mask data (whether or not write-in is carried out) is transferred to sense latch unit circuit SLU from corresponding data latch DL. In response to this, sense latch unit circuit SLU supplies 0 V to global bit lines GBL which correspond to memory cell transistors MC2, which are the object of write-in, and supplies 2 V to global bit lines GBL which correspond to memory cell transistors MC2, which are not desired to be written in. In the case of FIGS. 18A to 18C, global bit lines GBL<0> and GBL<1> carry information. Write-in data in global bit lines GBL<0> and GBL<L> is sent to inversion layer bit lines BL on the source side within strings ST through corresponding main bit lines MBL1<0> and MBL1<2> when signals TRM1<0> and TRM1<2> become of level "H." Subsequently, signal RPCM1<1> becomes of level "H," and the write-in drain voltage is sent to inversion layer bit line BL on the drain side within string ST through main bit lines MBL1<1> and MBL1<3> from the node of signal FRPCM1<1>. After that, write-in is started when assist gate AG1 becomes of level "H."

It is not necessary for the write-in of bank BA#1 into sub-block SB3 to wait for the completion of the write-in operation in sub-block SB1 of bank BA#0. As shown in FIG. 19, at the point in time when transfer of the write-in mask data to sub-block SB1 of bank BA#0 is completed, that is to say, signals TRM1<0> and TRM1<2> become of level "L," signal DTR1 may be converted to level "H," so that the write-in mask data within sense latch unit circuit SLU is updated to correspond to sub-block SB3 of bank BA#1, and is fed out to global bit line GBL from sense latch unit circuit SLU. After that, the same sequence as that for sub-block SB1 of bank BA#0 is repeated, and thereby, write-in to sub-block SB3 of bank BA#1 is started.

Figure 37:
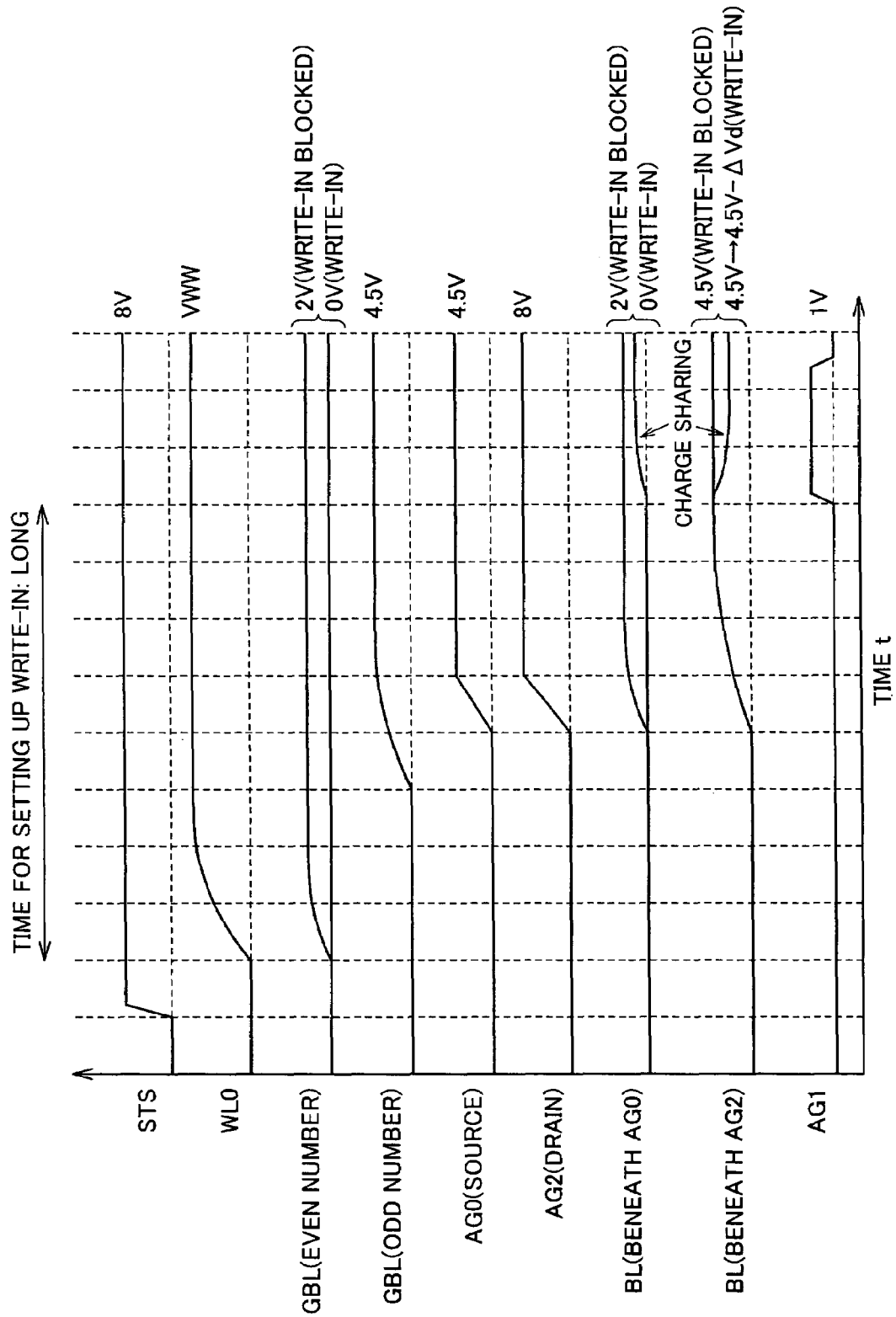
FIG. 37 is a time chart showing the write-in operation of the AG-AND flash memory shown in FIGS. 32 and 33.
Figure 38:
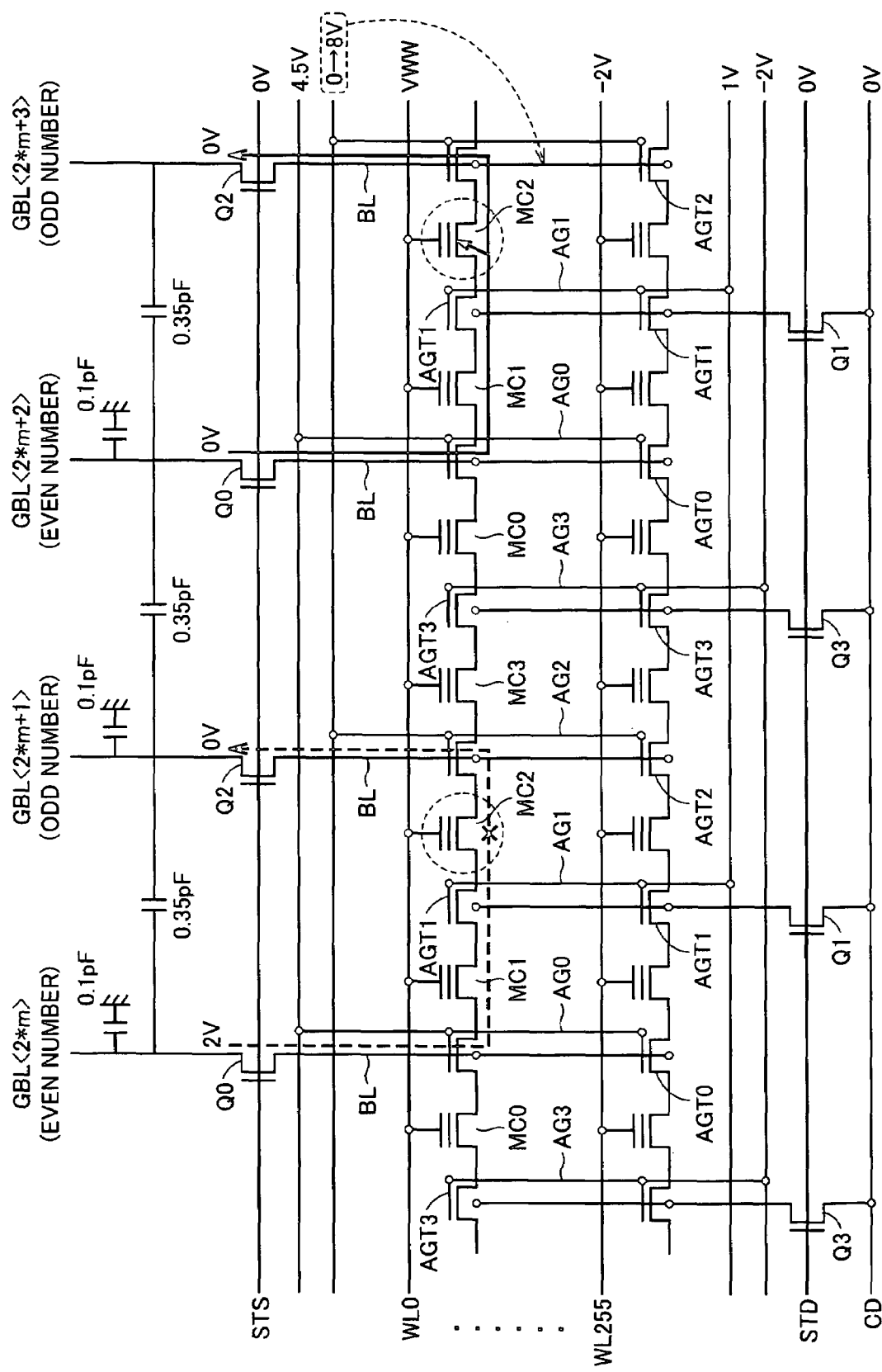
FIG. 38 is a circuit diagram showing another write-in operation of the AG-AND flash memory shown in FIGS. 32 and 33.
Figure 39:
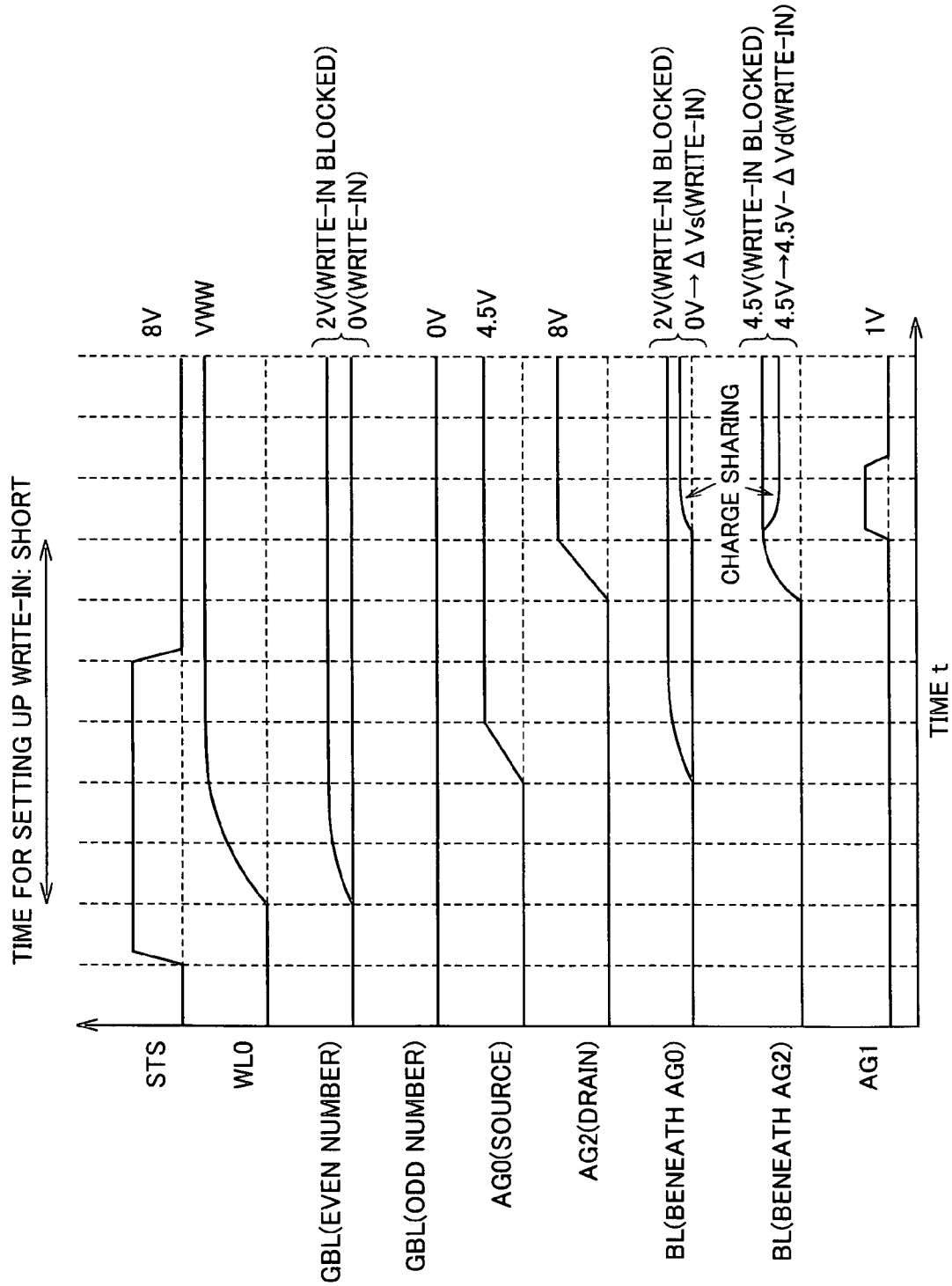
FIG. 39 is a time chart showing the write-in operation of the AG-AND flash memory shown in FIGS. 32 and 33.

Next, the effects of this multi-bank write-in are verified. In the write-in system shown in FIGS. 36 and 37 according to the conventional art, a write-in drain voltage is carried by global bit line GBL, and therefore, the next write-in cannot be started until write-in of one string ST is completed (at least assist gate AG 1 is lowered). In contrast, in the multi-bank write-in of the third embodiment, write-in operations in strings ST within different sub-blocks SB are carried out in parallel during the period shown as Tol in FIG. 19. Accordingly, in the case of write-in of two pages, the write-in time is shortened by Tol. Here, though the effects of shortening time are small in comparison with those in the completely independent two-bank configuration, the effects of reducing the area of the chip by having sense latch SL be shared between banks are great.

As described above, according to this third embodiment, in a flash memory having a layered bit line configuration where memory arrays MA are divided into a plurality of sub-blocks SB, new main bit lines MBL are allocated so as to newly correspond to respective sub-blocks SB, and main bit lines MBL are selectively connected to global bit lines GBL in an upper layer via switches, a pseudo multi-bank operation where those plurality of sub-blocks SB are simultaneously accessed, and thereby, operations which correspond to respective sub-blocks SB are carried out in parallel is possible, and read-out/write-in operation can be implemented at high speed in comparison with the configuration of a memory array according to the conventional art.

Fourth Embodiment

The layered bit line configurations shown in the first to third embodiments have the merit of being easily operable at high speed and with low power consumption in comparison with conventional configuration. Meanwhile, main bit lines MBL which are in a new bit line layer are added, and therefore, the number of wire layers that are required for bit lines increases by one. It may become necessary to add new process steps, and there is a possibility that the cost of the chips may increase. Therefore, in a fourth embodiment, a configuration where a similar merit can be enjoyed without adding a new wire layer is described.

Figure 20:
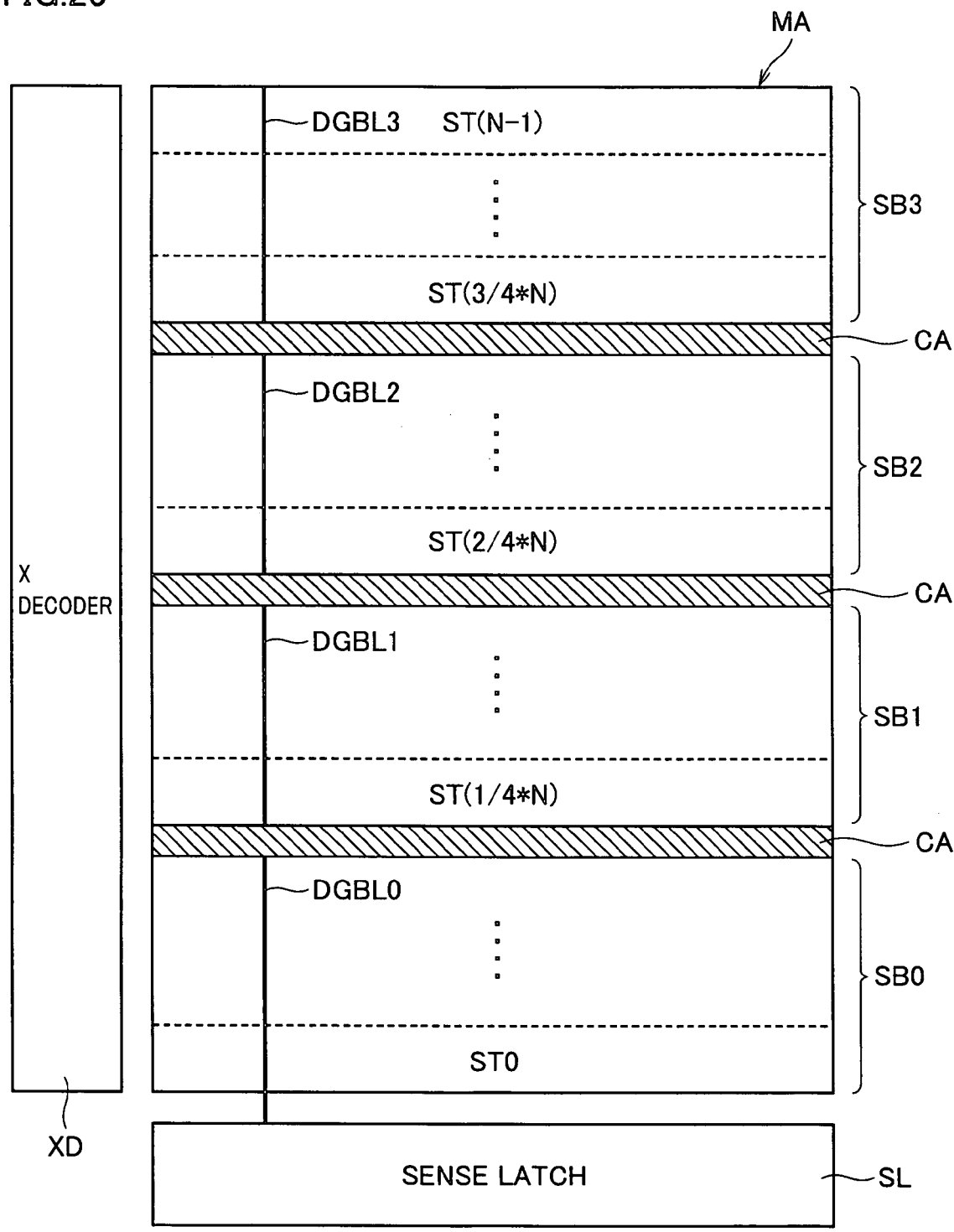
FIG. 20 is a block diagram showing a major portion of the banks of an AG-AND type flash memory according to a fourth embodiment of this invention.

FIG. 20 is a block diagram showing the configuration of a memory array MA of an AG-AND type flash memory according to the fourth embodiment of this invention. In FIG. 20, memory array MA is formed of a plurality of sub-blocks SB, and divided global bit lines DGBL which are shared by a plurality of strings ST are placed on each sub-block SB. Divided global bit lines DGBL are connected to divided global bit lines DGBL within adjacent sub-blocks SB by through DGBL connection regions CA which are placed in the borders of sub-blocks SB. Accordingly, when divided global bit lines DGBL in all of the sub-blocks SB are connected to each other via DGBL connection regions CA, the global bit lines function as one wire which corresponds to a conventional global bit line GBL. In other words, divided global bit lines DGBL are gained by dividing conventional global bit lines GBL, and DGBL connection regions CA are provided at these points of division. Therefore, it is not necessary to increase the number of wire layers.

Figure 21:
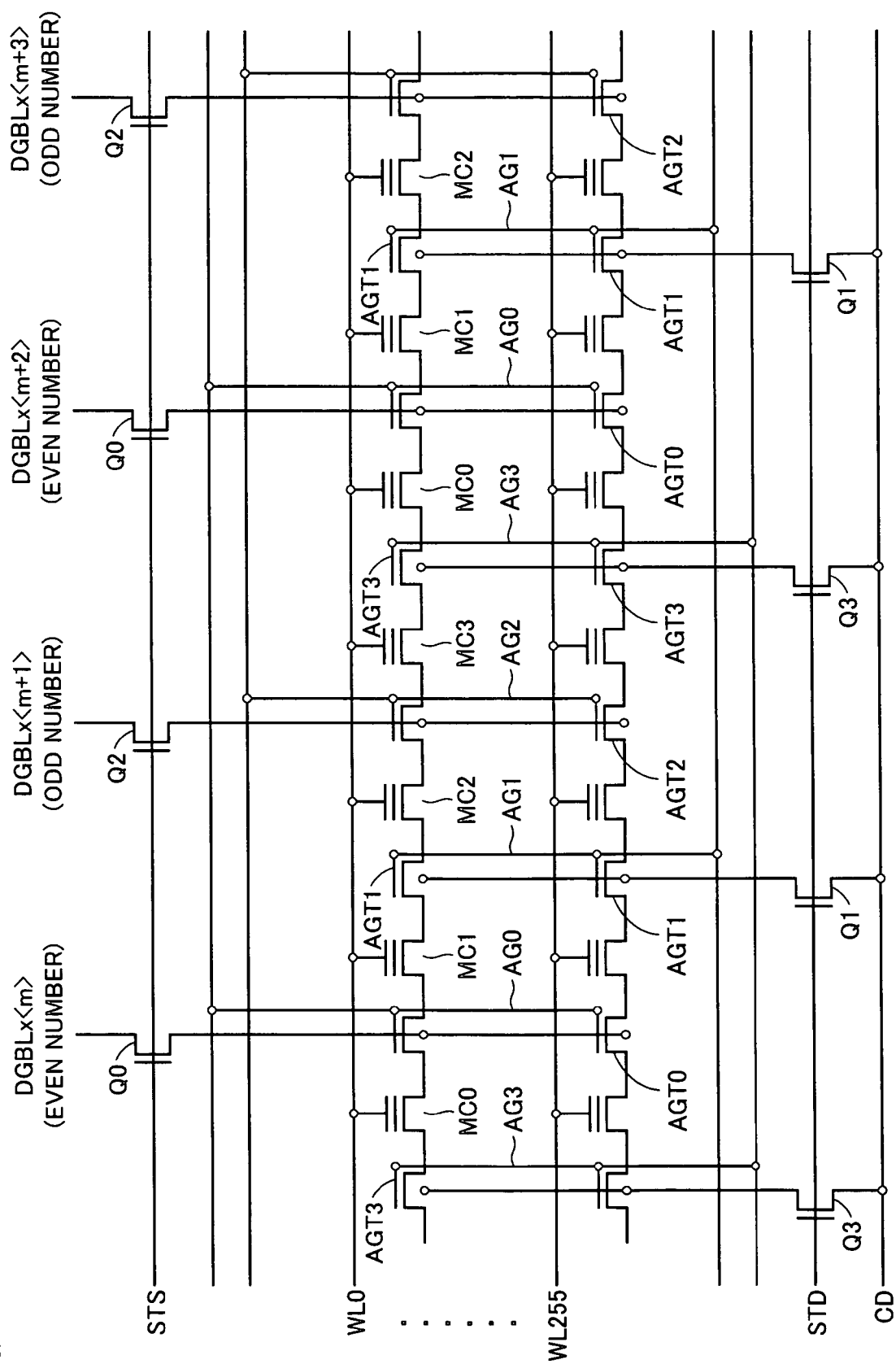
FIG. 21 is a circuit diagram showing the configuration of the strings shown in FIG. 20.

FIG. 21 is a circuit diagram showing the configuration of strings ST shown in FIG. 20. Global bit lines GBL of FIG. 33, which shows the conventional art, are replaced with divided global bit lines DGBL in FIG. 20. In addition, there is no difference in the state of the signals, not shown in: the drawings, within strings ST at the time of read-out/write-in operation between this embodiment and the conventional art.

Figure 22A:
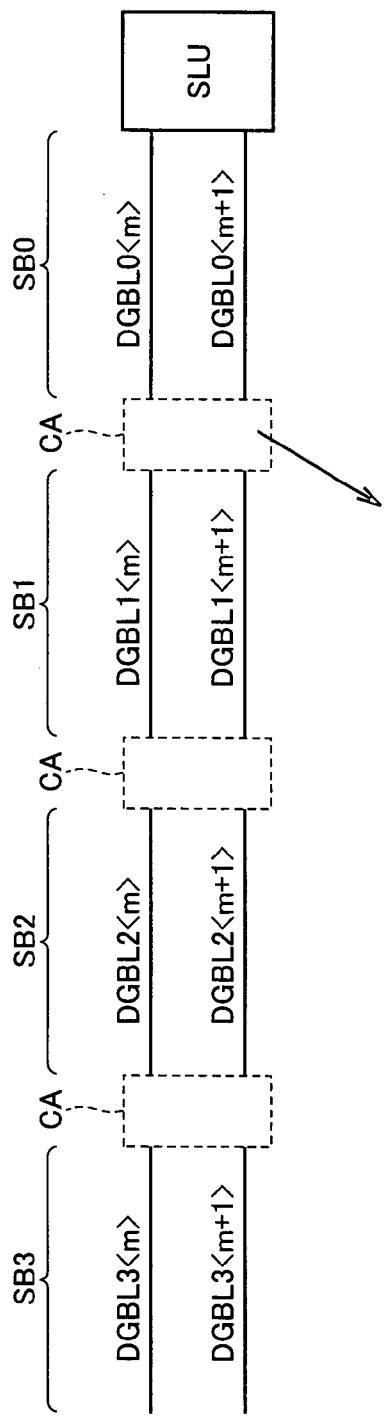
FIGS. 22A and 22B are circuit block diagrams showing the configuration of the GBL-MBL connection regions shown in FIG. 20.
Figure 22B:
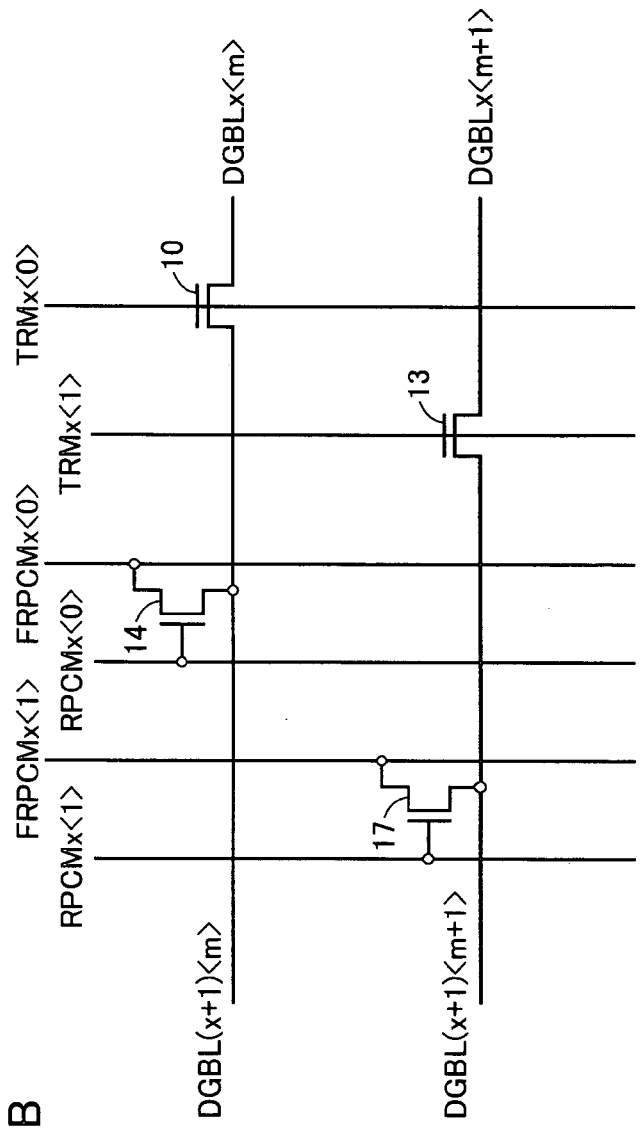

FIGS. 22A and 22B are circuit block diagrams showing the configuration of DGBL connection regions CA shown in FIG. 20. Though the configuration is similar to that in FIGS. 5A and 5B of the first embodiment, in FIGS. 5A and 5B, the minimum unit includes four main bit lines MBL, that is to say, eight inversion layer bit lines BL, while in FIGS. 22A and 22B, the minimum unit includes two divided global bit lines DGBL, that is to say, four inversion layer bit lines BL4. Thus, the number of signals TRM decreases from four to two, making the area of the layout of transistors which receive signal TRM smaller.

As described in further detail, DGBL connection regions CA have two functions. A first function is, as the name suggests, to connect divided global bit lines DGBL in two adjacent sub-blocks SB, and is implemented by N channel MOS transistors 10 and 13, of which the gate receives signal TRMx<y> (here, x is the number of sub-blocks SB, and y is 0 or 1). That is to say, transistor 10 is connected between divided global bit lines DGBLx<m> and DGBL(x+1)<m>, and the gate thereof receives signal TRMx<0>. Transistor 13 is connected between divided global bit lines DGBLx<m+1> and DGBL(x+1)<m+1>, and the gate thereof receives signal TRM<1>. When signal TRMx<0> or TRMx<1> is converted to level "H," transistor 10 or 13 is energized, and divided global bit line DGBLx<m> is connected to DGBL(x+1)<m>, or divided global bit line DGBLx<m+1> is connected to DGBL(x+1)<m+1>.

A second function of DGBL connection regions CA is a pre-charging function for supplying an appropriate voltage to divided global bit lines DGBL which are detached by transistors 10 and 13. This is implemented by N channel MOS transistors 14 and 17, of which the gate receives signal RPCMx<z>, and of which the source receives signal FRPCMx<z> (here, z is 0 or 1).

That is to say, the gate of transistor 14 receives a signal RPCMx<0>, the source thereof receives a signal FRPCMx<0>, and the drain thereof is connected to divided global bit line DGBL(x+1)<m>. The gate of transistor 17 receives a signal RPCMx<1>, the source thereof receives a signal FRPCMx<1>, and the drain thereof is connected to divided global bit line DGBL(x+1)<m+1>. When signal RPCMx<0> or RPCMx<1> is converted to level "H," transistor 14 or 17 is energized, and the voltage of signal FRPCMx<0> or FRPCMx<1> is supplied to divided global bit line DGBL(x+1)<m> or DGBL(x+1)<m+1>. Here, in FIGS. 22A and 22B, though one pre-charging transistor (for example, 14) is provided per divided global bit line DGBL, a plurality of pre-charging transistors may be provided per divided global bit line DGBL.

Figure 23:
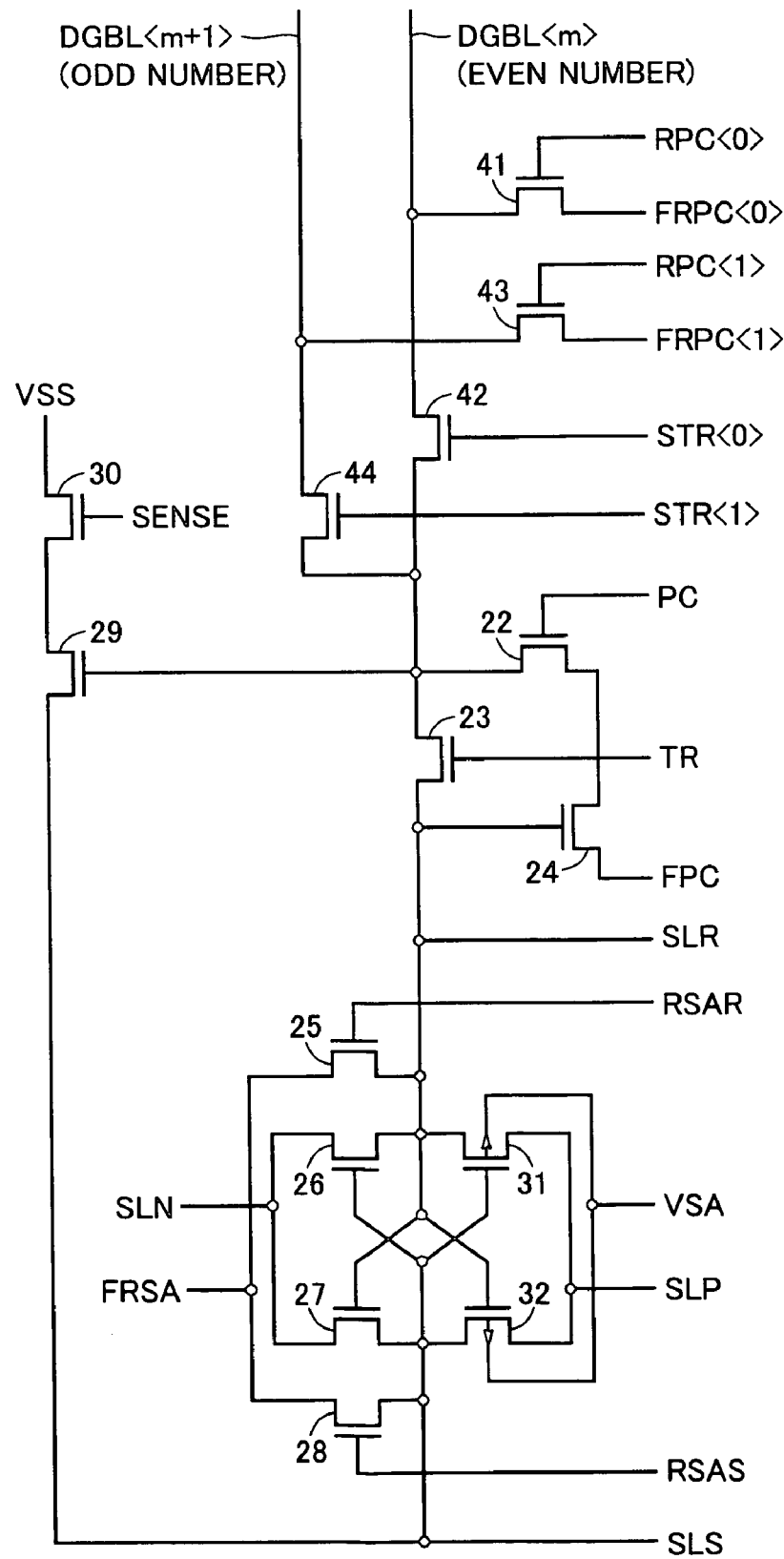
FIG. 23 is a circuit diagram showing the configuration of the sense latch unit circuit shown in FIGS. 22A and 22B.

Sense latch SL includes a sense latch unit circuit SLU which is provided so as to correspond to every two divided global bit lines DGBLx<m> and DGBLx<m+1>. FIG. 23 is a circuit diagram showing the configuration of the sense latch unit circuits SLU which are shown in FIGS. 22A and 22B. Sense latch unit circuit SLU of FIG. 23 is different from the sense latch unit circuit of FIG. 6 in that N channel MOS transistors 20 and 21 which are provided so as to correspond to global bit line GBL<m> are replaced with N channel MOS transistors 41 and 42 which are provided so as to correspond to divided global bit lines DGBL<m> and N channel MOS transistors 43 and 44 which are provided so as to correspond to divided global bit line DGBL<m+1>.

Figure 24:
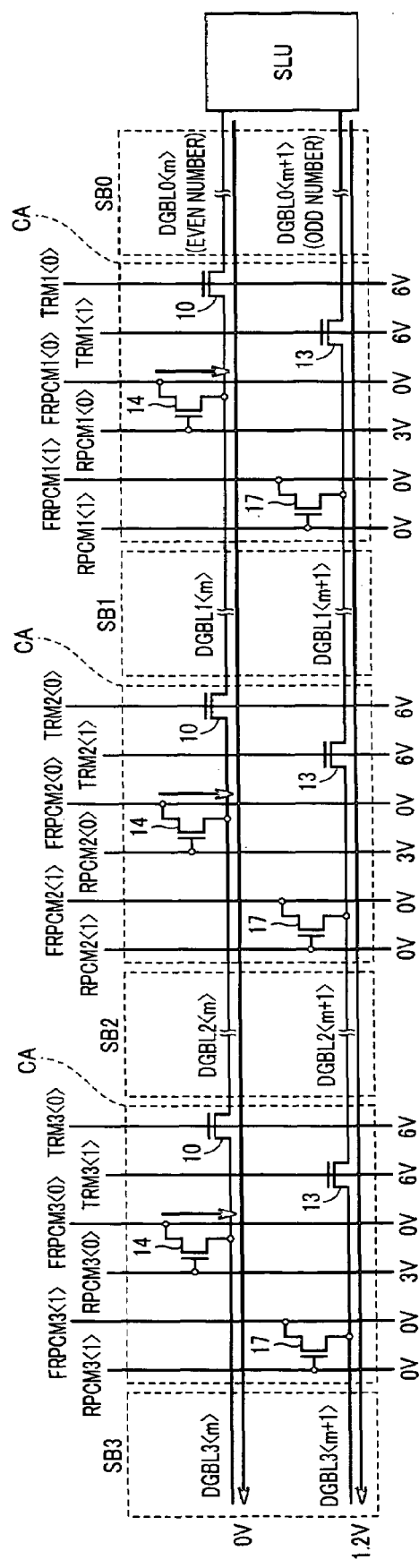
FIG. 24 is a circuit diagram showing the read-out operation of the AG-AND flash memory shown in FIGS. 20 to 23.

Next, read-out operation of this AG-AND type flash memory is described in reference to FIG. 24. Here, it is assumed that memory cell transistor MC2 in an appropriate string ST within sub-block SB3 is accessed. Accordingly, a divided global bit line DGBL3<m> is made to function as a shield, and a divided global bit line DGBL3<m+1> is located on the drain side. Signals TRMz<0> and TRMz<1>(z=0, 1, 2, 3) in all DGBL connection regions CA are converted to level "H," and four divided global bit lines DGBL are all connected to each other so as to correspond to a conventional global bit line GBL. In a divided global bit line DGBL which becomes a shield, signal RPCMz<0> is converted to level "H" in each DGBL connection region CA, and the node of signal FRPCMz<0> becomes of grounding voltage GND and is fixed at 0 V. Meanwhile, divided global bit line DGBL on the drain side is pre-charged to 1.2 V from sense latch unit circuit SLU, and after that, signal STD is converted to level "H," and the data of the memory cell transistor is read out.

In addition, the multi-bank operation shown in FIGS. 16A to 16C and 17 can be carried out in this AG-AND type flash memory. That is to say, only signal TRM2<1> is converted to level "L" from the state of FIG. 24, so that divided global bit lines DGBL0<m+1> and DGBL1<m+1> are separated from divided global bit lines DGBL2<m+1> and DGBL3<m+1>, and first, the data of memory cell transistor MC within sub-block SB1 is read out to divided global bit lines DGBL0<m+1> and DGBL1<m+1>, so as to be detected and amplified by the sense latch circuit. Next, signal TRM2<1> is converted to level "H," so that divided global bit lines DGBL0<m+1> to DGBL3<m+1> are pre-charged to 1.2 V, and after that, the data of memory cell transistor MC within sub-block SB3 is read out to divided global bit lines DGBL0<m+1> to DGBL3<m+1> so as to be detected and amplified by the sense latch circuit. In this multi-bank operation, the connection units of the divided global bit lines change in accordance with the selected sub-block, and thereby, increase in the speed of read-out can be achieved. That is to say, the load of the divided global bit lines at the time of read-out in sub-block SB1 is approximately ½ of at the time of read-out in sub-block SB3, and the time for read-out becomes approximately ½, and therefore, operation at a speed that is higher than that the multi-bank operation that is similarly carried out in a conventional configuration can be expected.

Figure 25:
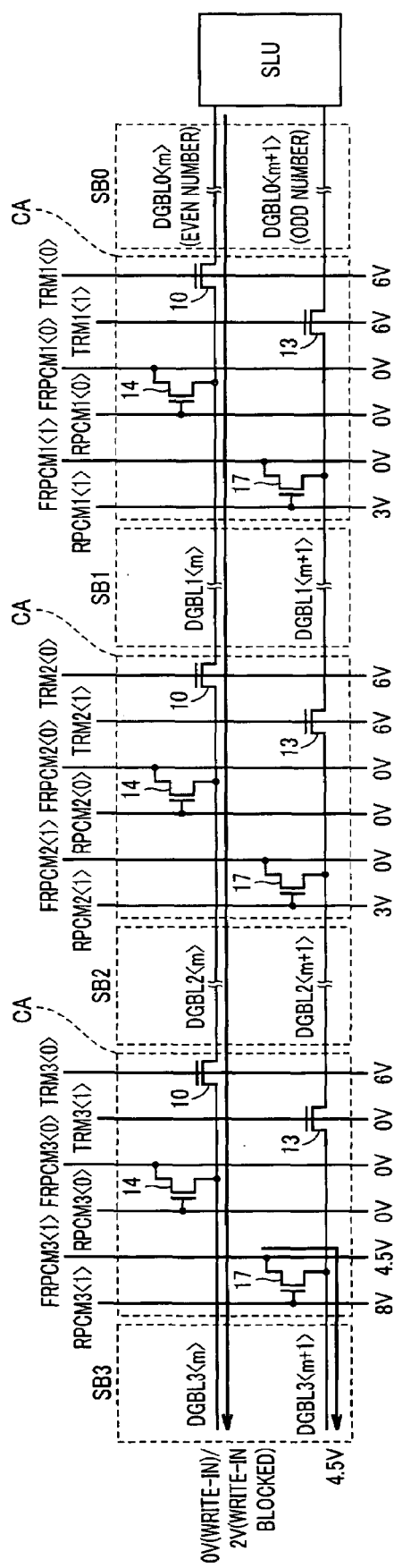
FIG. 25 is a circuit diagram showing the write-in operation of the AG-AND flash memory shown in FIGS. 20 to 23.

Next, write-in operation of this AG-AND type flash memory is described in reference to FIG. 25. Here, it is assumed that memory cell transistor MC2 in an appropriate string ST within sub-block SB3 is accessed. In this case, divided global bit linen DGBL3<m> is located on the source side, and divided global bit line DGBL3<m+1> is located on the drain side. Write-in mask data is transferred from sense latch unit circuit SLU to divided global bit line DGBL on the source side, and therefore, signal TRMz<0> becomes of level "H" in all DGBL connection regions CA. Meanwhile, only divided global bit line DGBL3 from divided global bit lines DGBL on the drain side is charged, and therefore, signal TRM3<1> is converted to level "L" so as to be independent from other DGBL3<m+1>. After that, signal TRM3<0> is converted from 6 V to 0 V, in such a manner that only DGBL3<m> is selected from divided global bit lines DGBL on the source side, and thus, charge sharing write-in is carried out.

In addition, the multi-bank write-in shown in FIGS. 18A to 18C and 19 can be carried out also on this AG-AND gate type flash memory. That is to say, signals TRM2<0>, TRM2<1> and TRM1<1> are converted from the state in FIG. 25 to level "L," so that divided global bit lines DGBL0<m+1> and DGBL3<m+1> are separated from each other and only divided global bit lines DGBL0<m> and DGBL1<m> are connected to sense latch unit circuit SLU. Next, 0 V or 2 V is supplied to divided global bit lines DGBL0<m> and DGBL1<m>, depending on whether or not write-in of data is carried out, and after that, signal TRM1<0> is converted to level "L," so that divided global bit lines DGBL0<m> and DGBL1<m> are separated from each other. Next, signal RPCM1<1> is raised to 8 V for a predetermined period of time, and signal FRPCM1<1> is converted to 4.5 V, so that divided global bit lines DGBL1<m+1> is charged to 4.5 V, and after that, charge sharing write-in is carried out between divided global bit lines DGBL1<m> and DGBL1<m+1>. Here, in this multi-bank write-in, write-in is carried out simultaneously on sub-block SB2, in addition to sub-block SB1.

As described above, in this fourth embodiment, memory array MA is divided into a plurality of sub-blocks SB, divided global bit lines DGBL are newly allocated so as to correspond to respective sub-blocks SB, and a bit line configuration where divided global bit lines DGBL are selectively connected to divided global bit lines DGBL in adjacent sub-blocks SB via switches is provided, and therefore, it is possible to achieve both a higher level of controllability for write-in and lower power consumption than in the conventional art without increasing the number of wire layers. In addition, it is possible to carry out a pseudo-multi-bank operation through appropriate switching control.

Fifth Embodiment

Global bit lines GBL in the conventional art and the first to third embodiments, as well as divided global bit lines DGBL in the fourth embodiment, function as data buses having a single end at the time of read-out. In addition, in order to suppress coupling noise between global bit lines GBL or between divided global bit lines DGBL which become data buses, global bit lines GBL or divided global bit lines DGBL which become a shield and are fixed at 0 V run between global bit lines GBL or between divided global bit lines DGBL. That is to say, wires, of which the number is two times greater than the number of bits of data for one page are used, in order to read out the data to sense latch SL. In addition, with reference to sense latch unit circuit SLU shown in FIG. 23, the voltage of the data bus enters into the gate of transistor 29. That is to say, the voltage of the data bus must swing up to approximately the same as the threshold voltage of transistor 29, and becomes voltage for read-out having relatively large amplitude. This is disadvantageous, from the point of view of the time for read-out.

Therefore, in a fifth embodiment, complementary buses are used, so that two global bit lines GBL or divided global bit lines DGBL are used to read out data from one memory cell transistor MC, and thereby, the voltage with a small amplitude which does not depend on the threshold voltage of transistor 29 is read out.

Figure 26:
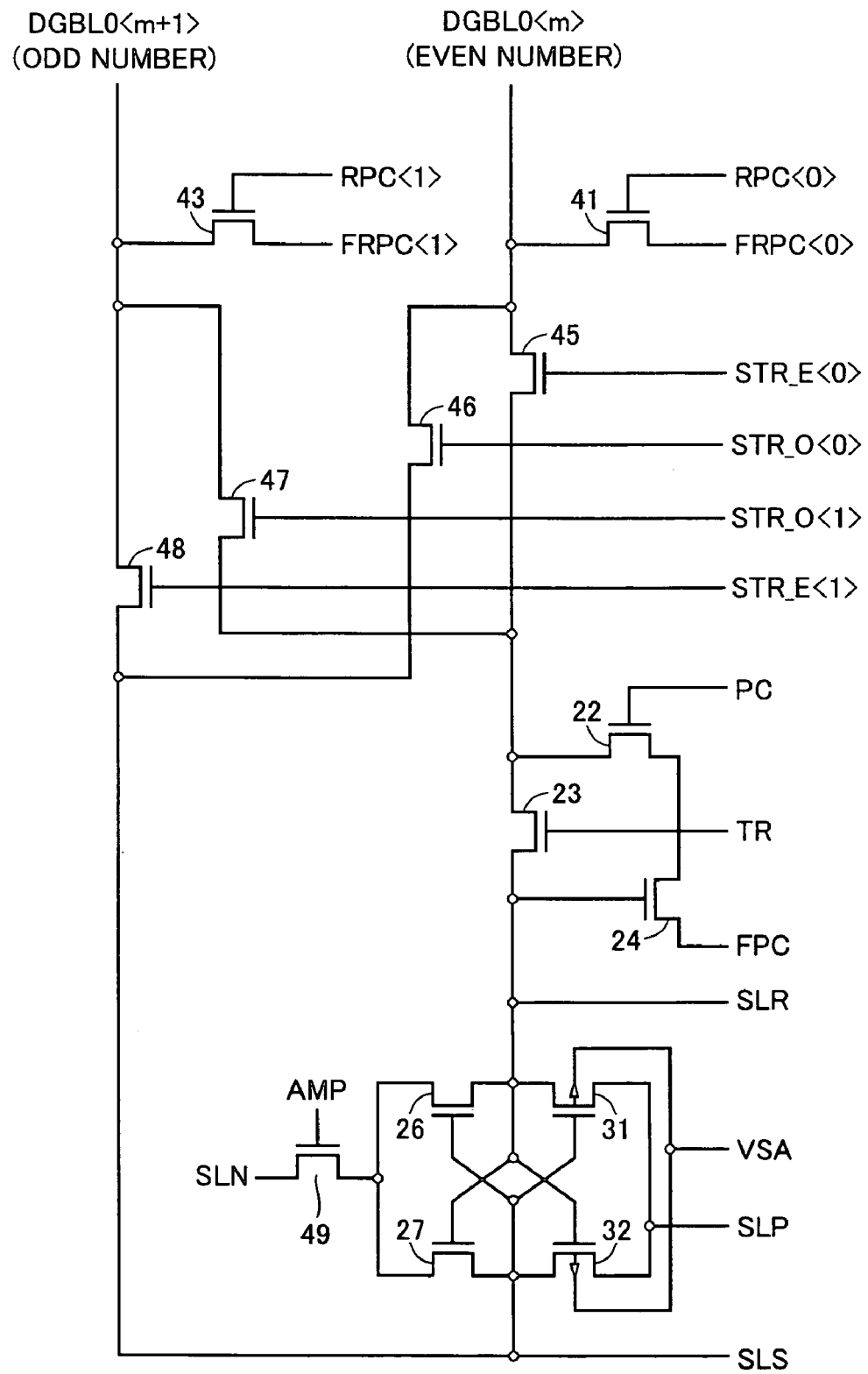
FIG. 26 is a circuit diagram showing the configuration of the sense latch unit circuits of an AG-AND type flash memory according to a fifth embodiment of this invention.

FIG. 26 is a circuit diagram showing the configuration of sense latch unit circuits SLU of an AG-AND type flash memory according to the fifth embodiment of this invention, and is a diagram for comparison with FIG. 23. This can be applied to the conventional art and the first to third embodiments as it is in the case where divided global bit lines DGBL are replaced with global bit lines GBL. This is different from the circuit of FIG. 23 in that there are no transistors 29 that receive the voltage of divided global bit lines DGBL, transistors 30 that are connected to transistors 29 in series, or transistors 25 or 28 for setting the initial value of the input/output node of the cross-coupling type sense amplifier.

Meanwhile, instead of transistors 42 and 44, path switching N channel MOS transistors 45 to 48 which are controlled by signals STR_E<0>, STR_E<1>, STR_O<0> and STR_O<1> are added, in order to change the relationship between divided global bit lines DGBL, which are paired, and two input/output nodes SLS and SLR of the cross-coupling type sense amplifier. This is because the output voltage of sense latch unit circuits SLU can share the same polarity, whichever divided global bit lines DGBL, those on the even number side or those on the odd number side, become the drains at the time of read-out, and write-in mask data can be transferred from sense latch unit circuits SLU, whichever divided global bit lines DGBL, those on the even number side or those on the odd number side, become the sources at the time of write-in. In addition, an N channel MOS transistor 49 for controlling the sense amplifier is added. That gate of N channel MOS transistor 49 receives a signal AMP, the drain receives a signal SLN, and the source is connected to the drains of N channel MOS transistors 26 and 27.

Figure 27:
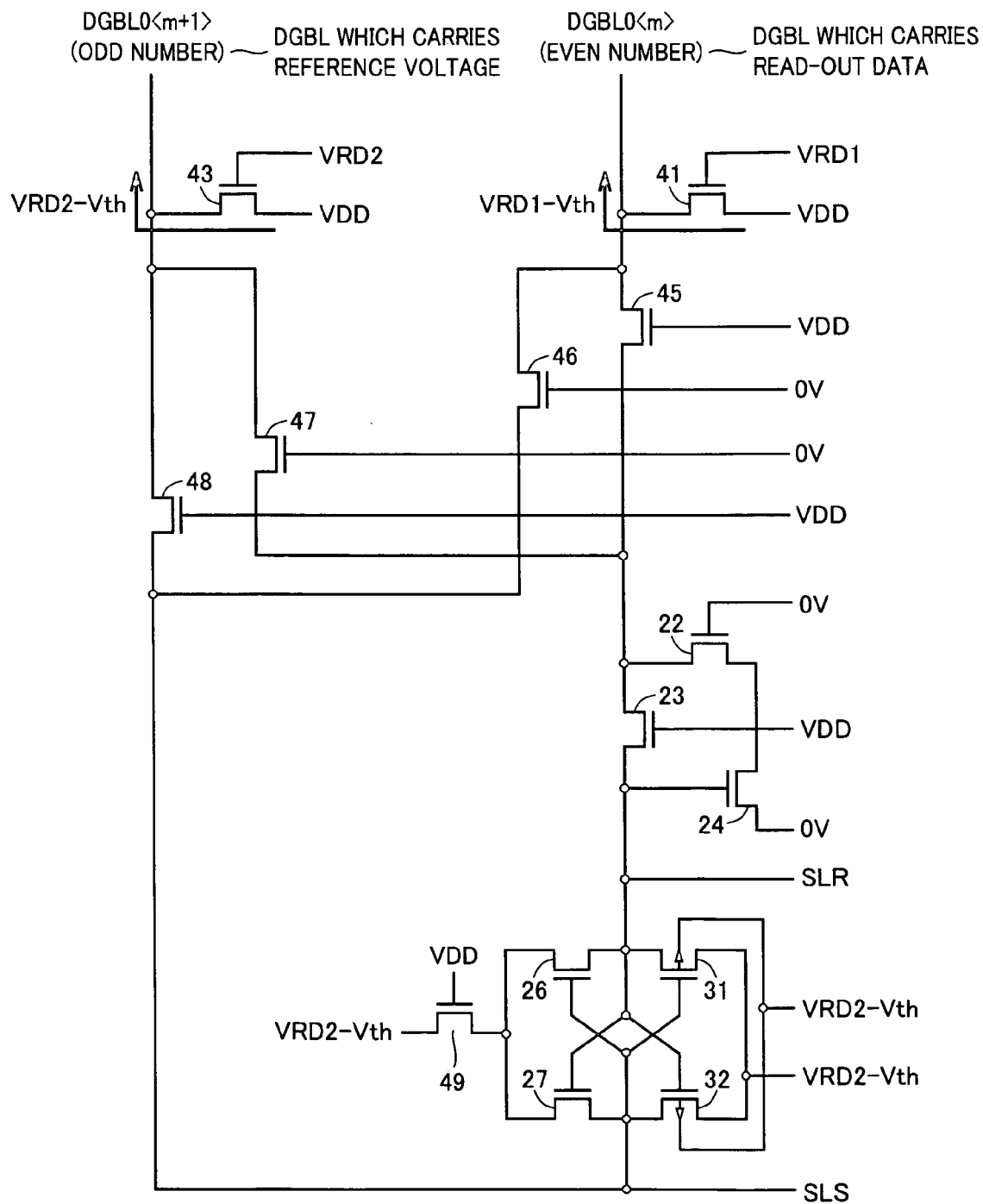
FIG. 27 is a circuit diagram showing the read-out operation of the AG-AND flash memory shown in FIG. 26.

Subsequently, read-out operation in sense latch unit circuit SLU of FIG. 26 is described. FIG. 27 shows a state of divided global bit lines DGBL at the time of pre-charging. According to the conventional art, divided global bit lines DGBL on the drain side are charged to 1.2 V, and remaining divided global bit lines DGBL are supplied with 0 V through a direct current, so as to become a shield. In FIG. 27, however, voltage VRD1 and VRD2 are supplied to the nodes of signals RPC<0> and RPC<1>, respectively, and an appropriate power supply voltage VDD is supplied to the nodes of signals FRPC<0> and FRPC<1>, and thereby, even number divided global bit lines DGBL on the drain side (on the side where read-out data is transferred from memory cell transistors MC) are charged to VRD1-Vth, and odd number divided global bit lines DGBL, which are paired with even number divided global bit lines DGBL, are charged to VRD2-Vth, which becomes the reference voltage.

The relationship between VRD1 and VRD2 is VRD1>VRD2, and the difference between the two is set so as to secure a sufficient margin for the sensitivity of the sense amplifier made of transistors 26, 27, 31 and 32. Path switching transistors 45 to 48 are turned on/off in an arbitrary combination, and in the case of FIG. 27, divided global bit lines DGBL<m> on the even number side are connected to node SLR, while divided global bit lines DGBL<m+1> on the odd number side are connected to node SLS. That is to say, node SLR is preset to VRD1-Vth, and node SLS is preset to VRD2-Vth. Transistor 49 is turned on, and all the power supplies of sense amplifiers become VRD2-Vth, making the sense amplifiers of an inactivated state.

Figure 28:
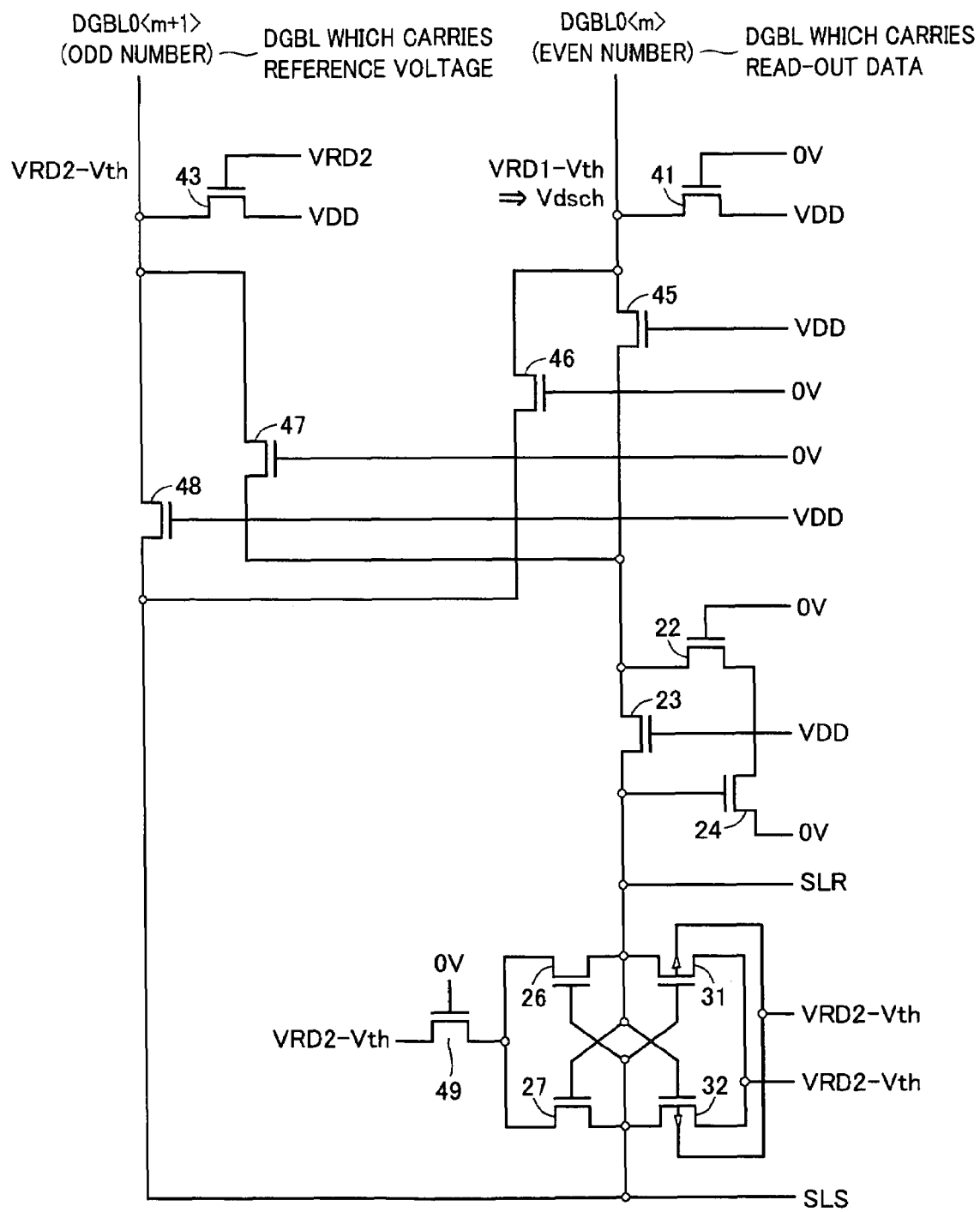
FIG. 28 is another circuit diagram showing the read-out operation of the AG-AND flash memory shown in FIG. 26.

Next, FIG. 28 shows a state where divided global bit lines DGBL are being: discharged in accordance with the threshold voltage of memory cell transistor MC2 after signal STD has become of level "H" in string ST which is the object for read-out. At this time, the node of signal RPC<0> is converted to 0 V and transistor 41 is turned off, while signal AMP is converted to 0 V and transistor 49 is turned off. If it is assumed that VRW>VTHC, the voltage of divided global bit lines DGBL<m> on the even number side gradually lowers to Vdsch after a certain period of time has passed. The period of time for Vdsch to increase enough to sufficiently satisfy the condition Vdsch<VRD2-Vth and the difference VRD2-Vth-Vdsch between the two is sufficiently great relative to the sensitivity of the sense amplifier becomes the time for discharging divided global bit lines DGBL.

Figure 29:
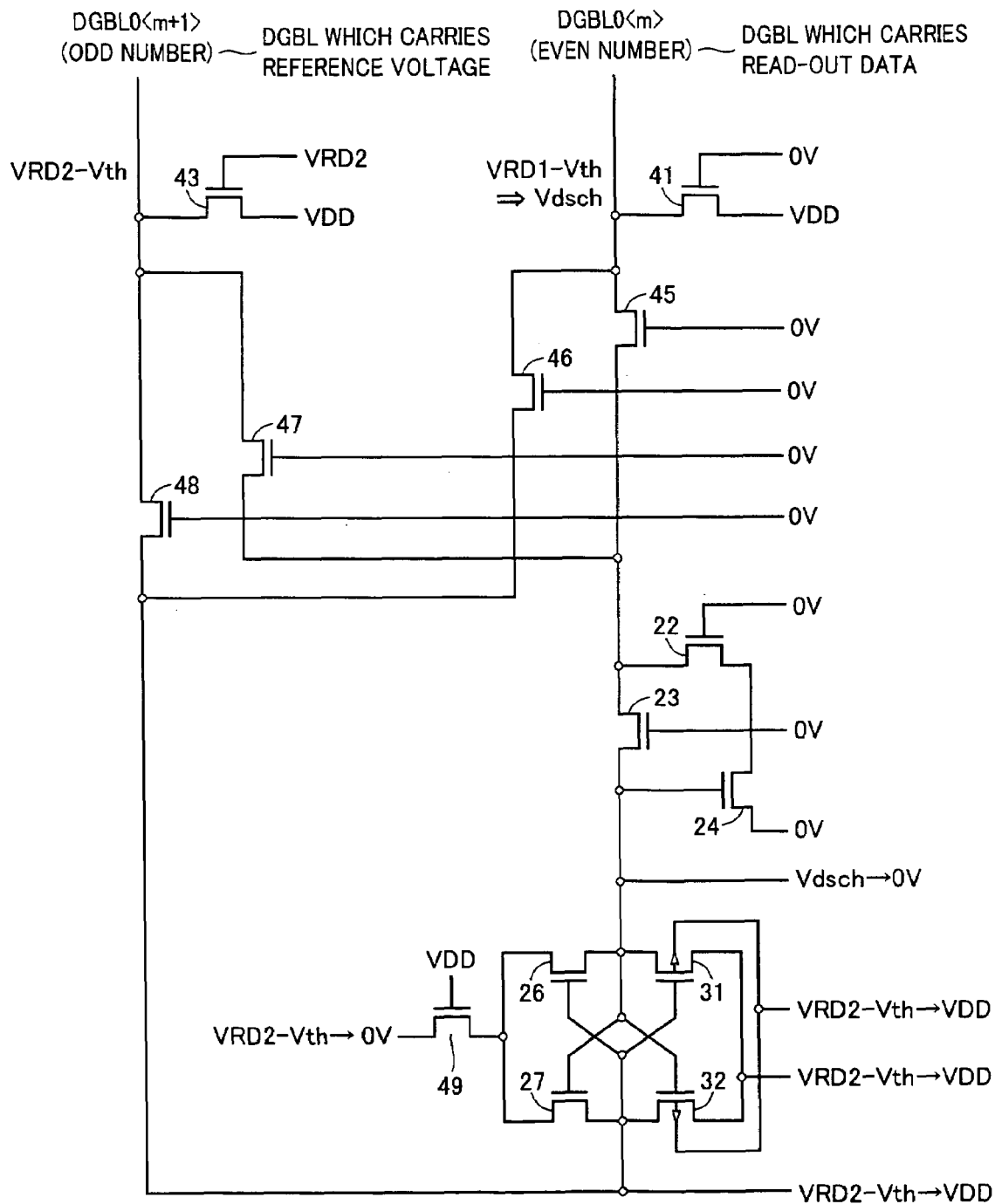
FIG. 29 is still another circuit diagram showing the read-out operation of the AG-AND flash memory shown in FIG. 26.

Finally, FIG. 29 shows the state at the time of sensing. After divided global bit lines DGBL have sufficiently swung, so that the above described conditions are satisfied, signals STR_E<0>, STR_E<1>, STR_O<0> and STR_O<1> all become of level "L," and transistors 45 to 48 are turned off, so that divided global bit lines DGBL<m> and DGBL<m+1> are separated from the sense amplifier. At this time, node SLR is at Vdsch and node SLS is at VRD2-Vth, and this difference in the potential amplified by the sense amplifier when signals SLP, VSA and AMP are transferred to VDD, and signal SLD is transferred to 0 V.

According to the conventional art, the voltage amplitude of global bit lines GBL is 0.55 V. It is possible, however, to make the sensitivity of the cross-coupling type sense amplifier no higher than 0.1 V by paying attention to the selected size and the layout of transistors 26, 27, 31 and 32 which form the sense amplifier, and therefore, it is possible to read out with a voltage amplitude of 0.3 V in the case where VRD1-VRD2=Vdsch-(VRD2-Vth)=0.15 V is set. That is to say, the voltage amplitude becomes approximately half of that in the conventional art, and increase in the speed of read-out is achieved.

Figure 30:
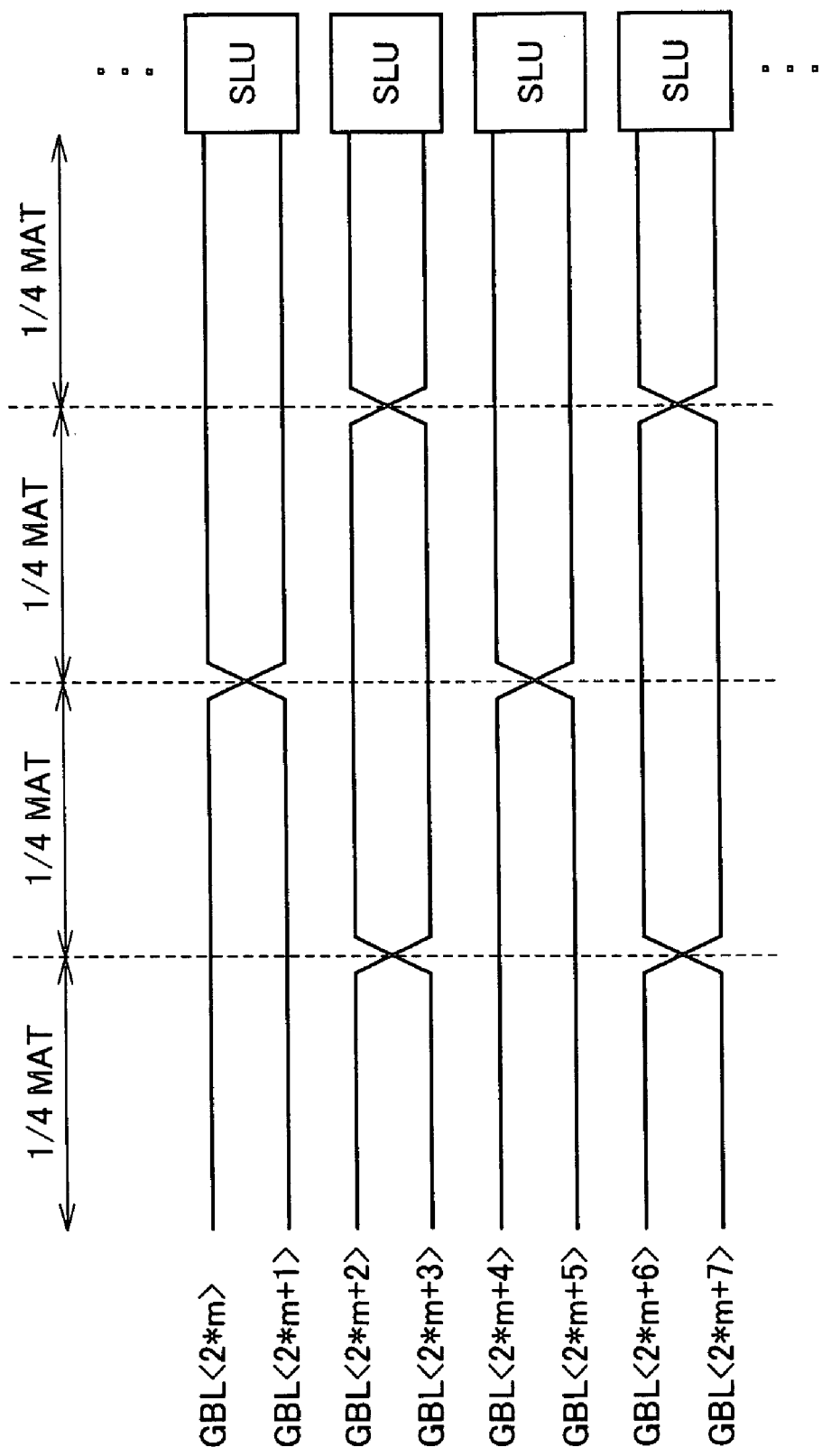
FIG. 30 is a block diagram showing a modification of the fifth embodiment.

Here, new measures against coupling noise between global bit lines GBL or between divided global bit lines DGBL become necessary as read-out becomes complementary. In particular, the voltage of global bit lines GBL which carry reference voltage VRD2-Vth is temporarily fixed by a transistor, and the amount of received noise changes, depending on the data pattern that is read out to another adjacent global bit line GBL. Therefore, in the case where a system where read-out is complementary is applied to the conventional art and the first to third embodiments, it is possible to adopt a configuration of twisted global bit lines GBL, as shown in FIG. 30.

That is to say, two adjacent global bit lines GBL<2*m> and GBL<2*m+1> are twisted at point ½ of length MAT of memory array MA. Global bit lines GBL<2*m+2> and GBL<2*m+3> are twisted at point ¼ of length MAT of memory array MA and twisted again at point ¾ of length MAT of memory array MA. Global bit lines GBL<2*m+4> and GBL<2*m+5> are twisted at point ½ of length MAT of memory array MA. Global bit lines GBL<2*m+6> and GBL<2*m+7> are twisted at point ¼ of length MAT of memory array MA and twisted again at point ¾ of length MAT of memory array MA. This is the same in the following. As a result, global bit lines GBL which are paired receive an equal amount of noise from the surroundings, and therefore, noise is effectively cancelled on the basis of the difference in potential between the two.

In addition, in the case where a system where read-out is complementary is applied to the fourth embodiment, as shown in FIGS. 31A to 31C, divided global bit lines DGBL are twisted in DGBL connection regions CA, and thereby, it is possible to suppress increase in the area by introducing twisting. FIGS. 31A to 31C show sixteen divided global bit lines DGBLx<y> which form adjacent sets of four global bit lines GBL<2*m> to GBL<2*m+3>. Here, x indicates the number of sub-blocks SB and y indicates the number of global bit lines. Global bit lines GBL<2*m>, made of divided global bit lines DGBL0<2*m> to DGBL3<2*m> and global bit lines <2*m>, made of divided global bit lines DGBL0<2*m+1> to DGBL3<2*m+1>, are twisted at two DGBL connection regions CA between sub-blocks SB0 and SB1, as well as between SB2 and SB3.

In addition, global bit lines <2*m+2>, made of divided global bit lines DGBL0<2*m+2> to DGBL3<2*m+2> and global bit lines <2*m+3>, made of divided global bit lines DGBL0<2*m+3> to DGBL3<2*m+3>, are twisted at DGBL connection regions CA between sub-blocks SB1 and SB2.

As described above, in this fifth embodiment, it is possible to make bit lines of a single end type complementary without increasing the number of wires in a flash memory, and the voltage amplitude of global bit lines GBL at the time of read-out is kept small, and thereby, read-out of data from memory cell transistor MC to sense latch SL can be increased in speed. In addition, it is also possible to develop the configuration into the configuration of divided global bit lines DGBL of the fourth embodiment, and at this time, twisted regions and DGBL connection regions CA can be made to coincide with each other, and thereby, increase in the area can be suppressed.

Here, though in the above described first to fifth embodiments, memory cell transistors MC having a floating gate are used, MONOS type memory cell transistors having no floating gates may also be used.

In addition, though in the above described first to fifth embodiments, all bit lines BL within strings ST are formed of inversion layers beneath assist gates AG, the configuration is not limited to this. For example bit lines may be only partially formed of inversion layers beneath assist gates AG, or all of the bit lines may be formed of diffusion layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:
   a memory array portion, wherein
   said memory array portion is formed of a plurality of sub-blocks,
   each sub block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line,
   said memory array portion further has a plurality of main bit lines which are provided for each sub-block, and a plurality of global bit lines which are provided so as to be shared by said plurality of sub-blocks,
   each main bit line can be selectively connected to one local bit line within a corresponding sub-block,
   each global bit line can be selectively connected to one main bit line from among a plurality of corresponding main bit lines, and
   a voltage controlling circuit for controlling the voltage of each main bit line independently of the voltage of the global bit line is further provided.

2. The nonvolatile semiconductor memory device according to claim 1, wherein some main bit lines from among all of the main bit lines within a selected sub-block are connected to the global bit lines, and the voltage of the remaining main bit lines is controlled by said voltage controlling circuit.

3. The nonvolatile semiconductor memory device according to claim 2, wherein
   each of the main bit lines within a selected sub block is selectively connected to a corresponding local bit line at the time of write-in, and
   furthermore, each of the main bit lines in a first group is connected to a global bit line, so that write-in selecting information which is provided from the outside of said memory array portion is conveyed to a corresponding local bit line, and the voltage that is supplied to each of the main bit lines in a second group from said voltage controlling circuit is conveyed to a corresponding local bit line.

4. The nonvolatile semiconductor memory device according to claim 2, wherein
   each of the main bit lines in a first group within a selected sub-block is selectively connected to a corresponding local bit line, and receives a read-out voltage which corresponds to the information that is stored in a memory cell at the time of read-out, and
   furthermore, these main bit lines are divided into a plurality of sub-groups, and are sequentially connected to the global bit line sub-group by sub-group, and thereby, said read-out voltage is conveyed to the outside of said memory array portion, and the main bit lines in a second group are fixed at the voltage which is supplied from said voltage controlling circuit.

5. The nonvolatile semiconductor memory device according to claim 4, wherein
   main bit lines in a first group within a selected sub-block which are selectively connected to local bit lines, and global bit lines to which these are selectively connected are pre-charged to different voltages prior to the read-out of information that is stored in a memory cell, and furthermore, information that is stored in memory cells is once read out via local bit lines to main bit lines in said first group which are selectively connected to these.

6. The nonvolatile semiconductor memory device according to claim 5, wherein
   pre-charging of the main bit lines in a first group within a selected sub-block which are selectively connected to local bit lines at the time of read-out is carried out by said voltage controlling circuit in a state where these are not connected to corresponding global bit lines.

7. The nonvolatile semiconductor memory device according to claim 2, wherein
   said memory array portion is divided into a plurality of banks, each of which is formed of one or more sub-blocks,
   said plurality of banks share said plurality of global bit lines, and
   arbitrary banks are sequentially selected from among said plurality of banks, and some main bit lines within a selected sub-block within each bank are sequentially connected/disconnected to/from said plurality of global bit lines in sync with said selection of the banks.

8. The nonvolatile semiconductor memory device according to claim 7, wherein
   at the time of write-in, some main bit lines within each of the selected banks are supplied with write-in information via the global bit lines while connected to the global bit line,
   a write-in circuit for supplying said write-in information is connected to the global bit lines, and
   a data holding circuit for supplying write-in information for each bank is provided in said write-in circuit.

9. The nonvolatile semiconductor memory device according to claim 7, wherein, at the time of read-out, some main bit lines within each of the selected banks carry read-out data simultaneously with each other from memory cells, and are sequentially connected to the global bit lines, so that the data is sent to a read-out circuit that is connected to the global bit lines.

10. The nonvolatile semiconductor memory device according to claim 9, characterized in that the pre-charging level is different between a main bit line for reading out data from a memory cell and a global bit line at the time of read-out.

11. The nonvolatile semiconductor memory device according to claim 1, wherein
    each sub-block further has an assist gate transistor which is placed in the direction crossing said plurality of word lines and has a channel length which is approximately the same as that of the local bit lines, and
    an appropriate voltage is supplied to the gate of said assist gate transistor, so that an inversion layer which is formed beneath the gate is used as part or the entirety of a local bit line.

12. The nonvolatile semiconductor memory device according to claim 11, wherein a predetermined voltage is supplied to the assist gate which is adjacent to the source side of a memory cell which is the object of write-in, so that a weak inversion layer is formed beneath said assist gate and channel hot electrons which are generated at an end of said weak inversion layer are injected into a floating gate of said memory cell.

13. The nonvolatile semiconductor memory device according to claim 12, wherein write-in is carried out on a memory cell using a constant charge that is determined by the capacitance of a local bit line, the capacitance of a main bit line or the capacitance of a global bit line.

14. The nonvolatile semiconductor memory device according to claim 1, wherein
one global bit line can be selectively connected to two main bit lines, and
one main bit line can be connected to one local bit line.

15. The nonvolatile semiconductor memory device according to claim 1, wherein
each sub-block is formed of a plurality of strings,
each string is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line, and
each main bit line is shared by all the strings within a corresponding sub-block and can be selectively connected to one local bit line within one string.

16. A nonvolatile semiconductor memory device, comprising:
a memory array portion, wherein
said memory array portion is formed of a plurality of sub-blocks,
each sub-block is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line,
said memory array portion further has a plurality of main bit lines which are provided for each sub-block and a plurality of global bit lines which are provided so as to be shared in each sub-block,
each main bit line can be selectively connected to one local bit line within a corresponding sub-block,
one of two adjacent global bit lines is selectively connected to one main bit line from among a plurality of corresponding main bit lines at the time of read-out,
one of said two adjacent global bit lines is pre-charged to a first voltage, and the other global bit line is pre-charged to a second voltage that is different from the first voltage prior to the read-out of data from a memory cell, and
a read-out controlling circuit for reading out memory cell data by comparing the voltage of one of said two adjacent global bit lines to the second voltage of the other global bit line after a certain period of time has passed after the start of read-out from a memory cell, and after this voltage is changed in accordance with the memory cell data is further provided.

17. The nonvolatile semiconductor memory device according to claim 16, wherein the two adjacent global bit lines are twisted in predetermined places.

18. The nonvolatile semiconductor memory device according to claim 16, wherein
each sub-block is formed of a plurality of strings,
each string is formed of a plurality of word lines, a plurality of local bit lines which extend in the direction crossing the word lines, and a plurality of memory cells each storing information based on a level change of its threshold voltage and each placed so as to correspond to each intersection of a word line and a local bit line, and
each main bit line is shared by all the strings within a corresponding sub-block and can be selectively connected to one local bit line within one string.

* * * * *